United States Patent [19]

Murakami et al.

[11] Patent Number: 5,581,605
[45] Date of Patent: Dec. 3, 1996

[54] OPTICAL ELEMENT, PRODUCTION METHOD OF OPTICAL ELEMENT, OPTICAL SYSTEM, AND OPTICAL APPARATUS

[75] Inventors: Katsuhiko Murakami; Kiyoto Mashima; Takashi Mori, all of Kawasaki; Osamu Tanitsu, Funabashi, all of Japan

[73] Assignee: Nikon Corporation, Japan

[21] Appl. No.: 399,683

[22] Filed: Mar. 7, 1995

Related U.S. Application Data

[63] Continuation-in-part of Ser. No. 196,059, Feb. 10, 1994, abandoned.

[30] Foreign Application Priority Data

| Feb. 10, 1993 | [JP] | Japan | 5-021577 |
| Sep. 14, 1993 | [JP] | Japan | 5-229173 |
| Sep. 24, 1993 | [JP] | Japan | 5-237654 |
| Mar. 9, 1994 | [JP] | Japan | 6-038799 |

[51] Int. Cl.$^6$ .................... G21K 5/00; G21K 1/06
[52] U.S. Cl. .................... 378/84; 378/34; 359/619
[58] Field of Search .................... 359/619, 620; 378/84, 145, 147, 85, 34

[56] References Cited

U.S. PATENT DOCUMENTS

| 4,668,077 | 8/1987 | Wakabayashi et al. | |
| 4,924,490 | 5/1990 | Hashimoto et al. | 378/84 |
| 5,003,567 | 3/1991 | Hawryluk et al. | 378/34 |
| 5,153,898 | 10/1992 | Suzuki et al. | 378/34 |
| 5,222,112 | 6/1993 | Terasawa | 378/34 |

FOREIGN PATENT DOCUMENTS 61-251025A  11/1986  Japan.

OTHER PUBLICATIONS

G. D. Kubiak et al., "Diffraction–limited soft x–ray projection lithography with a laser plasma source", *J. Vac. Sci. Technol.*, vol. B9(6), pp. 3184–3188, Nov./Dec. 1991.

William C. Sweatt, "High–Efficiency Condenser Design for Illuminating a Ring Field", *OSA Proceedings on Soft X–Ray Projection Lithography*, vol. 18, pp. 70–72 (1993).

D. P. Gaines et al., "X–Ray Characterization of a Three–Element Condenser System for SXPL", *OSA Proceedings on Soft X–Ray Projection Lithography*, vol. 18, pp. 66–69 (1993).

J. E. Bjorkholm et al., "Reduction imaging at 14 nm using multilayer–coated optics: Printing of Features smaller than 0.1 μm", *J. Vac. Sci. Technol.*, vol. B8(6), pp. 1509–1513 Nov./Dec. 1990.

H. Kinoshita et al., "Soft X–Ray reduction lithography using multilayer mirrors", *J. Vac. Technol.*, pp. 1648–1651 Nov./Dec. 1989.

Andrew M. Hawryhek et al., "Soft X–ray projection lithography using an x–ray reduction camera", *J. Vac. Sci. Technol.*, vol. B6(6), pp. 2162–2166 Nov./Dec. 1988.

Primary Examiner—Don Wong
Attorney, Agent, or Firm—Pennie & Edmonds

[57] ABSTRACT

An optical element for X-ray reflection according to the present invention is provided with a number of fine convex surfaces or concave surfaces regularly arranged on a substrate. Multilayer films reflecting X-rays are formed over the convex surfaces or concave surfaces. The convex surfaces or concave surfaces have such a shape that when X-rays enter each concave surface or convex surface, they are reflected with a certain diverging angle by the multilayer films and as a result that a plurality of secondary X-ray sources having the diverging angle are formed on a same plane located a certain distance apart from the concave surfaces or convex surfaces. By this, a number of secondary X-ray sources are formed to enable uniform irradiation of X-rays in a wide region.

31 Claims, 45 Drawing Sheets

MAX REFLECTIVITY (CALCULATED)
OF MULTILAYER FILMS

OPTICAL ELEMENT, PRODUCTION METHOD OF OPTICAL ELEMENT, OPTICAL SYSTEM, AND OPTICAL APPARATUS

RELATED APPLICATIONS

This is a Continuation-In-Part application of application Ser. No. 08/196,059 filed on Feb. 10, 1994, abandoned.

BACKGROUND OF THE INVENTION

1. Field of the Invention

The present invention relates to an optical element for uniformly irradiating X-rays in a broad area, a method for producing the optical element, an optical system using the optical element, and an optical apparatus provided with the illumination optical system.

2. Related Background Art

As a semiconductor integrated circuit element becomes finer and finer these days, there has been developed a reduction projection lithography technology using X-rays of shorter wavelength than conventionally used ultraviolet rays in place thereof in order to improve the resolving power of optical system which is limited by the diffraction limit.

An X-ray exposure apparatus used in this technology is composed mainly of an X-ray source, an illumination optical system, a mask, an imaging optical system (reduction projection optical system) and a wafer stage. A photon radiation or laser plasm X-ray source is used as the X-ray source. The illumination optical system is constituted mainly by an oblique incidence mirror for reflecting X-rays incident obliquely into a reflecting surface, a multi-layer film mirror having a reflecting surface formed of multi-layered films, and a filter reflecting or transmitting only X-rays of a predetermined wavelength, so that the system may illuminate a mask with X-rays of the desired wavelength.

The mask may be a transmitting mask or a reflecting mask. The transmitting mask is constructed such that an X-ray-absorbing material is formed in a desired pattern on a thin membrane of a material which well transmits X-rays. The reflecting mask is constructed such that low-reflectivity portions are formed in a desired pattern on multi-layered films which reflect the X-rays for example. The thus formed pattern on the mask is focused on a wafer coated with a photoresist through the reduction projection optical system comprising a plurality of multi-layer film mirrors. Since the X-rays are attenuated by atmospheric absorption, all optical paths thereof are maintained at a predetermined degree of vacuum.

Such an X-ray exposure apparatus must be so arranged that the illumination optical system irradiates (or illuminates) a broad area on the mask. For example, in case of an X-ray reduction projection exposure apparatus provided with a reduction projection optical system of 5:1 reduction ratio, the reduction projection optical system must illuminate a region of square with a side of 100 mm on the mask in order to effect exposure on a region of square with a side of 20 mm on the wafer. To obtain a desired resolving power of the diffraction limit in this case, it is desired to use the entire numerical aperture of reduction projection optical system. That is, it is desired for the rays transmitted or reflected by the mask to have an angular range which covers the angular range of entrance numerical aperture of imaging optical system (reduction projection optical system). To realize it, not only each point in the pattern surface on the mask is simply irradiated by the exposure light (X-rays), but the each point in the pattern surface on the mask must be irradiated with light having an angle of divergence corresponding to the entrance numerical aperture of exposure light of reduction projection optical system as well.

Incidentally, in case the synchrotron radiation or laser plasma X-ray source is used as the X-ray source in the X-ray exposure apparatus, the size of portion as the source radiating the X-rays (the size of X-ray source) is very small. The size of X-ray source is determined by the diameter of electron beam in case of the photon radiation, while it is determined by the spot size of laser beam irradiated onto a target in case of the laser plasma X-ray source. The obtainable size of X-ray source is about 0.1 to 1 mm in diameter in either case, which is extremely small as compared with the region to be illuminated on the mask.

Therefore, the above requirement cannot be satisfied by the conventional illumination optical system constructed of a curved-surface mirror such as the oblique incidence mirror or the multi-layer film mirror, or of a combination of such mirrors, as long as such a small X-ray source as described above is used.

For example, as shown in FIG. 1, if a mask 4 is located near an image P of a light source 2 focused by an illumination optical system 3 (this arrangement is called as critical illumination), the illumination light B is irradiated with a sufficient angle of divergence on and in the vicinity of the optical axis A of exposure light B. However, the region irradiated by the exposure light B has only the size of the image of light source 2 in a very narrow region near the optical axis A. Although the image of light source 2 can be magnified to some extent by increasing the magnification of illumination optical system 3, the angle of divergence of exposure light is inevitably reduced in that case.

On the other hand, as shown in FIG. 2, in case an image P of light source 2 is arranged to be focused by the illumination optical system 3 on the entrance pupil 50 of imaging optical system (this arrangement is called as Köhler illumination), the exposure light B can be irradiated in a considerably wide region on the mask 4. However, the divergence angle of light irradiating each point in the pattern surface on mask 4 becomes extremely small, which makes it difficult to obtain a resolving power of the diffraction limit of imaging optical system. Also, in case the mask 4 is located between the positions shown in FIG. 1 and in FIG. 2, that is, at a position between the image P of light source 2 and the entrance pupil of imaging optical system, there cannot exist together the sufficient region on the mask 4 irradiated by the exposure light B and the satisfactory angle of divergence of light irradiating each point in the pattern on mask 4.

If the size of light source 2 is nearly equal to that of mask 4 as shown in FIG. 3, rays (exposure light B) are incident in various directions even at a point distant from the optical axis A on the mask 4 and therefore a resolving power of the diffraction limit can be obtained in the region covering the entire pattern surface on the mask 4. FIG. 3 shows the case of Köhler illumination, but the illumination region is also enlarged even in the case of critical illumination, because the image of large light source is formed on the mask. It has been, however, difficult to obtain an X-ray source of such large size in actual.

SUMMARY OF THE INVENTION

It is an object of the present invention to achieve uniform irradiation of electromagnetic waves in a wide area.

The above and other objects will be apparent from the following description.

The present invention provides an optical element comprising:

a substrate having a plurality of concave surfaces or convex surfaces with a substantially same curvature; and multilayer films for reflecting X-rays, formed on the concave surfaces or convex surfaces of said substrate and composed of thin films;

wherein when X-rays are incident into the multilayer films on said concave surfaces or convex surfaces, the X-rays are reflected with a predetermined diverging angle on the multilayer films and as a result a plurality of secondary X-ray sources having the diverging angle are formed on a same plane located a predetermined distance apart from said concave surfaces or convex surfaces.

It is preferred that the shape of concave surfaces or convex surfaces is a part of spherical surface or a toroidal surface for example.

Also, the present invention provides a method for producing an optical element, comprising:

a first step of forming a substrate having convex surfaces or concave surfaces on a surface thereof and being a ground for multilayer films for reflecting X-rays; and a second step of forming the multilayer films for reflecting said X-rays on said substrate.

The first step is preferably either one of a method (first method) of applying a photosensitive material onto a substrate and processing the photosensitive material layer by the photolithography process to form fine convex portions, a method (second method) of screen-printing a heat-resistant material on a substrate to form fine convex portions, and a method (third method) of etching a substrate to form fine concave portions.

The photosensitive material used in the first method may be a photoresist employed in lithography or a photoreactive polyimide. Since polyimide is superior in heat resistance, it is advantageous in case of strong X-rays being irradiated. Ordinary photoresists or photoreactive polyimides will form columns in a rectangular cross section after development. To smooth the rectangular section, it is preferable to utilize unsharpness of image due to diffraction in the arrangement with a gap between the substrate and the mask. Also, an alternative method may be a method of overlaying a coating on the pattern of rectangular section or a method of post-bake at high temperature (baking the resist after development). The heat-resistant material used in the second method is preferably a heat-resistant resin such as polyimide for example. In this case, concave portions of spherical surface are naturally formed by the surface tension of resin. The etching step in the third method may be either dry etching or wet etching, but it is preferable to properly select a method to maintain smoothness sufficient on the etched surface.

The second step for forming the multilayer films on the fine convex portions or concave portions formed in the above step may be one of the ordinary methods for forming multilayer films. For example, a preferable method is the method for producing a thin film, such as the sputtering, the vacuum vapor deposition and the CVD (Chemical Vapor Deposition). The materials for the multilayer films may be a combination of Mo (molybdenum) and Si (silicon), but are not limited to the combination.

Also, the present invention provides an optical system for illuminating an illuminated surface in an arc shape. The optical system comprises:

an optical reflector having an X-ray reflecting surface forming a part of a parabola of revolution obtained by revolving an arbitrary parabola about a base axis passing through a vertex and a focus of the parabola and inclined at a predetermined angle relative to a normal line to said illuminated surface, said optical reflector reflecting X-rays by said X-ray reflecting surface to irradiate said illuminated surface; and an optical element for reflecting X-rays incident thereinto substantially in parallel with said base axis to irradiate said X-rays onto the X-ray reflecting surface of said optical reflector;

wherein said optical reflector and said optical element are rotated in a united manner about a rotation axis passing through said optical element and being parallel to the normal line to said illuminated surface;

wherein said optical element comprises:

a substrate having a plurality of concave surfaces or convex surfaces with a substantially same curvature; and multilayer films for reflecting X-rays, formed on the concave surfaces or convex surfaces of said substrate and composed of thin films;

wherein when X-rays are incident into the multilayer films on said concave surfaces or convex surfaces, the X-rays are reflected with a predetermined diverging angle on the multilayer films and as a result a plurality of secondary X-ray sources having the diverging angle are formed on a same plane located a predetermined distance apart from said concave surfaces or convex surfaces.

Also, the present invention provides an optical apparatus for illuminating a predetermined area. The optical apparatus comprises:

an optical reflector having an X-ray reflecting surface forming a part of a parabola of revolution obtained by revolving an arbitrary parabola about a base axis passing through a vertex and a focus of the parabola and inclined at a predetermined angle relative to a normal line to said illuminated surface, said optical reflector reflecting X-rays by said X-ray reflecting surface to irradiate said illuminated surface;

an optical element for reflecting X-rays incident thereinto substantially in parallel with said base axis to irradiate said X-rays onto the X-ray reflecting surface of said optical reflector;

an X-ray source for emitting X-rays toward said optical element; and rotation driving means for rotating said optical reflector and said optical element in a united manner about a rotation axis passing through said optical element and being parallel to the normal line to said illuminated surface;

wherein said optical reflector and said optical element are rotated in a united manner by said rotation driving means to irradiate the X-rays emitted from said X-ray source onto said illuminated surface in an arc shape;

wherein said optical element comprises:

a substrate having a plurality of concave surfaces or convex surfaces with a substantially same curvature; and multilayer films for reflecting X-rays, formed on the concave surfaces or convex surfaces of said substrate and composed of thin films;

wherein when X-rays are incident into the multilayer films on said concave surfaces or convex surfaces, the X-rays are reflected with a predetermined diverging angle on the multilayer films and as a result a plurality of secondary X-ray sources having the diverging angle are formed on a same plane located a predetermined distance apart from said concave surfaces or convex surfaces.

Also, the present invention provides another optical system for illuminating an illuminated surface in an arc shape. The optical system comprises:

an optical reflector having a reflecting surface forming a part of a parabola of revolution obtained by revolving an arbitrary parabola about a base axis passing through a focus of the parabola and inclined at a predetermined angle relative to a normal line to said illuminated surface, said optical reflector reflecting light by said reflecting surface to irradiate said illuminated surface;

a fly's eye lens comprising a plurality of lens elements and forming a plurality of secondary light source images on an exit side thereof when light is incident thereinto; and a first light deflecting element for reflecting light emergent from said fly eye lens substantially in parallel with said base axis to irradiate said light onto the reflecting surface of said optical reflector;

wherein said optical reflector and said first light deflecting element are rotated in a united manner about a rotation axis passing through said first light deflecting element and being parallel to the normal line to said illuminated surface.

Also, the present invention provides another optical apparatus for illuminating a predetermined area. The optical apparatus comprises:

an optical reflector having a reflecting surface forming a part of a parabola of revolution obtained by revolving an arbitrary parabola about a base axis passing through a focus of the parabola and inclined at a predetermined angle relative to a normal line to an illuminated surface, said optical reflector reflecting light by said reflecting surface to irradiate said illuminated surface;

a fly's eye lens comprising a plurality of lens elements and forming a plurality of secondary light source images on an exit side thereof when light is incident thereinto;

a first light deflecting element for reflecting light emergent from said fly eye lens substantially in parallel with said base axis to irradiate said light onto the reflecting surface of said optical reflector;

light source means for emitting light toward said fly's eye lens; and rotation driving means for rotating said optical reflector and said first light deflecting element in a united manner about a rotation axis passing through said first light deflecting means and being parallel to the normal line to said illuminated surface;

wherein said optical reflector and said first light deflecting element are rotated in a united manner by said rotation driving means to irradiate the light emitted from said light source means onto said illuminated surface in an arc shape.

Also, the present invention provides an optical apparatus for illuminating an illuminated surface in an arcuate shape with electromagnetic waves emitted from a light source. The optical apparatus comprises:

a first reflective element having a reflective surface with a plurality of concave surfaces or convex surfaces having a substantially same curvature, said reflective surface reflecting the electromagnetic waves incident from said light source to form a plurality of secondary light source images; and an optical reflector for reflecting the electromagnetic waves from said secondary light source images to illuminate said illuminated surface, said optical reflector having a reflective surface forming a part of a parabolic toric surface obtained by revolving an arbitrary parabola about a second axis passing a point located on a first axis passing a vertex of the parabola and a focus of the parabola, said point being opposite to a directrix of the parabola with respect to said focus, said second axis being parallel to the directrix;

wherein said first reflective element reflects the electromagnetic waves at a predetermined angle of divergence by the reflective surface thereof when the electromagnetic waves are incident onto the reflective surface of said first reflective element, so that said plurality of secondary light source images with the angle of divergence are formed on a same plane located at a place apart from the reflective surface of said first reflective element.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The present invention will be described with the preferred embodiments thereof with reference to the accompanying drawings.

Embodiment I

Figure 1:
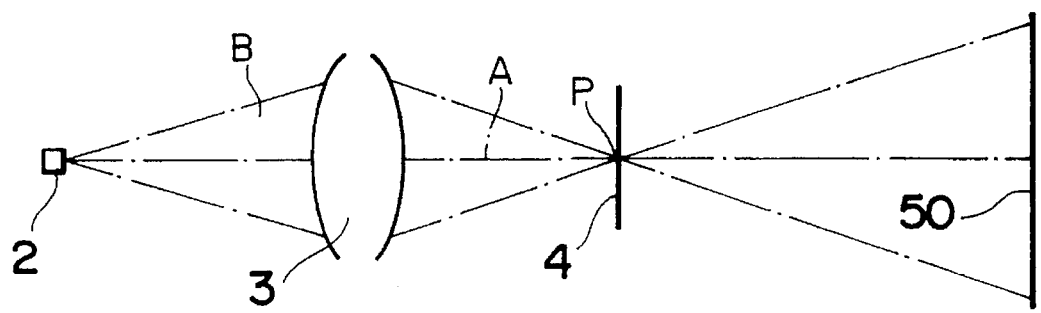
FIG. 1 is a scheme to show an illumination method by a conventional illumination optical system.
Figure 2:
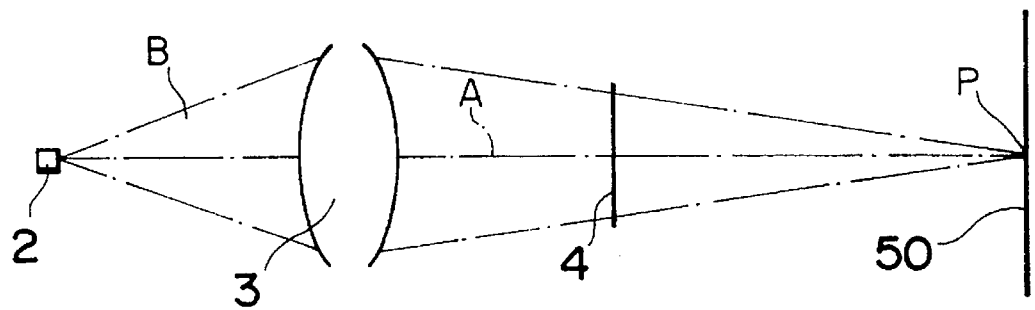
FIG. 2 is a scheme to show an illumination method by a conventional illumination optical system.
Figure 3:
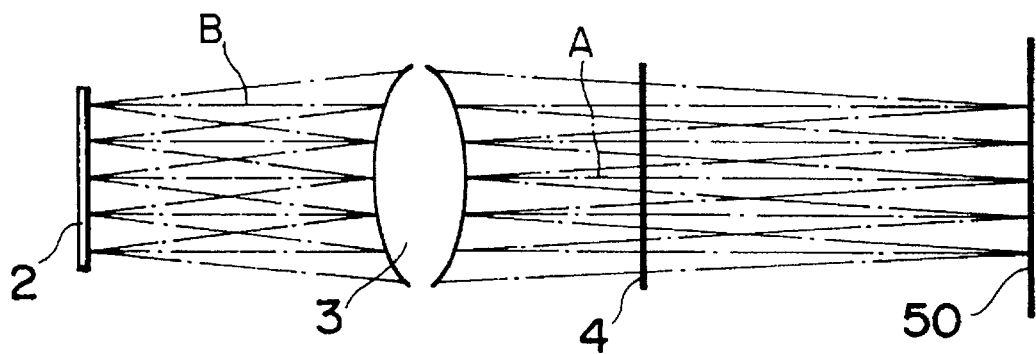
FIG. 3 is a drawing to show a state in which a mask is illuminated by a surface illuminant.
Figure 4:
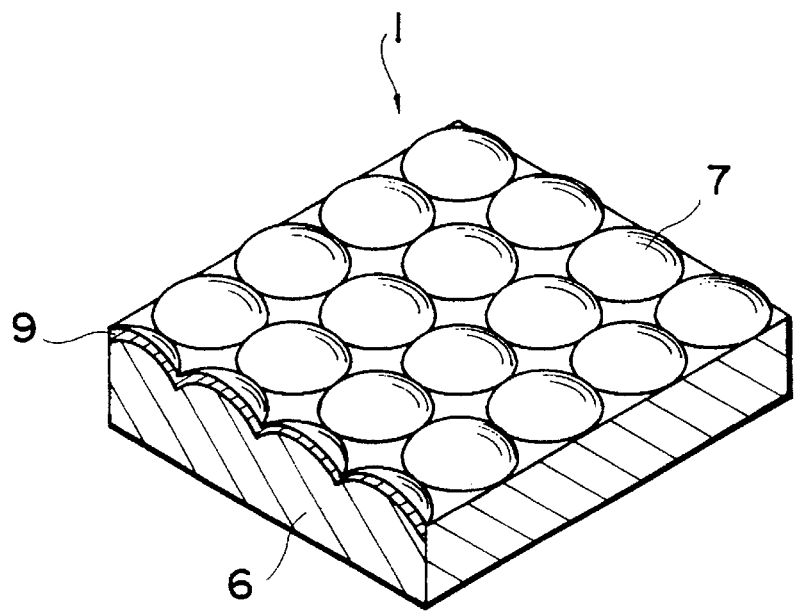
FIG. 4 is a perspective view to show an optical element for X-ray reflection according to the present invention.
Figure 6:
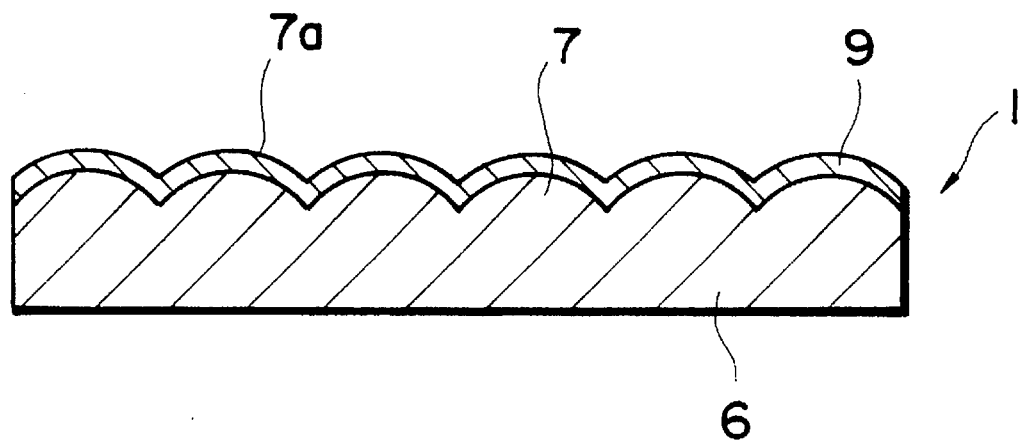
FIG. 6 is a drawing to show a cross section of an optical element.
Figure 7:
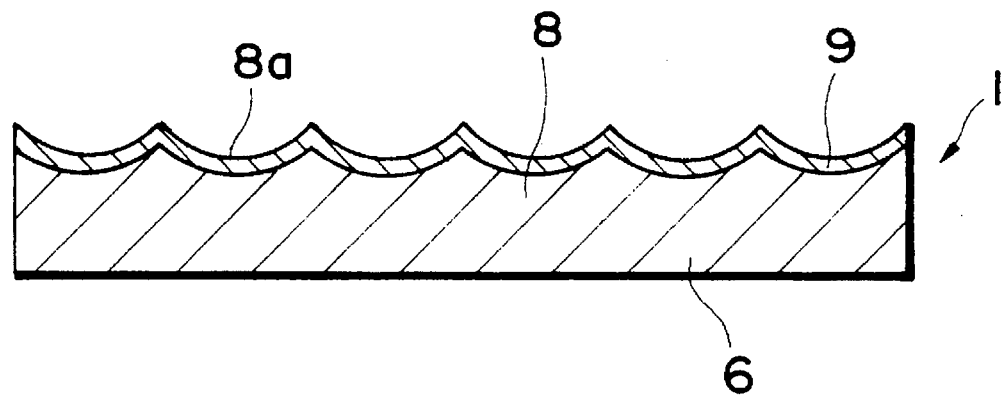
FIG. 7 is a drawing to show a cross section of an optical element of another type.

FIG. 4 shows an optical element according to the present invention. The optical element 1 has a number of fine convex surfaces 7 two-dimensionally and regularly arranged on a substrate 6. Multilayer films 9 for reflecting X-rays are formed on each convex surface 7, by which the X-rays are reflected. FIG. 6 shows a cross section of the element. As shown in FIG. 6, the convex surfaces 7 have a same shape and a substantially same curvature. Also, the optical element 1 can be constructed of concave surfaces 8 as shown in FIG. 7. It is preferred that the size of these convex surfaces 7 or concave surfaces 8 is considerably smaller than the size of element itself.

Figure 5:
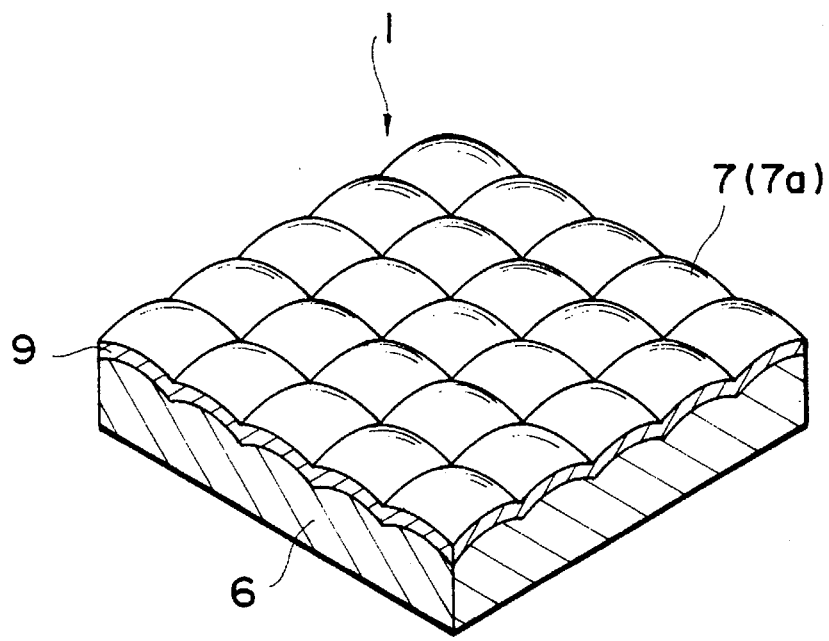
FIG. 5 is a perspective view to show another embodiment of optical element according to the present invention.

The convex surfaces 7 or the concave surfaces 8 may be constructed such that they are formed each in a circular shape in the region of X-ray-reflecting surface as shown in FIG. 4 or that they are continuously formed in the entire X-ray-reflecting surface as shown in FIG. 5.

Figure 8:
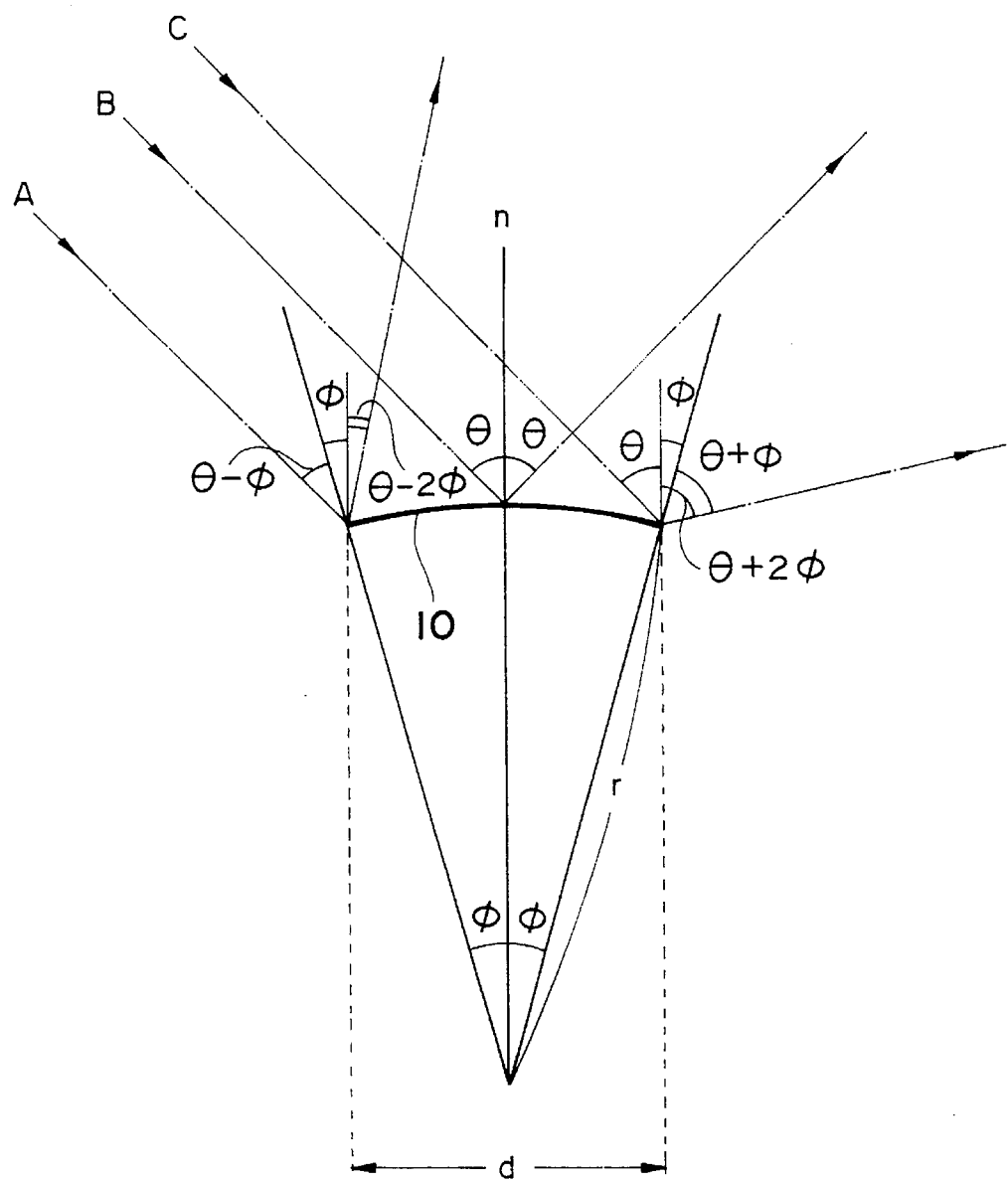
FIG. 8 is an illustration to show the function of an optical element according to the present invention.
Figure 9:
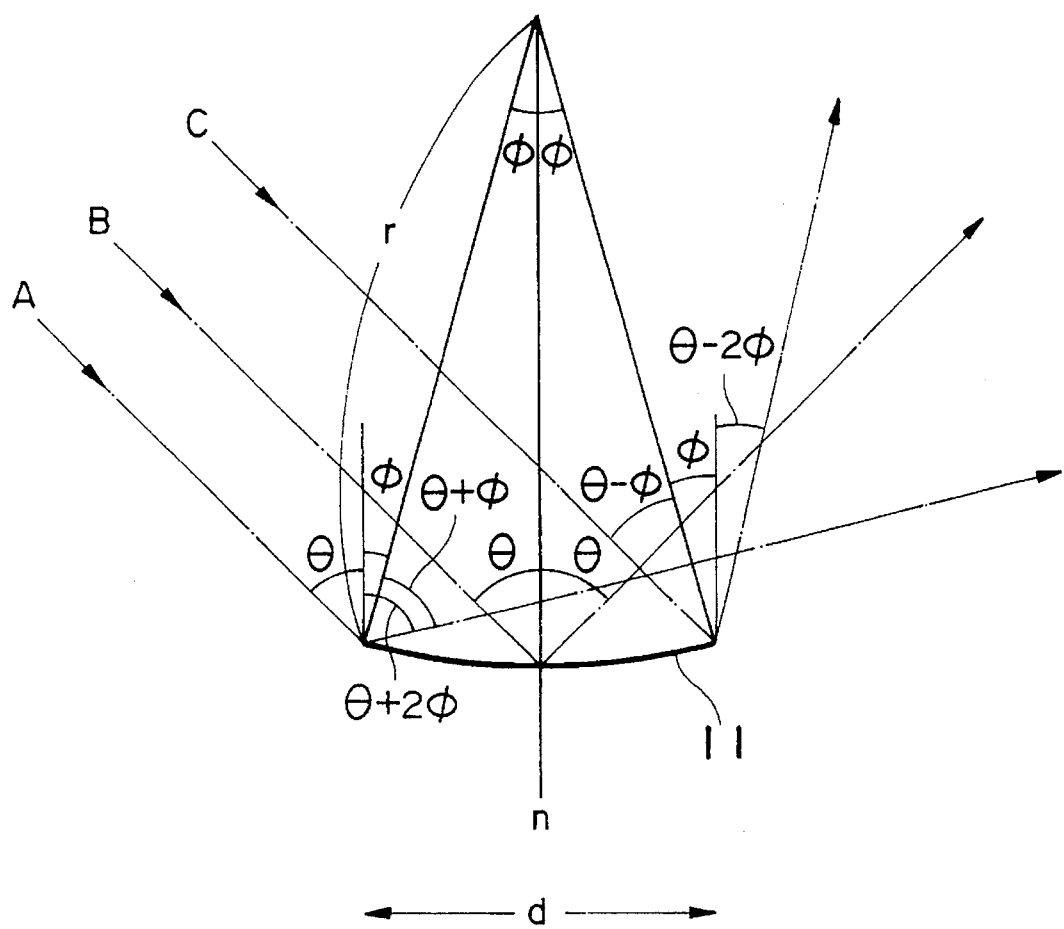
FIG. 9 is an illustration to show the function of an optical element according to the present invention.

FIG. 8 shows a state of spread of reflected X-rays when X-rays (represented by A, B and C) are incident into a convex surface 10 of a spherical portion of multilayer films which reflect X-rays. Let r be a radius of curvature of the spherical surface, d be a diameter thereof, θ be an angle of incidence of an X-ray at the vertex of the convex surface 10, and 2Φ be an angle spanned by a circular arc with a radius being r and a length of chord being d. Since the distance from the light source (X-ray source) to the convex surface 10 is set as very long as compared with d and r, incident light may be considered as a beam of parallel rays in this case. In this arrangement, an X-ray B incident into the vertex of the convex surface 10 is reflected at an angle of θ with respect to the normal line n at the vertex, while an X-ray incident into another point is reflected at an angle different from that of the reflected light at the vertex, because the reflection (plane for reflecting X-rays) thereof is inclined. For example, as shown in FIG. 8, an X-ray A incident into one edge of the convex surface 10 is reflected at angle of (θ−2Φ) with respect to the normal line n and another X-ray C incident into the other edge at angle of (θ+2Φ). Consequently, a beam of parallel rays incident at angle θ into the convex surface 10 is reflected as diverging in a shape of circular cone with an angle of divergence of 2Φ and with the center thereof in the direction of specular reflection of angle θ. Also, as shown in FIG. 9, the condition is the same in case a beam of parallel rays is incident into a convex surface 11 of spherical shape. In this case, the reflected light is converged once and then diverges. As described above, the surface of optical element 1 for X-ray reflection, in which a lot of sufficiently small convex surfaces or concave surfaces are arranged, functions as secondary light sources with a diverging angle of 2Φ. If Φ is expressed by r and d, the relation of 2r·sinΦ=d holds. If Φ is sufficiently small then 2Φ=d/r.

The illumination optical system focuses real-size images or several-times-magnified images of the secondary X-ray sources on the entrance pupil of reduction projection optical system, on the mask, or at a position between them. At this time, the X-ray beam illuminating the mask must have an angle of divergence enough to fill the entrance numerical aperture of reduction projection optical system. Suppose a beam with a diverging angle of 2Φ is incident into the illumination optical system. Then the entrance numerical aperture is defined as sin2Φ~2Φ. Also, the exit numerical aperture is defined as follows with the magnification m of optical system: (sin2Φ)/m~2Φ/m=d/(r·m). In order to use the entire numerical aperture of reduction projection optical system for the purpose of obtaining the desired resolving power of the diffraction limit, the exit numerical aperture of the illumination optical system should be set to a value equal to or larger than the entrance numerical aperture of reduction projection optical system. However, when the exit numerical aperture of illumination system is set larger than the entrance numerical aperture of projection system, the exposure time must be lengthened because of an increase in ratio of rays not entering the reduction projection optical system, which lowers the throughput of exposure apparatus. Accordingly, it is preferred that the exit numerical aperture of illumination optical system is set equal to the value of entrance numerical aperture of reduction projection optical system.

The optical element for X-ray reflection used as the secondary X-ray sources is composed of a substrate with fine convex and concave surfaces formed thereon and multilayer films formed on the substrate to reflect X-rays. The incident angle of X-rays into the multilayer films changes in the range of (θ±Φ) as shown in FIG. 8 or FIG. 9. Accordingly, the half width of reflection peak of the multilayer films is preferably about 2Φ or more. Generally, the peak half width of the multilayer films is sufficiently larger than 2Φ. If Φ is desired to be further greater in particular, the peak half width may be enlarged by decreasing the number of layers in the multilayer films.

Another embodiment of optical element according to the present invention is next described with FIGS. 10 to 17.

A surface of each convex portion or concave portion, that is, a convex surface 10 or concave surface 11, is formed such that a radius of curvature in a curve defined by crossing a first plane and the concave surfaces 10 or convex surfaces is different from a radius of curvature in a curve defined by crossing a second plane and the concave surfaces 10 or convex surfaces 11. The first plane is a plane of incidence with respect to X-rays, and passes through a vertex of the concave surfaces 10 or convex surfaces 11. The second plane is a plane passing through the vertex and being perpendicular to the first plane.

Now described is what angle of divergence a reflected beam has when parallel rays are incident into a convex portion or concave portion having such a shape.

Figure 13:
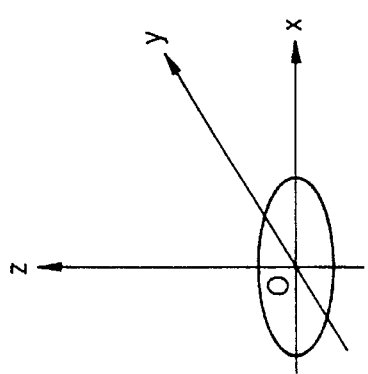
FIG. 13 is a drawing to show the coordinate system with the vertex of a convex portion at the origin.

Consider a coordinate system as shown in FIG. 13, in which the origin is at the vertex of a convex portion and the xy plane is parallel to the reflecting surface of X-ray optical element (more precisely to a plane of substrate). A concave portion will have slight differences in intermediate equations from those for a convex portion, but a finally obtained angle of divergence of reflected light is the same between them. Therefore, the following description concerns only the case of convex portion.

First investigated is a case in which the surface of convex portion is a spherical surface. Let $R_0$ be a radius of curvature of the spherical surface and R be a radius of convex portion. It is assumed that $R_0$ is sufficiently larger than R. Namely, taking x, y and r as $-R<x<R$, $-R<y<R$ and $r=(x^2+y^2)^{1/2}$, terms of second and higher orders of $x/R_0$, $y/R_0$ and $r/R_0$ can be negligible. In other words, following approximations stand: $c(x/R_0)^2 \approx 0$ (c is an arbitrary constant), . . . . A projecting amount of convex portion in the z direction is an amount proportional to $(r/R_0)^2$, which can be thus negligible herein.

Figure 14:
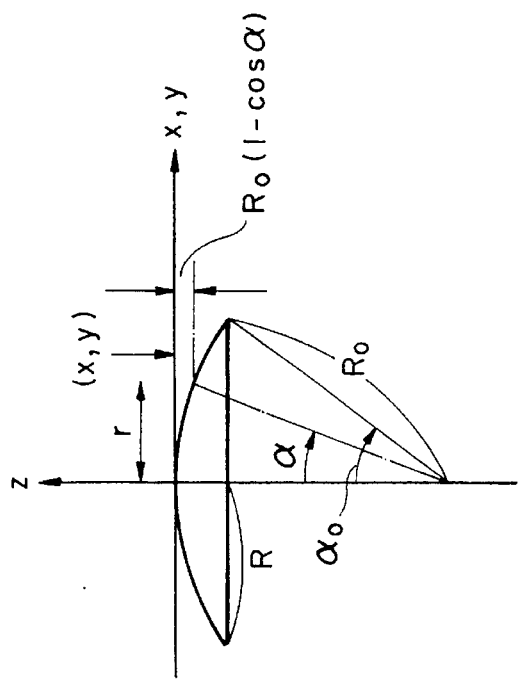
FIG. 14 is a drawing to show a plane including the normal vector n(x,y) and the Z axis.

Let us now consider a normal vector n(x,y) to the convex portion at an arbitrary point (x,y) on the surface of convex portion (i.e., the spherical surface) as shown in FIG. 14. FIG. 14 shows a state in a plane including the Z axis and the normal vector n(x,y). The following vector representation is used to discriminate a vector from ordinary scalar quantities: In drawings and equations alphabets are italicized for vectors and in the specification a word "vector" is simply given as prefix. As apparent from FIGS. 14 and 15, the vector n(x,y) is given by the following equation.

$$n(x,y)=(\sin\alpha\cdot\cos\beta,\sin\alpha\cdot\sin\beta,\cos\alpha) \qquad (1)$$

Figure 15:
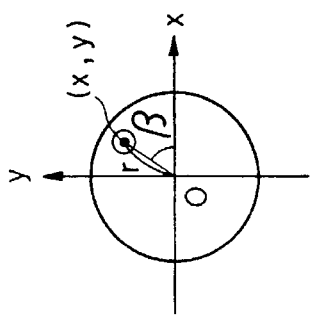
FIG. 15 is a drawing to show the XY plane in FIG. 13.

Here, $\alpha$ is an angle between the vector n(x,y) and the z axis as defined in FIG. 14, and $\beta$ is an angle between the x axis and a straight line connecting the origin O and the point (x,y) (as projected onto the xy plane) as defined in FIG. 15.

Using $\sin\alpha=r/R_0$, $\cos\alpha=(1-(r^2/R_0^2))^{1/2}$, $\sin\beta=y/r$ and $\cos\beta=x/r$, the vector n(x,y) may be expressed as follows.

$$n(x,y)=(x/R_0,y/R_0,1) \qquad (2)$$

Figure 16:
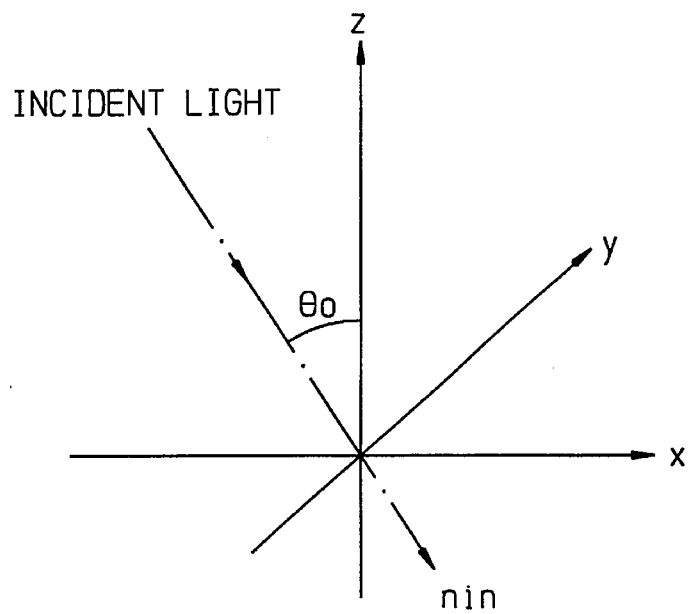
FIG. 16 is a drawing to show an angle of incidence of X-rays into an optical element.
Figure 17:
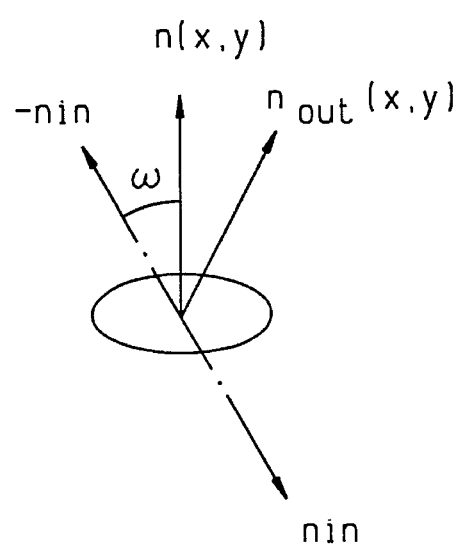
FIG. 17 is a drawing to show a direction in which an X-ray incident into an optical element is reflected.

Suppose a parallel beam is incident in a direction at $\theta_0$ to the z axis in the xz plane as shown in FIG. 16. Then a direction vector $n_{in}$ of the beam is given by the following equation.

$$n_{in}=(\sin\theta_0,0,-\cos\theta_0) \qquad (3)$$

Further, let $n_{out}(x,y)$ be a direction vector representing a direction in which a ray reflected a surface near the point (x,y) on the convex portion proceeds. As apparent from FIG. 17, the vector $n_{out}(x,y)$ is given by the following equation.

$$n_{out}(x,y)=n_{in}-2(n,n_{in})\cdot n=(\sin\theta_0+(2x/R_0)\cos\theta_0,(2y/R_0)\cos\theta_0, \cos\theta_0-(2x/R_0)\sin\theta_0) \qquad (4)$$

The following facts are derived from this equation.

(1) When the incident ray impinges on the surface at a position shifted in the x direction, the direction of reflected ray changes in proportion with x in the xz plane (plane of incidence); when it is shifted in the y direction, the direction of reflected ray changes in proportion with y in the direction perpendicular to the xz plane (plane of incidence).

(2) When the incident-ray-impinging position is shifted within the range of the divergence angle of reflected beam in the plane of incidence (xz plane), that is, in the range of $-R<x<R$ and $-R<y<R$, an angular range in which the reflected beam spreads in the plane of incidence is $\pm 2R/R_0$ [rad], which is independent of the incident angle $\theta_0$.

(3) Also, the divergence angle of reflected beam is $\pm 2R/R_0\cdot\cos\theta_0$[rad] in the direction perpendicular to the plane of incidence (xz plane), which is dependent on the incident angle $\theta_0$. The range of divergence is coincident with the divergence angle in the plane of incidence upon normal incidence ($\theta_0=0$), and the divergence angle decreases as the incident angle $\theta_0$ increases.

From the above facts, it is found that the divergence angle of reflected light differs depending upon the direction if the surface of convex portion or concave portion is spherical.

Figure 10:
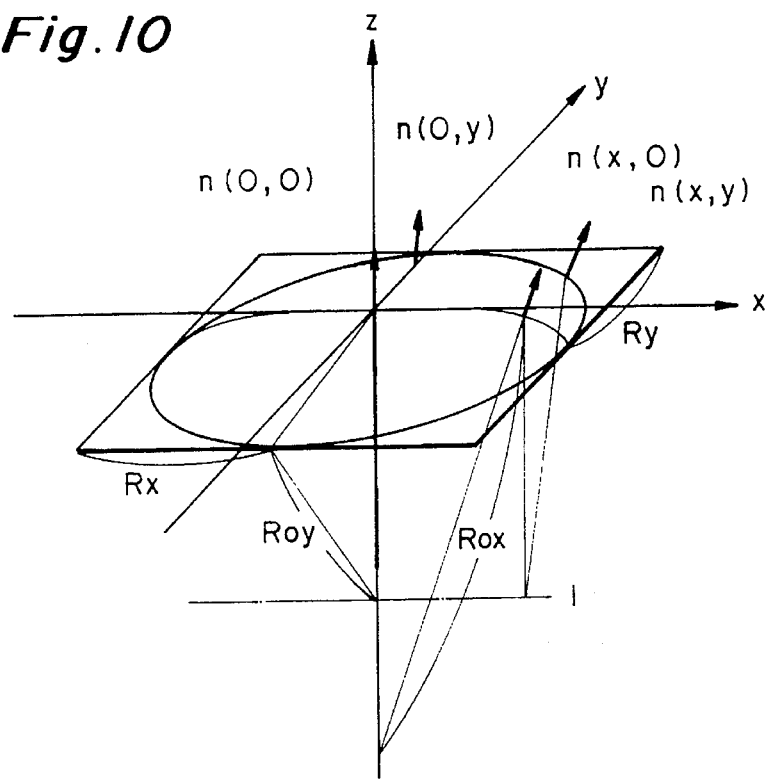
FIG. 10 is a drawing to show parameters for defining the shape of an optical element.
Figure 11:
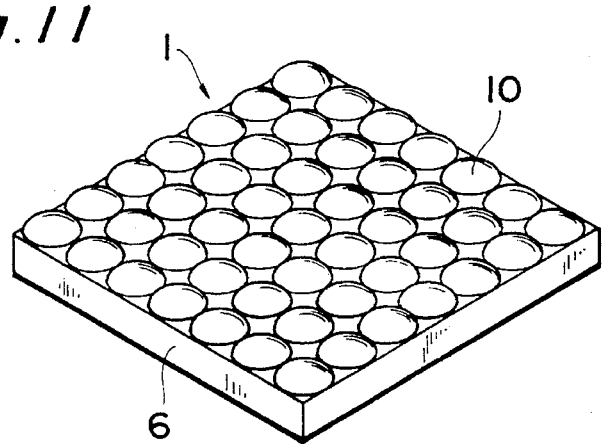
FIG. 11 is a perspective view to show another embodiment of optical element according to the present invention.
Figure 12:
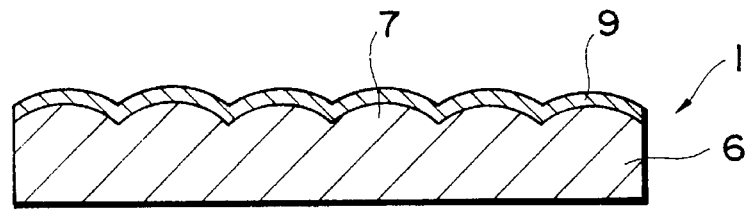
FIG. 12 is a drawing to show a cross section of the optical element shown in FIG. 10.

Next investigated is a case in which the surface of convex portion is a toroidal surface. Let us consider a toroidal surface two axes of rotation center of which are parallel to the x axis and the y axis, respectively, as shown in FIG. 10. Let $R_{0x}$ be a radius of curvature in the direction parallel to the x axis, $2R_x$ be a length of the toroidal surface in the direction of x axis, $R_{0y}$ be a radius of curvature in the direction parallel to the y axis and $2R_y$ be a length of the toroidal surface in the direction of y axis. It is assumed herein that $R_{0x}$ and $R_{0y}$ are sufficiently larger than $R_x$ and $R_y$.

Taking x and y as $-R_x<x<R_x$ and $-R_y<y<R_y$, terms of second and higher orders of $x/R_{0x}$ and $y/R_{0y}$ can be negligible. A projecting amount of the convex portion in the z direction is an amount proportional to these quantities, which can be also negligible.

Now let us consider a normal vector n(x,y) at point (x,y) on the convex portion as shown in FIG. 10. As apparent from FIG. 10, $$n(x,0)=(x/R_{0x},0,1) \qquad (5)$$

$$n(0,y)=(0,y/R_{0y},1) \qquad (6).$$

The vector n(x,y) is obtained by rotating the vector n(x,0) about the straight line 1 by the same angle of rotation as the angle of rotation when the vector n(0,0) is rotated about the straight line 1 up to the vector n(0,y). Thus, the vector n(x,y) is given by the following equation.

$$n(x,y)=(x/R_{0x},y/R_{0y},1) \qquad (7)$$

When a parallel beam having the direction vector $n_{in}$ given by Equation (3) is incident in the xz plane into the convex portion of such toroidal surface shape, a direction vector $n_{out}(x,y)$ representing the direction in which a ray reflected on a surface near the point (x,y) on the convex portion proceeds is given by the following equation.

$$n_{out}(x,y)=n_{in}-2(n,n_{in})\cdot n=(\sin\theta_0+(2x/R_{0x})\cos\theta_0,(2y/R_{0y})\cos\theta_0,\cos\theta_0-(2x/R_{0x})\sin\theta_0) \qquad (8)$$

The following facts are derived from this equation.

(1) When the incident ray impinges on the surface at a position shifted in the x direction, the direction of reflected ray changes in proportion with x in the xz plane (plane of incidence); when it is shifted in the y direction, the direction of reflected ray changes in proportion with y in the direction perpendicular to the xz plane (plane of incidence).

(2) The divergence angle of reflected beam is $\pm 2R_x/R_{0x}$ [rad] in the plane of incidence (xz plane), which is independent of the incident angle $\theta_0$.

(3) The divergence angle of reflected beam is $\pm 2R_y/R_{0y}\cdot\cos\theta_0$[rad] in the direction perpendicular to the plane of incidence (xz plane), which is dependent on the incident angle $\theta_0$. The divergence angle reduces as the incident angle $\theta_0$ increases. The divergence angle upon normal incidence ($\theta_0=0$) is not always coincident with the divergence angle in the plane of incidence in this case.

As described, in case the shape of the convex portion is toroidal, the divergence angle of reflected light in the direction parallel to the plane of incidence is determined by $R_{0x}$, $R_x$, while the divergence angle of reflected light in the direction perpendicular to the plane of incidence by $R_{0y}$ and $R_y$. Therefore, the divergence angles of reflected light can be independently determined in the respective directions.

The following three equations can be used to determine the shape of toroidal surface as to just fit the entrance numerical aperture of illumination optical system.

$$R_x/R_{0x}=\text{(entrance numerical aperture of illumination optical system)}/2 \qquad (9)$$

$$(R_y)/(R_{0y})\cos\theta_0=\text{(entrance numerical aperture of illumination optical system)}/2 \qquad (10)$$

$$(R_y/R_x)^2 = R_{0y}/R_{0x} \quad (11)$$

Equations (9) and (10) are derived from the conditions to make the divergence angle of reflected beam coincident with the entrance numerical aperture of illumination optical system. Also, Equation (11) is obtained by approximating and expanding an equation which defines the height of convex portion (height from the bottom of convex portion to the vertex) using $R_{0x}$, $R_{0y}$, $R_x$ and $R_y$.

The four parameters of $R_{0x}$, $R_{0y}$, $R_x$ and $R_y$ are not independent of each other. Equation (11) indicates the relation to be satisfied by the parameters. To determine each parameter from the above equations, the following steps should be taken for example.

(1) First, $R_{0x}$ and $R_x$ (a ratio thereof) is determined by Equation (9) from the entrance numerical aperture required for the illumination optical system.

(2) $R_y$ is determined by $R_y = R_x \cdot \cos\theta_0$ from the incident angle $\theta_0$.

(3) $R_{0y}$ is then determined by $R_{0y} = R_{0x} \cdot \cos^2\theta_2$.

These steps determine a ratio of the parameters but provide no absolute value of each parameter. The absolute values can be determined by the conditions of processing method for forming such fine convex portions or concave portions. As described above, the surface of X-ray-reflecting optical element according to the present invention functions as the secondary light sources having a conic diverging angle without bias when each convex or concave portion is formed as a toroidal surface and a lot of sufficiently small convex or concave portions are arranged in the surface of optical element.

The illumination optical system focuses real-size images or several-times-magnified images of the secondary light sources on the entrance pupil of reduction projection optical system, on the mask or at an arbitrary position between them. At this occasion, the X-ray beam illuminating the mask must have an angle of divergence enough to match the entrance numerical aperture of reduction projection optical system.

Suppose a beam having a diverging angle of $\psi$ is incident into the illumination optical system. Then the entrance numerical aperture is $\sin\psi \approx \psi$. Also, the exit numerical aperture is $\sin\psi/m \approx \psi/m$, where m is the magnification of illumination optical system. In order to use the entire numerical aperture of reduction projection optical system for the purpose of obtaining a desired resolving power of the diffraction limit, the exit numerical aperture of illumination optical system should be set to a value equal to or larger than the entrance numerical aperture of reduction projection optical system. However, if the exit numerical aperture of illumination optical system is set larger than the entrance numerical aperture of reduction projection optical system, exposure time must be lengthened because of an increase in ratio of rays not entering the reduction projection optical system, which lowers the throughput of exposure apparatus. Accordingly, it is preferred that the exit numerical aperture of illumination optical system is set to the same value as the entrance numerical aperture of reduction projection optical system. In other words, using Equations (9) and (10), the parameters defining the shape of the toroidal surface forming the surface of convex portion or concave portion in the X-ray-reflecting optical element according to the present invention may be determined to satisfy the following relations of Equations (12) and (13).

$$\text{(entrance numerical aperture of reduction projection optical system)} = \psi/m = 2R_x/mR_{0x} = d_x/mR_{0x} \quad (12)$$

$$\text{(entrance numerical aperture of reduction projection optical system)} = \psi/m = (2R_y/mR_{0y})\cos\theta_0 = (d_y/mR_{0y})\cos\theta_0 \quad (13)$$

In the above equations, $d_x = 2R_x$ and $d_y = 2R_y$ correspond to x-directional and y-directional lengths of the toroidal surface, respectively.

The X-ray incident angle $\omega$ into the multilayer films 9 in the X-ray optical element 1 is given by the following equation as apparent from FIG. 16.

$$\cos\omega = -(n_{in}, n) = \cos\theta_0 - (x/R_{0x})\sin\theta_0 \quad (14)$$

As the X-ray incident position is changed within the range of $-R < x < R$, the incident angle $\omega$ changes in the range of $\theta_0 \pm \cos^{-1}(R_x/R_{0x}\sin\theta_0)$. Accordingly, it is desired that the half width of reflection peak of the multilayer films is at least about $2 \cdot \cos^{-1}(R_x/R_{0x}\sin\theta_0)$. Generally, the peak half width of multilayer films is sufficiently larger than that. In case the change of incident angle is specifically large, the peak half width may be widened by decreasing the number of layers in the multilayer films. Namely, since the peak half width of multilayer films becomes smaller in proportion to the inverse of the number of layers in the multilayer films, decreasing the number of layers lowers the peak value of reflectivity but widens the peak half width as to match the change of incident angle $\omega$.

Figure 18:
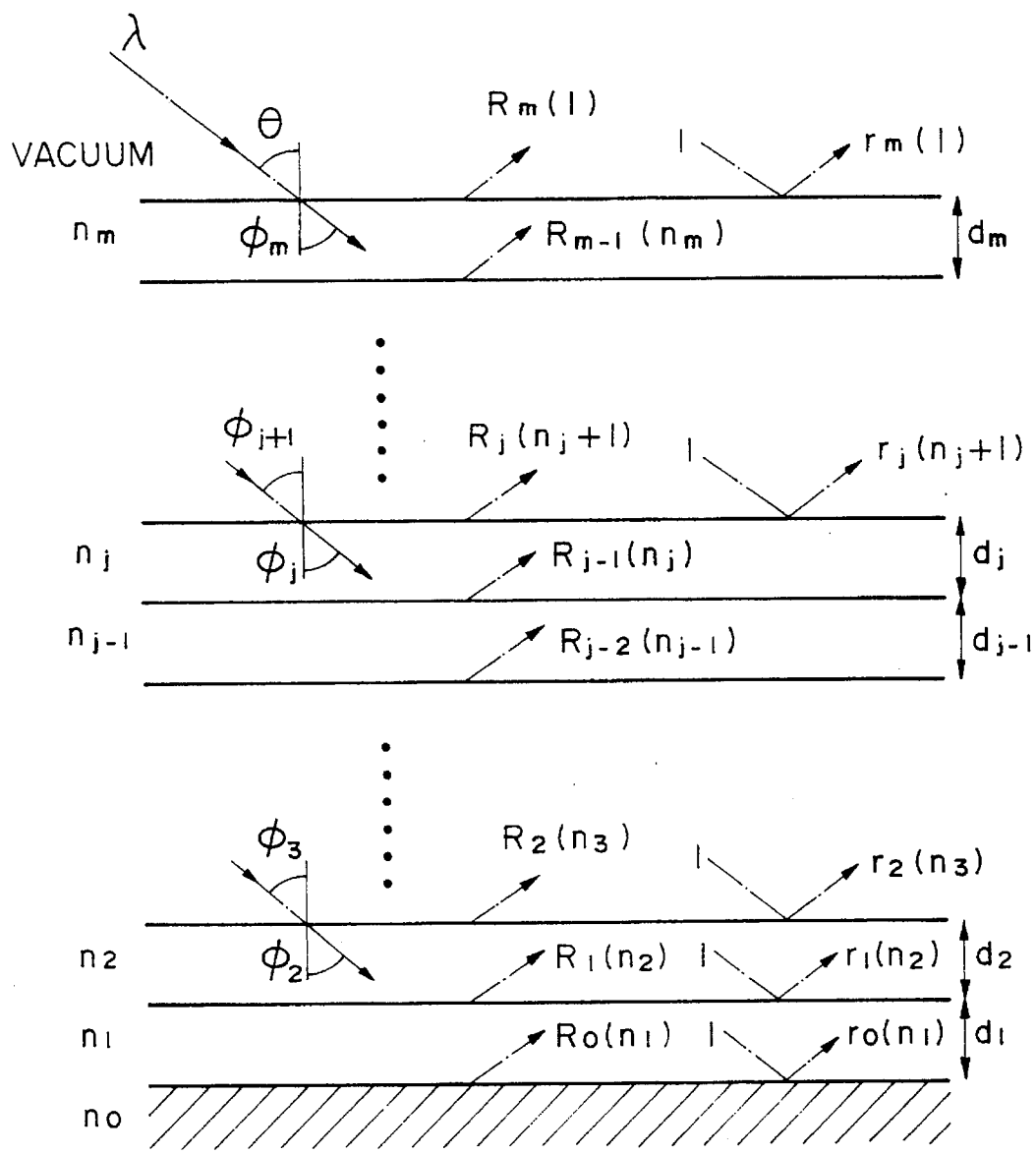
FIG. 18 is a drawing to schematically show an enlarged portion of multilayer films to illustrate the reflectivity at each layer.

The multilayer films 9 reflecting the X-rays are now described referring to FIG. 18. The multilayer films in the present embodiment constitute a multilayer film reflecting mirror in which two types of materials having mutually different indices of refraction are alternately laminated at a constant period.

The multilayer film reflecting mirror strongly reflects X-rays when the Bragg condition given by $2d \cos\theta = n\lambda$ (where n is a positive integer) is satisfied, where d is the period, $\lambda$ the wavelength of the X-rays and $\theta$ an incident angle (to the normal line). The equation is the same as the equation of Bragg diffraction for crystal (where d is a surface separation in case of crystal).

Since the Bragg condition gives only the condition among d, $\theta$ and $\lambda$ providing a peak of reflectivity, the reflectivity should be calculated using the Fresnel's formulas.

Fresnel's formulas:

p-polarized light:

$$r_j(n_{j+1}) = (n_j \cos\Phi_{j+1} - n_{j+1} \cos\Phi_j)/(n_j \cos\Phi_{j+1} + n_{j+1} \cos\Phi_j)$$

s-polarized light:

$$r_j(n_{j+1}) = (n_{j+1} \cos\Phi_{j+1} - n_j \cos\Phi_j)/(n_{j+1} \cos\Phi_{j+1} + n_j \cos\Phi_j)$$

Recurrence formula of amplitude reflectance:

$$R_j(n_{j+1}) = \{r_j(n_{j+1}) + R_{j-1}(n_j)\exp(-i\delta_j)\}/\{1 + r_j(n_{j+1})R_{j-1}(n_j)\exp(-i\delta_j)\}$$

Phase difference at j-th layer:

$$\delta_j = (4\pi/\lambda_0) n_j d_j \cos\Phi_j$$

Snell's formula:

$$n_j \sin\Phi_j = n_{j+1} \sin\Phi_{j+1}$$

Actually produced multilayer films generally have reflectivities lower than the calculated values. Main factors to cause the difference are scattering losses due to roughness of substrate surface or interfaces in the multilayer films, and diffusion layers formed in the interfaces. A method for taking in these factors into calculation is exemplified. If a scattering loss occurs, the reflectivity lowers $\exp\{-(4\pi\sigma\cos\theta/\lambda)^2\}$ times using the Debye-Waller factor $\sigma$.

The factor $\sigma$ indicates a quantity representing a degree of roughness. In case diffusion layers exist in the interfaces, the reflectivities can be calculated by the Fresnel's formulas not as the alternate layers of two types of materials but as layers including third material layers in the interfaces.

Figure 19:
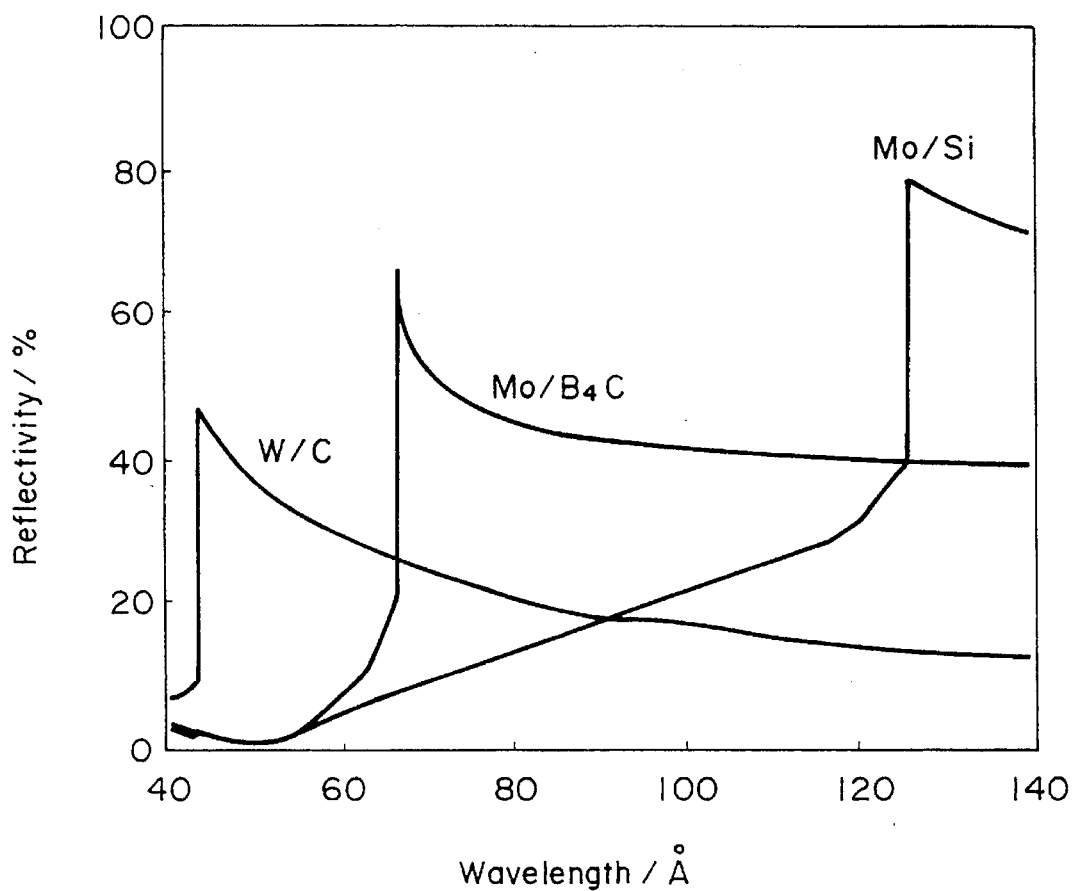
FIG. 19 is a graph to show the maximum reflectivity of multilayer films.

There are many specific materials for the multilayer films, among which W/C and Mo/Si are most popular. Other combinations often used are W/Si, W/$B_4$C, Mo/C, Mo/$B_4$C, Mo/SiC, Ru/Si, Rh/Si, Ni/C, etc., among which a most suitable combination is selected depending upon the operating wavelength. FIG. 19 was obtained by the simple calculation method by Vinogradov (A. V. Vinogradov and B. Ya. Zeldovich, Appl. Opt. 16 (1977) 89). FIG. 19 shows a graph of maximum reflectivity against wavelength. Mo/Si shows a high reflectivity near 130 Å (=13 nm). Ru/Si, Rh/Si or Mo/SiC also has a reflectivity close to that of Mo/Si. Particularly, it is noted that Mo/SiC shows higher thermal resistance than Mo/Si.

Figure 20A:
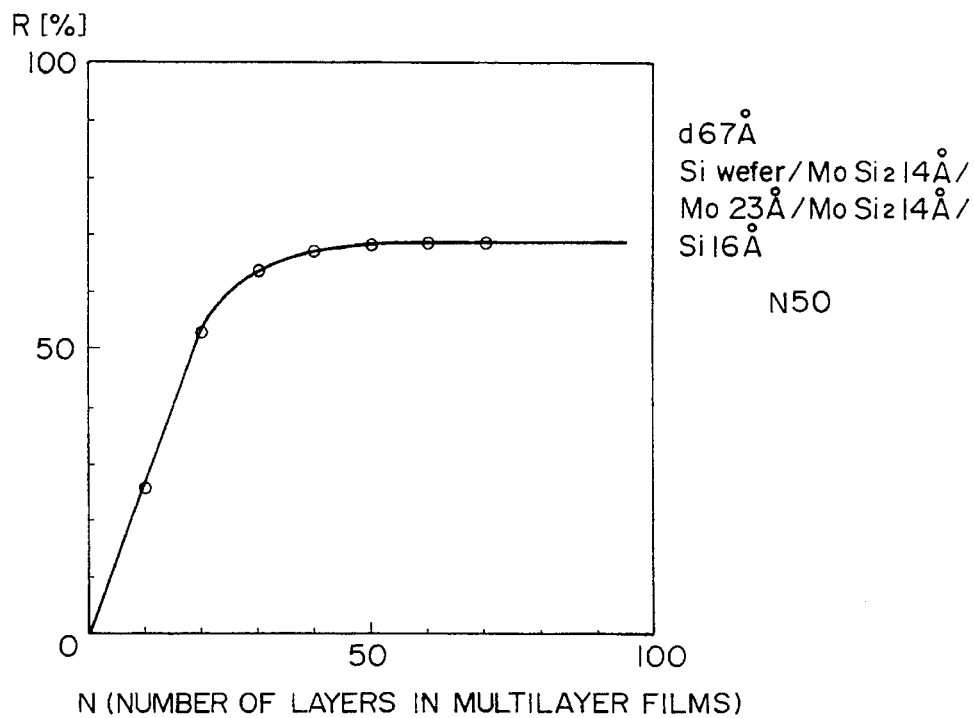
FIG. 20A is a graph to show a relation between number of multilayer films (N) and reflectivity (R%)

As the number of layers in the multilayer films increases, the reflectivity first increases in proportion to the number of layers and then is saturated at a certain point (see FIG. 20A). FIG. 20A shows calculated values for Mo/Si multilayer films for use with light of wavelength 13 nm under normal incidence. Since the reflectivity is saturated at about 50 layers, the multilayer films preferably include 50 layers (50 layers for each of Mo and Si). This calculation was made taking the diffusion layers in the interfaces into consideration. (Proc. SPIE Vol. 1742 (1992) 614)

Figure 20B:
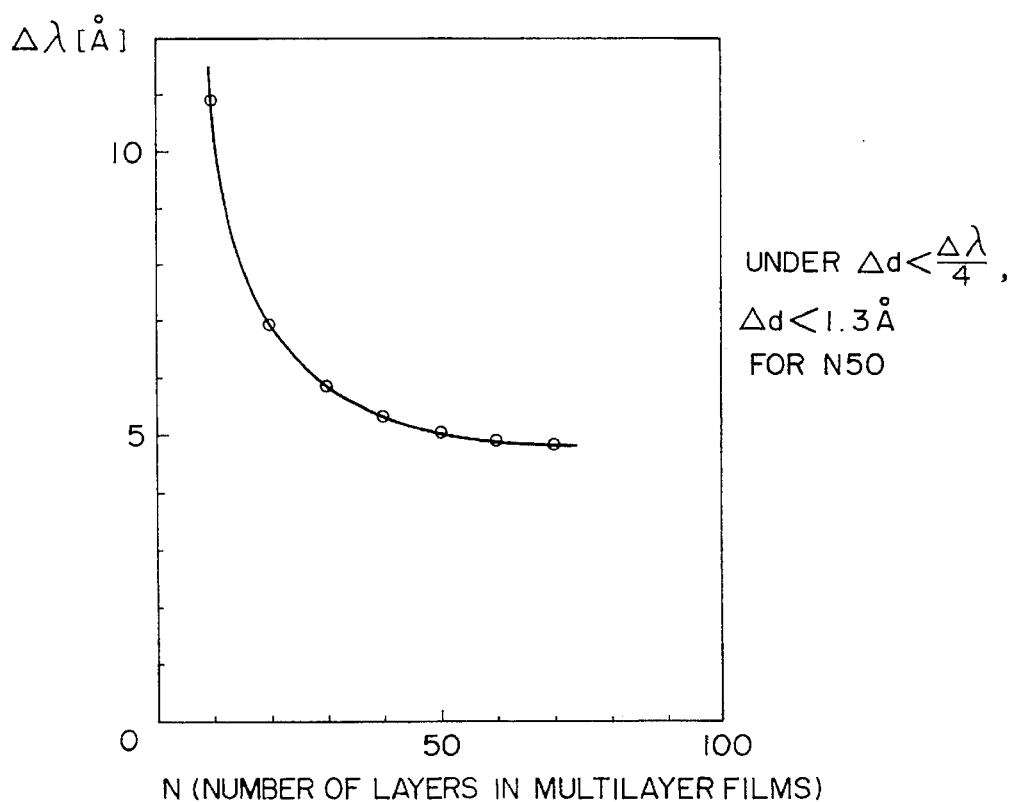
FIG. 20B is a graph to show a relation between number of multilayer films (N) and half-width ($\Delta\lambda$) of wavelength at which the reflectivity becomes maximum.
Figure 21A:
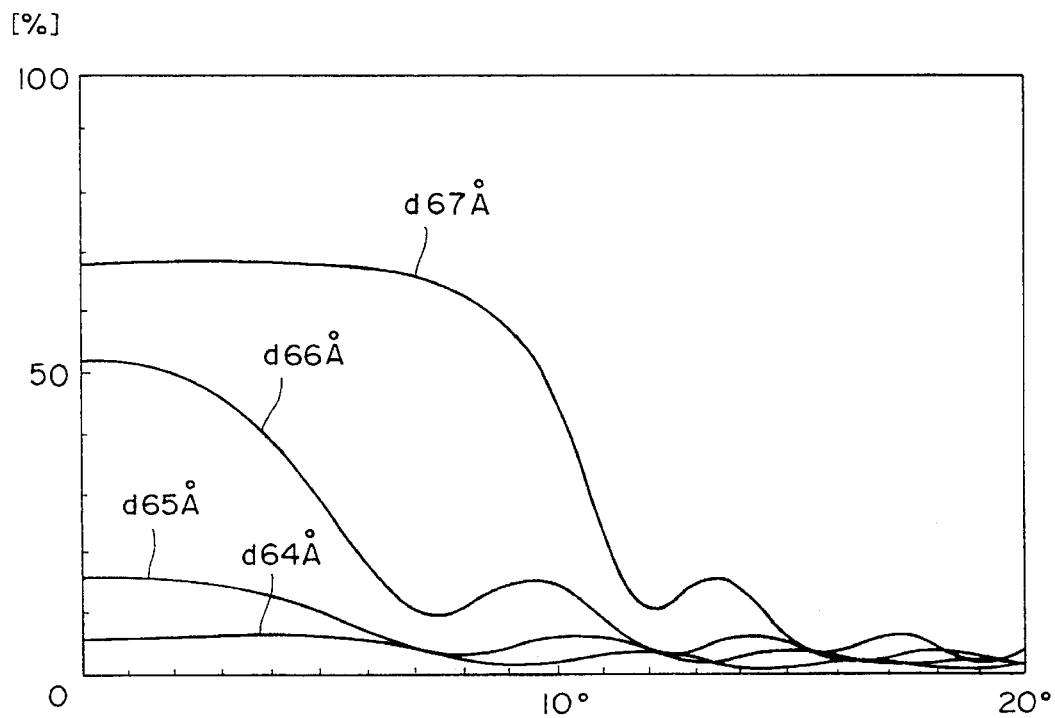
FIG. 21A is a graph to show a change in reflectivity in case the angle of incidence is changed from the normal incidence into Mo/Si multilayer films.
Figure 21B:
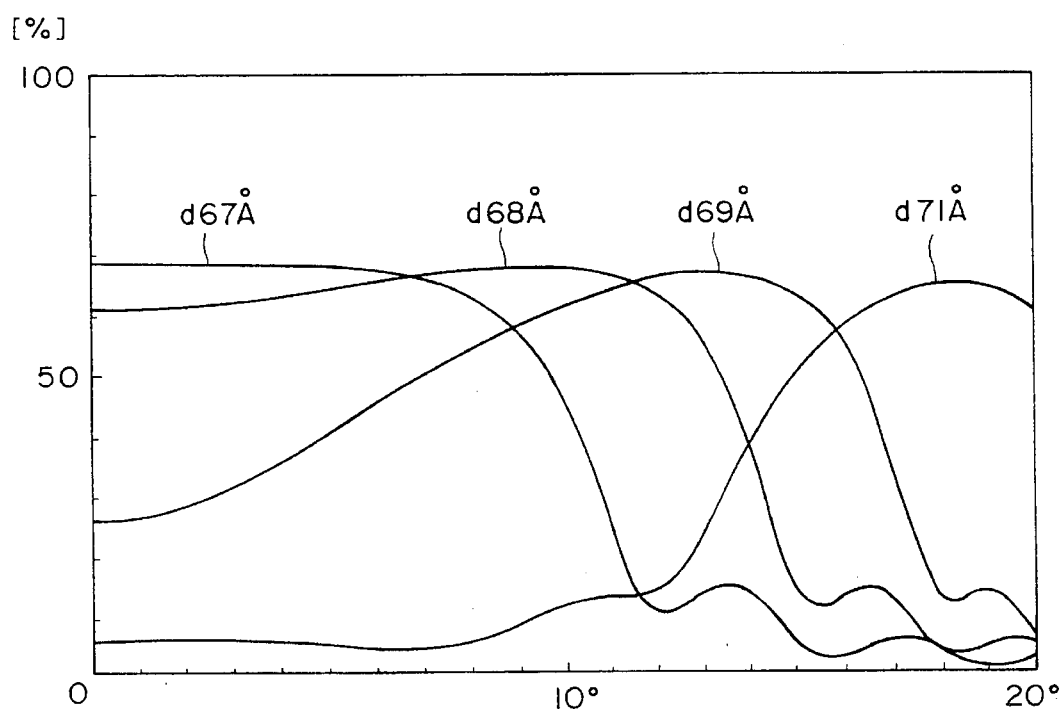
FIG. 21B is a graph to show a change in reflectivity in case the angle of incidence is changed from the normal incidence into Mo/Si multilayer films.

The wavelength half width of reflectivity peak decreases with an increase in number of layers and is saturated at a nearly same number of layers as the reflectivity. When 50 layers are laminated, the half width is about 5 Å (see FIG. 20B). Strictly speaking, the period of layers must be changed according to the Bragg's formula in case of the multilayer films being formed over the convex portions or concave portions, because the incident angle changes depending upon the location. However, the multilayer films may be formed at a constant period as long as the change in reflectivity is small with a change in incident angle. FIGS. 21A and 21B are drawings for Mo/Si multilayer films to show changes in reflectivity obtained when the incident angle is changed from the normal incidence. The layers can be laminated at a constant thickness if the change in incident angle is in the range of about 0° to 8°. If the change in incident angle exceeds the range, the layers in the multilayer films must be formed at different periods. Specifically, such multilayer films can be formed by the method using a film thickness distribution correction slit while rocking a substrate (for example as described in Japanese Patent Application No. 5-237590).

In the present embodiment, the X-rays preferably have the wavelength of not more than 50 nm in case they are used as a light source for an illumination optical apparatus as described later. More preferably, the wavelength is in the range of 5 nm to 20 nm. Accordingly, the film thickness of multilayer films may be suitably selected according to the wavelength of X-rays employed.

Figure 23:
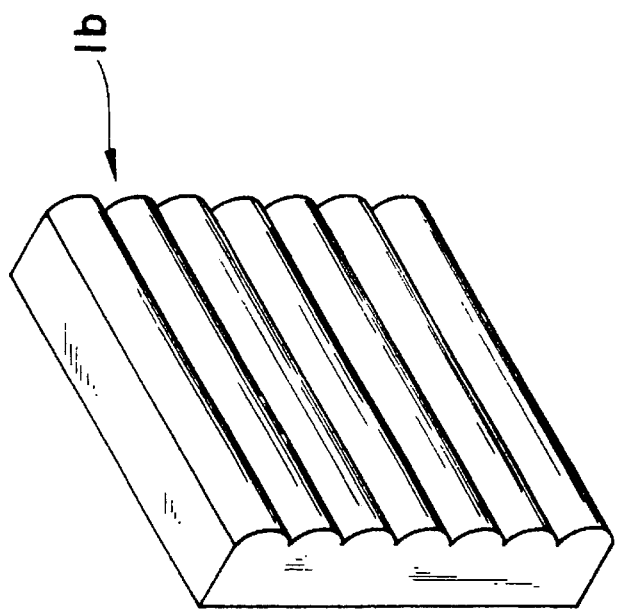
FIG. 23 is a perspective view to show another embodiment of optical element.
Figure 22:
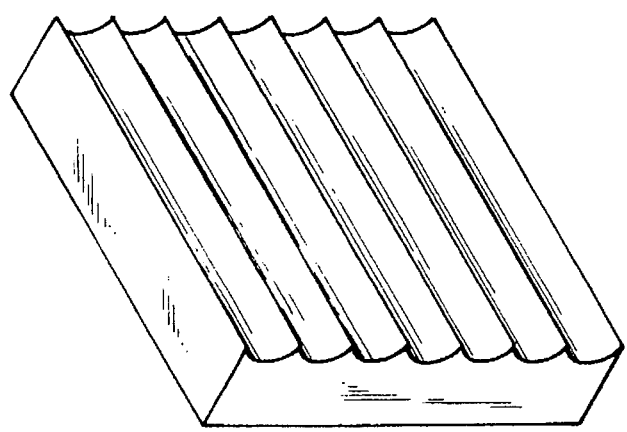
FIG. 22 is a perspective view to show another embodiment of optical element.
Figure 24:
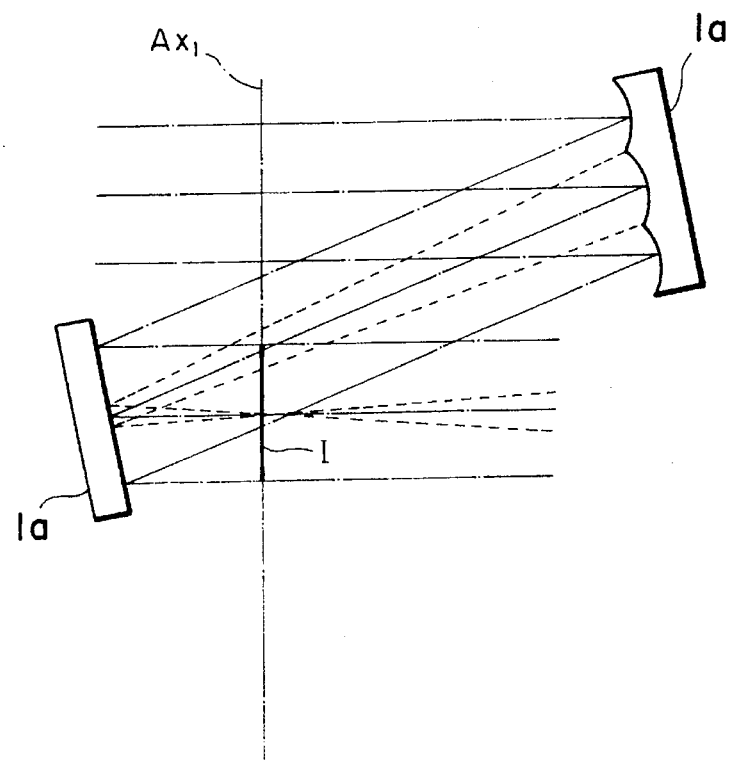
FIG. 24 is a drawing to show an optical system using two optical elements as shown in FIG. 22.
Figure 25:
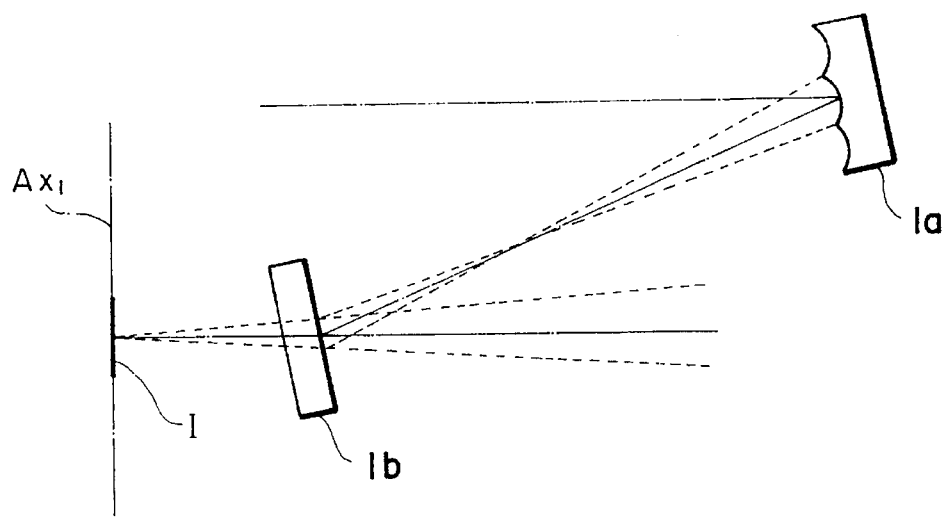
FIG. 25 is a drawing to show an optical system using the optical element shown in FIG. 22 and the optical element shown in FIG. 23.

Here, other embodiments of optical element are shown in FIGS. 22 and 23. An optical element 1a is so arranged that concave surfaces are formed in a shape of groove on the surface thereof and each groove concave surface is arranged one-dimensionally. Also, an optical element 1b is so arranged that convex surfaces are one-dimensionally arranged, contrary to the optical element 1a. These optical elements 1a, 1b are used in combination of two optical elements. An example in FIG. 24 employs two optical elements 1a and another example in FIG. 25 two optical elements 1a, 1b. In either case, the two optical elements are arranged such that the concave surfaces are perpendicular to the convex or concave surfaces and radii of curvature thereof are determined as parallel beams are focused at a same position (I) (i.e., as multiple images of a light source at the infinity are formed at this position).

Figure 26:
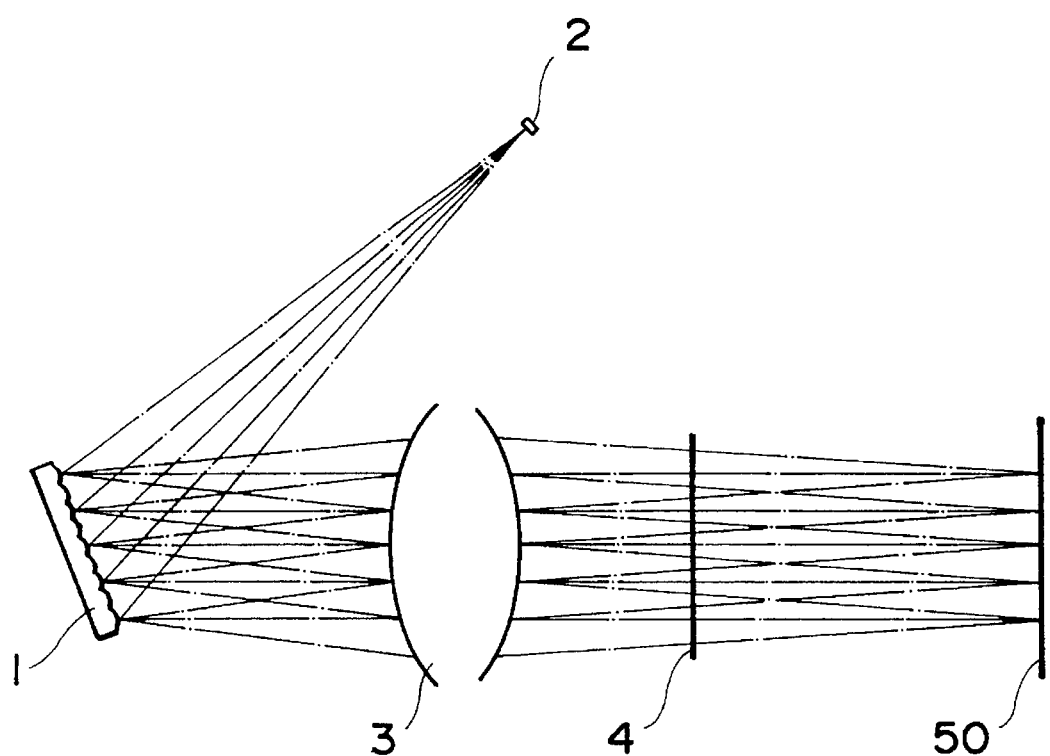
FIG. 26 is a drawing to show an example of arrangement of X-ray optical system.

Next, FIG. 26 schematically shows an example of structure of an X-ray optical system arranged with such an optical element.

The X-ray optical system shown in FIG. 26 is composed mainly of an X-ray source 2 emitting X-rays, an optical element 1, an illumination optical system 3 and a mask 4 on which a predetermined mask pattern is formed. Reference numeral 50 designates the position of entrance pupil of an imaging optical system (not shown). In such an optical system, X-rays emitted from the X-ray source 2 are irradiated onto convex surfaces (or concave surfaces) in the optical element 1. The X-rays irradiated onto the convex surfaces are not simply reflected by specular reflection, but reflected as diffusing with a certain spread around the direction of specular reflection. Thus, the surface (reflecting surface) of the optical element 1 becomes secondary X-ray sources having a wide area and a wide diverging angle. X-rays uniformly emerging from the numerous secondary X-ray sources are focused at the entrance pupil position 50 through the illumination optical system 3.

Figure 27:
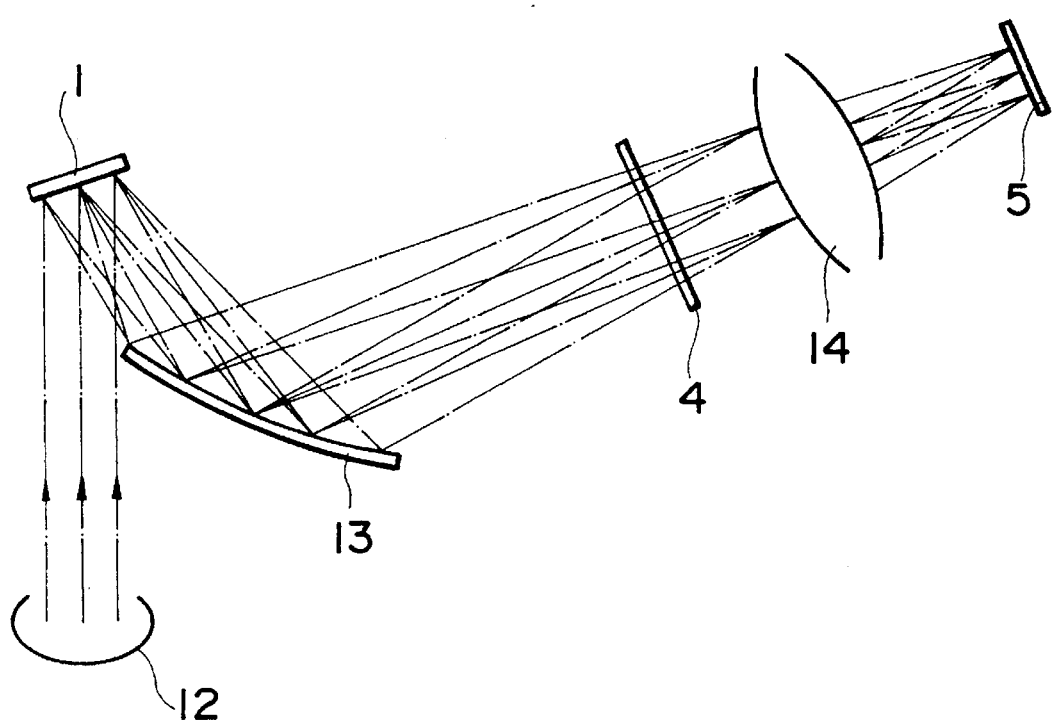
FIG. 27 is a drawing to show another example of arrangement of X-ray optical system.

FIG. 27 is a scheme to show another X-ray optical system, which is used in X-ray reduction projection exposure apparatus. The X-ray optical system is provided with an X-ray-reflecting optical element 1 functioning as secondary X-ray sources, an elliptic mirror 13 on which multilayer films are formed of a combination of Mo (molybdenum)/Si (silicon), a mask 4 and a reduction projection optical system 14, by which a demagnified image of a pattern formed on a mask 4 is focused on a wafer 5. X-rays 12 entering the X-ray optical system are supplied after such a process that an X-ray source (synchrotrom radiation source employed in the present embodiment) emits X-rays, a front-end optical system composed mainly of an oblique incidence mirror and a filter (both not shown) selects X-rays with wavelength near 130 Å, and then a slit (not shown) shapes a beam of X-rays in a square of about 30 mm side. Then, the beam of nearly parallel rays with a diverging angle of at most about 0.1° enters the X-ray optical system.

The X-ray-reflecting optical element 1 has a reflecting surface (a surface into which the X-rays 12 are incident) formed by multilayer films in combination of Mo (molybdenum)/Si (silicon). Further, the reflecting surface is formed such that a plurality of semispherical convex portions with a diameter d of each portion being about 10 µm and a radius of curvature r of each spherical surface being about 170 µm are formed at pitch of about 10 µm in a square region of 30 mm side. The elliptic mirror 13 is located such that one of two foci is at the setting position of optical element 1. FIG. 27 omits the detail of the structure of reduction projection optical system 14, which is composed of three mirrors in total, i.e., a mirror having a parabolic surface and two mirrors each having an ellipsoidal surface. Each of the three mirrors has a reflecting surface of multilayer films in combination of Mo/Si. The reduction projection optical system 14 in the present embodiment is set to have a demagnification ratio of 1/5 and an image-side numerical aperture of 0.06 in order to obtain the resolving power of not more than 0.1 µm and the depth of focus of at least 1.8 µm, in which the mask-side numerical aperture becomes 0.012.

In the X-ray optical system as so arranged, the reflecting surface of optical element 1 first reflects the X-rays 12 incident thereinto as the beam of nearly parallel rays with diverging angle of at most about 0.1° as described above. The optical element 1 functions as secondary light sources with diverging angle of 2Φ. The value of Φ is determined as follows. Since 2Φ=d/r where d is the diameter of each convex portion in the reflecting surface and r is the radius of curvature of spherical surface, the diverging angle of reflected X-rays is d/r=10/170=0.06(rad)=3.4°. Namely, the optical element 1 functions as secondary X-ray sources having the size of 30 mm square and the diverging angle of 3.4°. The X-rays reflected by the optical element 1 are again reflected by the elliptic mirror 13, which forms five times larger images of the secondary X-ray sources at the entrance pupil of reduction projection optical system 14. Accordingly, the mask 4 is illuminated in a wide region of at least 150 mm square. The diverging angle of X-rays on this occasion decreases according to the magnification ratio of the elliptic mirror 13, which will be about 0.012(rad)=0.69° coinciding with the mask-side numerical aperture of reduction projection optical system 14. The X-rays illuminating and passing through the mask 4 then pass through the reduction projection optical system 14 to form a demagnified image of a pattern formed on the mask 4, on the wafer 5.

Reduction projection exposure experiments were conducted using the X-ray optical system in the present embodiment. The experiments assured that lines and spaces of 0.1 μm were resolved all over an arc-shaped region in length of 30 mm, width of 0.2 mm and radius of 17.5 mm. Another exposure experiment was conducted under the same conditions except that the optical element 1 was replaced by a plane multilayer film mirror, which showed that only lines and spaces of up to 0.2 μm could be resolved.

Figure 28:
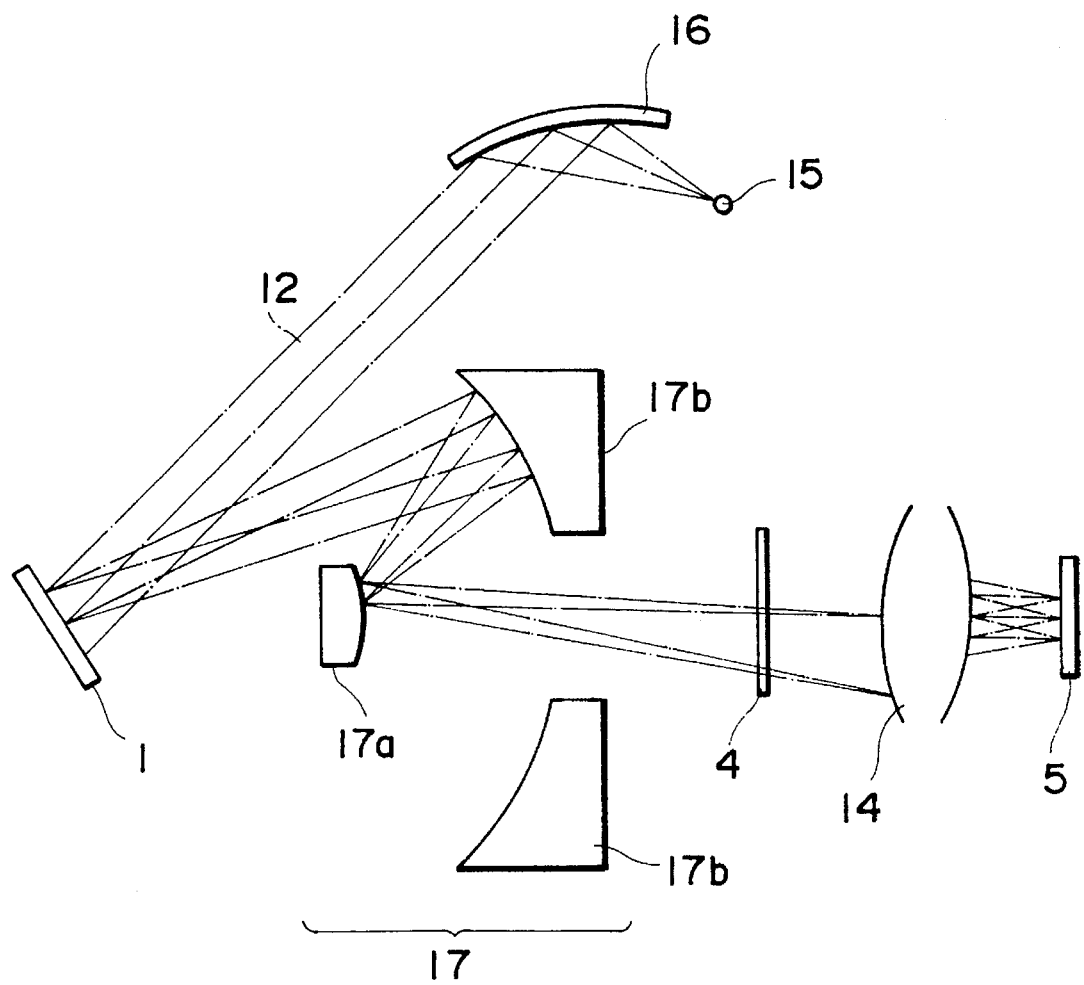
FIG. 28 is a drawing to show another example of arrangement of X-ray optical system.

FIG. 28 is a schematic constitutional drawing to show another X-ray optical system, which is used in X-ray reduction projection exposure apparatus. In FIG. 28, constituents having the same structure and function as those in FIG. 27 are denoted by the same reference numerals and will be properly omitted to explain.

The X-ray optical system in the present embodiment is provided with a laser plasma X-ray source 15 as the X-ray source, a parabolic surface mirror 16 reflecting X-rays emitted from the X-ray source 15 to supply a beam of nearly parallel rays, an X-ray-reflecting optical element 1 functioning as secondary X-ray sources, a Schwarzschild mirror 17, a mask 4 and a reduction projection optical system 14, by which a demagnified image of a pattern formed on the mask 4 is formed on a wafer 5.

The parabolic surface mirror 16 has coatings of multilayer films in combination of Mo/Si on a reflecting surface thereof. The shape of the reflecting surface (parabolic surface) is determined as the reflected X-rays 12 become nearly parallel. The optical element 1 has a reflecting surface (surface which the X-rays 12 enter) formed by multilayer films in combination of Mo (molybdenum)/Si (silicon). Further, the reflecting surface is so arranged that a plurality of semispherical convex portions each with diameter d of about 10 μm and radius of curvature r of spherical surface being about 80 μm are formed at pitch of about 10 μm in a circular region of diameter 15 mm. The Schwarzschild mirror 17 is an optical system composed of two spherical mirrors 17a, 17b having a common central axis. Multilayer films in combination of Mo/Si are formed on a reflecting surface of each spherical mirror. In order to avoid interference between the incident X-rays and the spherical mirror (convex mirror) 17a disposed near the optical axis of the Schwarzschild mirror 17, the optical element 1 is so arranged that the direction of principal rays of reflected light is inclined at about 10° relative to the optical axis of Schwarzschild mirror 17. The magnification of Schwarzschild mirror 17 is set to 10. The reduction projection optical system 14 has the same structure as that in the previous embodiment, which is set to the demagnification ratio of 1/5 and the image-side numerical aperture of 0.06 and in which the mask-side numerical aperture is 0.012.

In the X-ray optical system as so arranged, the reflecting surface of optical element 1 first reflects the X-rays 12 incident thereinto as a beam of nearly parallel rays with diverging angle of at most about 0.1° as described above. The optical element 1 functions as secondary X-ray sources with diverging angle of 2Φ. The value of Φ is determined as follows. Since 2Φ=d/r where d is the diameter of each convex portion in the reflecting surface and r a radius of curvature of spherical surface, the diverging angle of reflected X-rays is d/r=10/80=0.12(rad)=6.9°. Namely, the optical element 1 functions as secondary light sources with diameter 15 mm and diverging angle 6.9°. The X-rays reflected by the optical element 1 are again reflected by the Schwarzschild mirror 17 to form 10 times larger images of the secondary X-ray sources at the entrance pupil of reduction projection optical system 14. Accordingly, the mask 4 is illuminated in a wide region of about 150 mm. The diverging angle of X-rays on this occasion decreases according to the magnification ratio of Schwarzschild mirror 17, which is 0.012(rad)=0.69° coinciding with the mask-side numerical aperture of reduction projection optical system 14. The X-rays illuminating and passing through the mask 4 pass through the reduction projection optical system 14 to form a demagnified image of a pattern formed on the mask 4, on the wafer 5.

Reduction projection exposure experiments were conducted using the X-ray optical system in the present embodiment. The experiments assured that lines and spaces of 0.1 μm were resolved over an entire arc-shaped region in length of 30 mm, width of 0.2 mm and radius of 17.5 mm. Another exposure experiment was conducted under the same conditions except that the optical element 1 was replaced by a plane multilayer film mirror, which showed that only lines and spaces of up to 0.2 μm could be resolved.

Another X-ray optical system is next described. The structure of optical system is the same as that shown in FIG. 27 and therefore omitted to depict.

X-rays 12 to enter the X-ray optical system are emitted from an X-ray source (photon radiation source employed in the present embodiment). A front-end optical system composed mainly of an oblique incidence mirror and a filter (both not shown) selects X-rays with wavelength near 130 Å. After that, a slit (not shown) shapes the X-rays into a beam of about 30 mm square. The thus shaped beam of parallel rays with diverging angle of at most about 0.1° then enters the X-ray optical system.

Multilayer films in combination of Mo (molybdenum)/Si (silicon) are formed on the surface of X-ray optical element 1. Further, the surface is so arranged that a plurality of convex portions (not shown) having external surface of toroidal surface are formed as filling up a square region of 30 mm side. The toroidal surface is constructed in such dimensions that the radius of curvature is $R_{0x}$=160 μm and the length is $2R_x$=10 μm in the direction parallel to a line connecting intersection points between the plane of incidence of X-rays (in the plane of FIG. 27) and the surface of a convex portion and that the radius of curvature is $R_{0y}$=40 μm and the length is $2R_y$=5 μm in the direction perpendicular to the line connecting the above intersection points (in the direction normally crossing the plane of FIG. 27). The incident angle of X-rays 12 into the optical element 1 is set to $\theta_0=60°$.

The elliptic mirror 13 is set such that one of two foci is located at the setting position of optical element 1. The figure omits the detail of the reduction projection optical system 14, which is composed of three mirrors in total, i.e., a mirror having a parabolic surface and two mirrors each having an ellipsoidal surface. Each of the three mirrors has a reflecting surface on which multilayer films are formed in combination of Mo/Si. The reduction projection optical system 14 in the present embodiment is arranged to have the demagnification ratio of 1/5 and the image-side (exit-side) numerical aperture of 0.0625 to obtain the resolving power of not more than 0.1 µm and the depth of focus of at least 1.8 µm, in which the mask-side (entrance-side) numerical aperture is 0.0125.

In the X-ray optical system as so arranged, the surface (reflecting surface) of optical element 1 first reflects the X-rays 12 incident thereinto as a beam of nearly parallel rays with diverging angle of at most about 0.1° as described above. The optical element 1 functions as secondary light sources with diverging angle of $\psi$. The value of $\psi$ is determined by the shape of convex portions formed on the surface of optical element 1, which is $2R_x/R_{0x}=10/160=0.0625(\text{rad})=3.6°$ in the direction parallel to the plane of incidence while $2R_y/R_{0y}\cdot\cos\theta_0=5/40\cdot0.5=0.0625(\text{rad})=3.6°$ in the direction normal to the plane of incidence. Namely, the optical element 1 functions as secondary X-ray sources having the size of 30 mm square and the diverging angle of 3.6° in either direction.

The X-rays reflected by the optical element 1 are again reflected by the elliptic mirror 13 to form five times larger images of the secondary X-ray sources at the entrance pupil of reduction projection optical system 14. Accordingly, the mask 4 is illuminated in a wide region of over 150 mm square. A diverging angle of X-rays on this occasion decreases according to the magnification ratio of elliptic mirror 13, which is about 0.0125(rad)=0.72° coinciding with the mask-side numerical aperture of reduction projection optical system 14. The X-rays illuminating and passing through the mask 4 then pass through the reduction projection optical system 14 to form a demagnified image of a pattern formed on the mask 4, on the wafer 5.

Reduction projection exposure experiments were conducted using the X-ray optical system in the present embodiment. The experiments assured that lines and spaces of 0.1 µm were resolved over an entire arc-shaped region in length of 30 mm, width of 0.2 mm and radius of 17.5 mm. Also, no difference was observed in resolving power depending on the direction in the pattern. Another exposure experiment was conducted under the same conditions except that the optical element 1 was replaced by a simple plane multilayer film mirror, which showed that only lines and spaces of up to 0.2 µm could be resolved.

Another X-ray optical system is next described. The structure of optical system is the same as that in FIG. 28 and omitted to show.

The X-ray optical system in the present embodiment is provided with a laser plasma X-ray source 15 as X-ray source, a parabolic surface mirror 16 for reflecting X-rays emitted from the X-ray source 15 to supply a beam of nearly parallel rays, an optical element 1 functioning as secondary X-ray sources, a Schwarzschild mirror 17 acting as an illumination optical system, a mask 4 and a reduction projection optical system 14, by which a demagnified image of a pattern formed on a mask 4 is focused on a wafer 5.

The parabolic surface mirror 16 has a reflecting surface having coatings of multilayer films in combination of Mo/Si, which covers X-rays in a wide solid angle range out of the X-rays isotropically emitted from the laser plasma X-ray source 15 and in which the reflecting surface (parabolic surface) is so shaped that the reflected X-rays 12 become a beam of nearly parallel rays.

Multilayer films in combination of Mo/Si are formed on the surface of optical element 1. Further, the surface is so arranged that a plurality of convex portions each having an external surface of toroidal surface are formed as filling up a circular region of diameter 15 mm. The toroidal surface has such dimensions that the radius of curvature is $R_{0x}=80$ µm and the length is $2R_x=10$ µm in the direction parallel to a line connecting intersection points between the plane of incidence of the X-rays (in the plane of FIG. 28) and the surface of each convex portion and that the radius of curvature is $R_{0y}=65$ µm and the length is $2R_y=9$ µm in the direction perpendicular to the line connecting the above intersection points (in the direction normally passing through the plane of FIG. 28). The incident angle of X-rays 12 into the optical element 1 is set to $\theta_0=26°$.

The Schwarzschild mirror 17 is an optical system composed of two spherical mirrors 17a, 17b having a common center. Multilayer films in combination of Mo/Si are formed on a reflecting surface of each spherical mirror 17a, 17b. In order to avoid interference between the incident X-rays and the spherical mirror (convex mirror) 17a disposed near the optical axis of Schwarzschild mirror 17, the direction of principal rays of reflected light by the X-ray optical element 1 is inclined at about 10° relative to the optical axis of Schwarzschild mirror 17.

The reduction projection optical system 14 has the same structure as that in the previous embodiment, which is set to have the reduction ratio of 1/5 and the image-side (exit-side) numerical aperture of 0.0625 and in which the mask-side (entrance-side) numerical aperture is 0.0125.

In the X-ray optical system as so arranged, the surface (reflecting surface) of X-ray optical element 1 first reflects the X-rays 12 incident thereinto as a beam of nearly parallel rays with diverging angle of at most about 0.1° as described above. The optical element 1 functions as secondary X-ray sources with diverging angle of $\psi$. The value of $\psi$ is determined by the shape of convex portions in the surface, which is $2R_x/R_{0x}=10/80=0.125(\text{rad})=7.2°$ in the direction parallel to the plane of incidence while $2R_y/R_{0y}\cdot\cos\theta_0=9/65\cdot0.9=0.125(\text{rad})=7.2°$ in the direction perpendicular to the plane of incidence. Namely, the X-ray optical element 1 functions as secondary light sources with diameter 15 mm and diverging angle 7.2°.

The X-rays reflected by the optical element 1 are again reflected by the Schwarzschild mirror 17 to form 10-times larger images of the secondary X-ray sources at the entrance pupil of reduction projection optical system 14. Accordingly, the mask 4 is illuminated in a wide region of about 150 mm. A diverging angle of X-rays on this occasion decreases according to the magnification ratio of Schwarzschild mirror, which is 0.0125(rad)=0.72° coinciding with the mask-side numerical aperture of reduction projection optical system 14. The X-rays illuminating and passing through the mask 4 then pass through the reduction projection optical system 14 to form a demagnified image of the pattern formed on the mask 4, on the wafer 5.

Reduction projection exposure experiments were conducted using the X-ray optical system in the present embodiment. The experiments assured that lines and spaces of 0.1 µm were resolved over an entire arc-shaped region in length of 30 mm, width of 0.2 mm and radius of 17.5 mm. Also, no difference was observed in resolving power in either direction in pattern. Another exposure experiment was conducted under the same conditions except that the optical element 1 was replaced by a plane multilayer film mirror, which showed that only lines and spaces of up to 0.2 µm could be resolved.

Incidentally, the optical elements in the present embodiment are not limited to the applications in the X-ray reduction projection exposure apparatus, but can be widely applied to other X-ray optical instruments utilizing image formation with X-rays. For example, the present embodiment may also be applied to a 1:1 projection exposure apparatus using the Offner optical system, whereby a resolving power of the diffraction limit can be attained in a wide exposure region similarly as in the case of reduction projection exposure. Also, applying the present invention to an illumination optical system in X-ray microscope, the field of microscope can be greatly increased.

Embodiment II

Next described are preferred embodiments of production method of the optical elements as described above.

Embodiment a

Figure 29A:
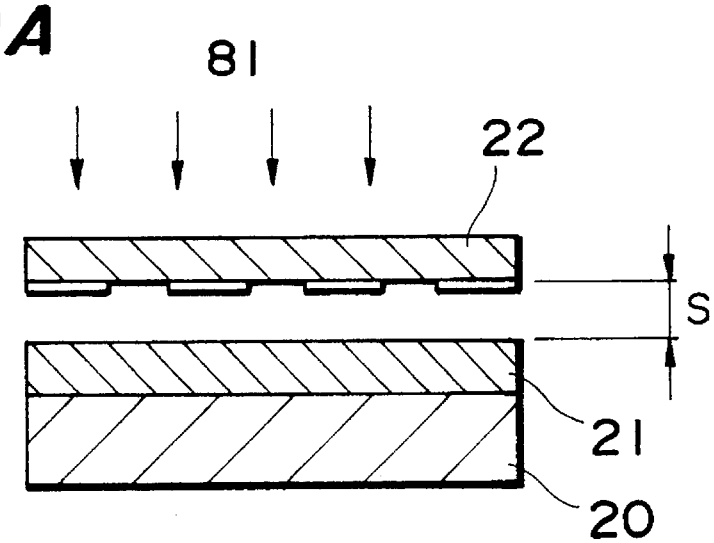
FIG. 29A is an illustration to show a production step of optical element.
Figure 29B:
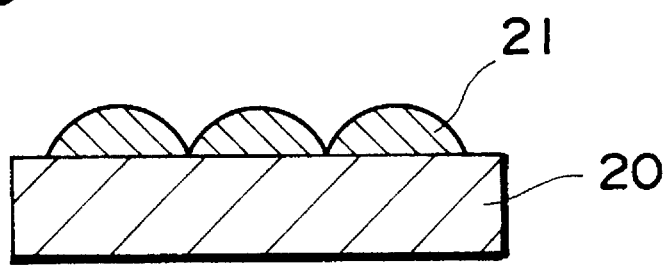
FIG. 29B is an illustration to show a production step of optical element.
Figure 29C:
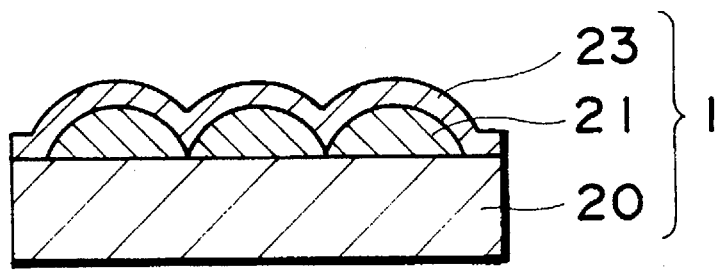
FIG. 29C is an illustration to show a production step of optical element.

FIGS. 29A to 29C are drawings to illustrate the scheme of an embodiment of an optical element for X-ray reflection in the present invention and steps for producing it. As shown in FIG. 29C, an X-ray-reflecting optical element 1 is composed of a substrate 20 made of silicon, a photoresist layer 21 formed on the substrate 20 and having a plurality of nearly semispherical convex portions, and multilayer films 23 formed on the resist layer 21.

In producing the optical element 1, as shown in FIG. 29A, a mirror-polished silicon substrate 20 in diameter of 3 inches and thickness of 5 mm was first prepared and a photoresist was uniformly deposited in thickness of 0.2 µm on the polished surface to form a photoresist layer 21. Then, ultraviolet rays 81 were irradiated through a mask 22 with a predetermined pattern formed thereon to effect exposure on the resist layer 21. The mask 22 had a pattern of circles each in diameter of 5 µm as arranged at pitch of 10 µm. Employed as the exposure method was the proximity exposure method in which the photoresist layer 21 and the mask 22 were set with a separation s between them without contact with each other. The value of s was about 100 µm in the present embodiment. Diffraction of light in the exposure caused an unfocused image of the pattern on the mask 22 to be transferred onto the photoresist layer 21, and therefore the cross section of photoresist layer 21 after development was smooth as shown in FIG. 29B, whereby almost semispherical convex portions were formed. Further, molybdenum and silicon were alternately deposited by the sputtering method on the photoresist layer 21 to form multilayer films 23 thereon, thus obtaining the optical element 1 for X-ray reflection as shown in FIG. 29C.

Although the convex portions were formed using the photoresist in the present embodiment, another photosensitive material such as photoreactive polyimide may be employed.

Also, changing the pattern of mask 22 can change the shape of convex portions formed in the photoresist layer 21. For example, in case the convex portions are desired to be formed in a shape of toroidal surface, the pattern on the mask 22 may be formed in an elliptic shape having different pitches in the vertical and horizontal directions. As an example, ellipses with 5 µm (major axis diameter)×3 µm (minor axis diameter) are preferably formed at pitch of 10 µm in the direction of major axis and at pitch of 6 µm in the direction of minor axis on the mask 22. A multilayer film reflecting surface can be formed in the shape of toroidal surface by similarly forming multilayer films 23 on the thus formed photoresist layer 21.

Embodiment b

Figure 30A:
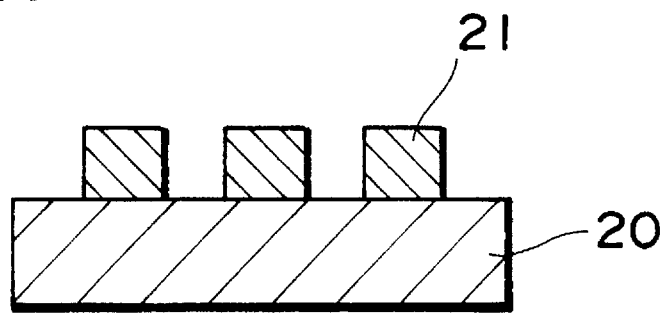
FIG. 30A is an illustration to show a production step of optical element.
Figure 30B:
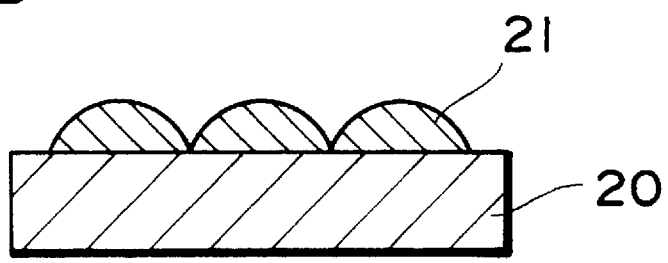
FIG. 30B is an illustration to show a production step of optical element.
Figure 30C:
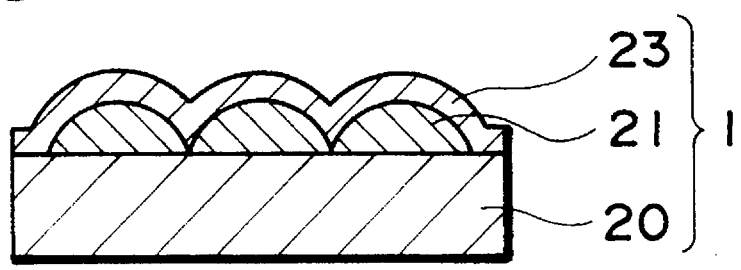
FIG. 30C is an illustration to show a production step of optical element.

FIGS. 30A to 30C are drawings to illustrate the scheme of an embodiment of optical element and steps for producing it. As shown in FIG. 30C, an optical element 1 is composed, similarly as in Embodiment a, of a substrate 20 made of silicon, a photoresist layer 21 formed on the substrate and having a plurality of nearly semispherical convex portions, and multilayer films 23 formed on the resist layer 21.

In producing the optical element 1, a mirror-polished silicon substrate 20 with diameter of 3 inches and thickness of 5 mm was first prepared and a photoresist was uniformly deposited in thickness of 0.2 µm on the polished surface. Then, the photoresist was patterned by the ordinary photolithography process. The patterning was set such that the photoresist layer 21 after development had a pattern of circular cylinders of photoresist each with diameter of 6 µm and height of 0.2 µm aligned at pitch of 10 µm as shown in FIG. 30A. After the patterning, post-bake of photoresist layer 21 was carried out at a temperature (200° C. in the present embodiment) higher than the glass transition point of the photoresist. The post-bake softened the photoresist layer 21 to make the shape smooth as shown in FIG. 30B, forming nearly semispherical convex portions. Further, molybdenum and silicon were alternately deposited by the sputtering method on the photoresist layer 21 to form the multilayer films 23, thus obtaining the optical element 1 as shown in FIG. 30C.

Also, changing the shape of photoresist columns (reference numeral 21) shown in FIG. 30A can change the shape of the convex portions (reference numeral 21) in FIG. 30B. For example, if the patterning is effected with photoresist columns shaped in the form of elliptic cylinder, the convex portions in FIG. 30B may be formed in the shape of toroidal surface. In this case, it is preferred that elliptic cylinders with 6 µm (major axis diameter)×4.5 µm (minor axis diameter) are arranged at pitch of 10 µm in the direction of major axis and at pitch of 7.5 µm in the direction of minor axis. A multilayer reflecting surface having the toroidal surface shape can also be formed by similarly forming multilayer films 23 on the convex portions.

Embodiment c

Figure 31A:
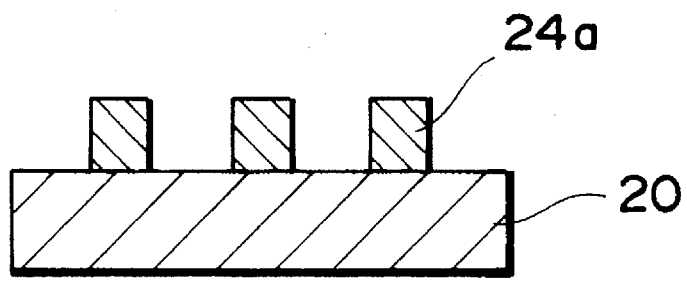
FIG. 31A is an illustration to show a production step of optical element.
Figure 31B:
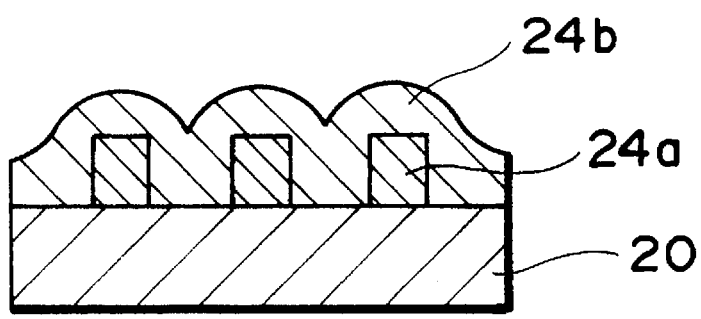
FIG. 31B is an illustration to show a production step of optical element.
Figure 31C:
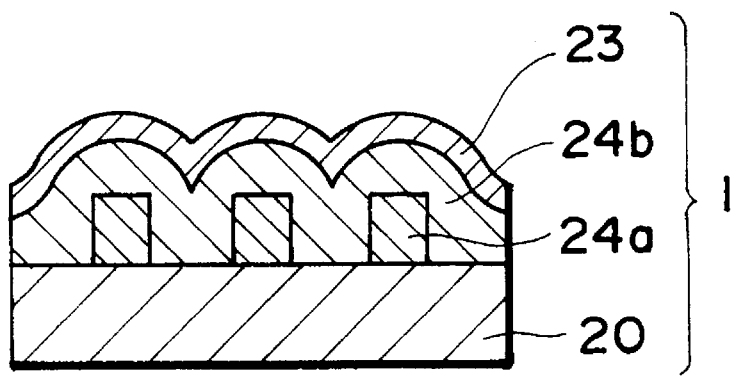
FIG. 31C is an illustration to show a production step of optical element.

FIGS. 31A to 31C are drawings to illustrate the scheme of an embodiment of optical element and steps for producing it. As shown in FIG. 31C, an optical element 1 is composed of a substrate 20 made of silicon, a polyimide layer 24 formed on the substrate 20 and having a plurality of nearly semispherical convex portions, and multilayer films 23 formed on the polyimide layer 24.

In producing the optical element 1, a mirror-polished silicon substrate 20 with diameter of 3 inches and thickness of 5 mm was first prepared and a photoreactive polyimide resin was deposited in thickness of 1 µm on the polished surface. Then the polyimide resin was subjected to exposure, development and baking to obtain a first polyimide layer 24a in which cylinders of the polyimide resin each with diameter of 5 µm and height of 1 µm as shown in FIG. 31A were arranged in pitch of 10 µm. Then, the polyimide resin was again deposited (in thickness of about 0.5 µm) on the first polyimide layer 24a to cover the pattern portions. A second polyimide layer 24b was formed by baking it with performing neither exposure nor development. The viscosity of polyimide resin caused the second polyimide layer 24b to have ups and downs according to the shape of first polyimide layer 24a as the underlayer, forming nearly semispherical convex portions. Further, molybdenum and silicon were alternately deposited by the sputtering method on the second polyimide layer 24b to form multilayer films 23, thus obtaining the optical element 1 as shown in FIG. 31C.

The second polyimide layer 24b does not always have to be the same photoreactive polyimide resin as the first polyimide layer 24a, but may be a polyimide resin which is not photosensitive. The production method in the present embodiment can be also effective in case either one or the both of the first polyimide layer 24a and the second polyimide layer 24b are replaced by a layer or layers of photoresist.

Changing the shape of photoresist columns (reference numeral 24a) as shown in FIG. 31A can change the shape of convex portions (reference numeral 24b) in FIG. 31B into the shape of toroidal surface. In this case, the photoresist columns 24a in FIG. 31A are preferably formed for example as elliptic cylinders each with 5 μm (major axis diameter)×4 μm (minor axis diameter) arranged at pitch of 10 μm in the direction of major axis and at pitch of about 8 μm in the direction of minor axis.

Embodiment d

Figure 32A:
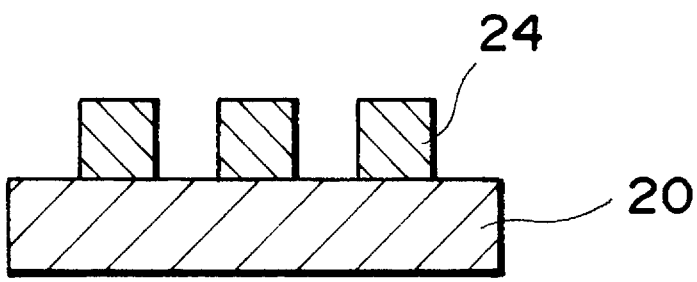
FIG. 32A is an illustration to show a production step of optical element.
Figure 32B:
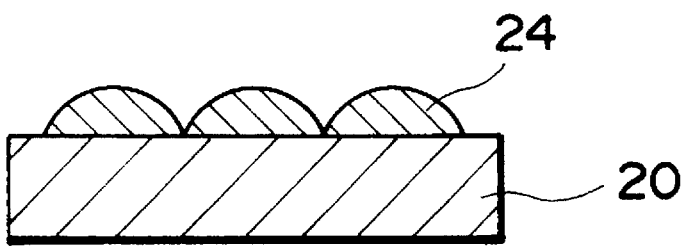
FIG. 32B is an illustration to show a production step of optical element.
Figure 32C:
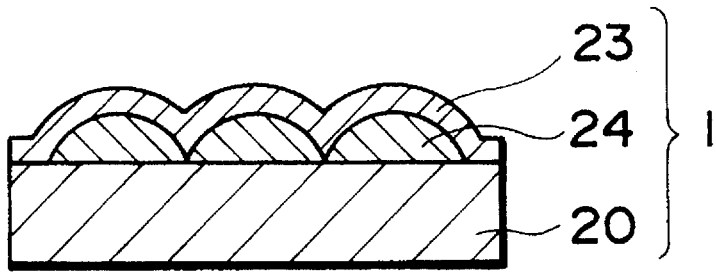
FIG. 32C is an illustration to show a production step of optical element.

FIGS. 32A to 32C are drawings to illustrate the scheme of an embodiment of optical element and steps for producing it. As shown in FIG. 32C, an optical element 1 is composed of a substrate 20 made of silicon, a polyimide layer 24 formed on the substrate 20 and having a plurality of nearly semispherical convex portions, and multilayer films 23 formed on the polyimide layer 24.

In producing the optical element 1, a mirror-polished silicon substrate 20 with diameter of 3 inches and thickness of 5 mm was first prepared and a polyimide resin was screen-printed onto the polished surface to form a polyimide layer 24 in a pattern of cylinders each with diameter of 5 μm and height of 1 μm as shown in FIG. 32A. Then, the pattern was left to stand in a clean atmosphere for thirty minutes. As a result, the polyimide layer 24 after the patterning spread over the substrate 20 by its own weight to become nearly semispherical in shape because of the surface tension. Then the polyimide layer 24 was baked to form semispherical convex portions. Further, molybdenum and silicon were alternately deposited by the sputtering method on the polyimide layer 24 to form multilayer films 23, thus obtaining the optical element 1 as shown in FIG. 32C.

Although the convex portions in the optical element were formed using the polyimide resin in the present embodiment, the convex portions may be formed by screen-printing a glass paste on a substrate 20 made of a ceramic such as alumina ($Al_2O_3$) or silicon carbide (SIC) and baking it.

Also in this case, if the photoresist columns (reference numeral 24) in FIG. 32A are formed in elliptic shape, the convex portions in the polyimide layer 24 can be formed in the shape of toroidal surface. A preferable shape and arrangement pitches of the elliptic cylinders in this case are the same as those in Embodiment c.

Embodiment e

Figure 33A:
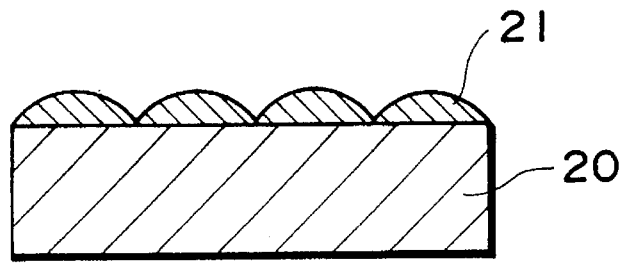
FIG. 33A is an illustration to show a production step of optical element.
Figure 33B:
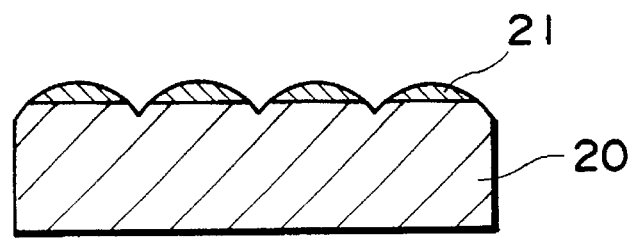
FIG. 33B is an illustration to show a production step of optical element.
Figure 33C:
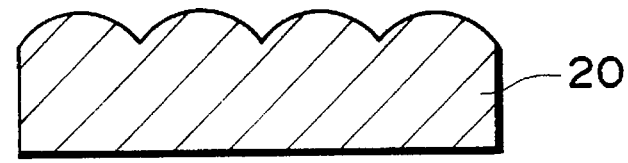
FIG. 33C is an illustration to show a production step of optical element.
Figure 33D:
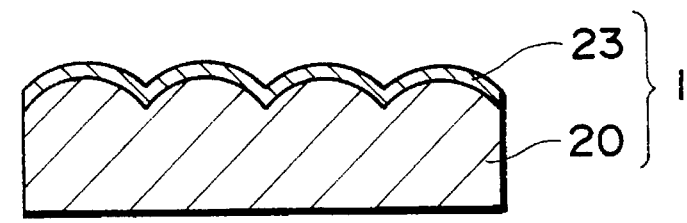
FIG. 33D is an illustration to show a production step of optical element.

FIGS. 33A to 33D are drawings to illustrate the scheme of an embodiment of optical element and steps for producing it. As shown in FIG. 33D, an optical element 1 is composed of a substrate 20 made of silicon and having a plurality of convex portions, and multilayer films 23 formed on the substrate 20.

In producing the optical element 1, a mirror-polished silicon substrate 20 with diameter of 3 inches and thickness of 5 mm was first prepared and a photoresist was uniformly deposited in thickness of 1 μm on the polished surface. Then, the patterning of photoresist was carried out by the ordinary photolithography process similarly as in Embodiment b. The patterning was set such that cylinders of photoresist each with diameter of 6 μm and height of 0.2 μm were formed in a pattern arranged at pitch of 10 μm after development. After the patterning, post-bake of the photoresist layer 21 was carried out at a temperature (200° C. in the present embodiment) higher than the glass transition point of the photoresist. The post-bake caused the photoresist to soften to form nearly semispherical convex portions, whereby the photoresist layer 21 was shaped in a pattern as shown in FIG. 33A. Then, reactive ion etching was carried out with a mask of the thus patterned photoresist layer 21 under the condition that a selection ratio of resist and silicon was approximately 1. Mixture gas of $CF_4$ and $H_2$ was used as reactive gas in the etching. FIG. 33B shows a midway state of the etching. Since the etching speed for resist layer 21 was equal to that for silicon substrate 20, the silicon substrate 20 was etched deeper in thinner portions in the patterned resist. As a result, the shape of resist layer 21 is transferred onto the silicon substrate 20. Accordingly, the reactive ion etching forms nearly semispherical convex portions as shown in FIG. 33C on the silicon substrate 20. After the etching was completed, molybdenum and silicon were alternately deposited by the sputtering method on the silicon substrate 20 to form multilayer films 23, thus obtaining the optical element 1 as shown in FIG. 33D.

Although the present embodiment employed silicon as a material for substrate, the substrate material may be a ceramic such as silicon carbide (SIC) or glass. Also, the patterning of resist layer 21 can be performed using either one of the methods used in Embodiments a, c and d, as well as the method used in Embodiment b. Further, the resist may be replaced by a resin such as polyimide.

Also in this method, the convex portions in the silicon substrate 20 can be formed in the shape of toroidal surface. In this case, the convex portions (reference numeral 21) in FIG. 33A are formed in the shape of semi-elliptic sphere. This example of formation is the same as that in Embodiment b. For example, a preferable shape of the elliptic cylinders formed by the photolithography process is elliptic of 6 μm (major axis diameter)×4.5 μm (minor axis diameter) and they are preferably arranged at pitch of 10 μm in the direction of major axis and at pitch of about 7.5 μm in the direction of minor axis.

Embodiment f

Figure 34A:
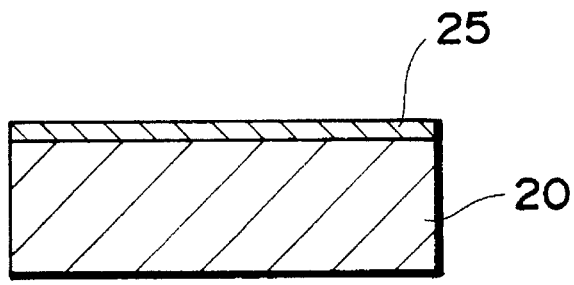
FIG. 34A is an Illustration to show a production step of optical element.
Figure 34B:
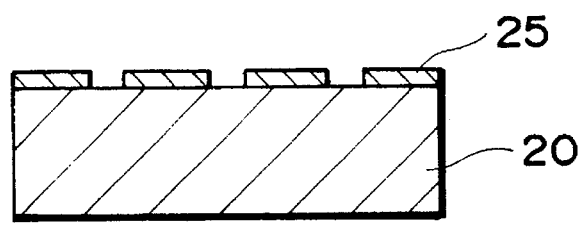
FIG. 34B is an illustration to show a production step of optical element.
Figure 34C:
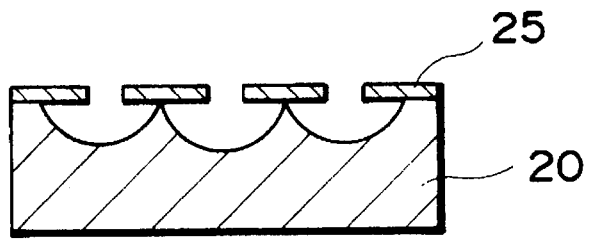
FIG. 34C is an illustration to show a production step of optical element.
Figure 34D:
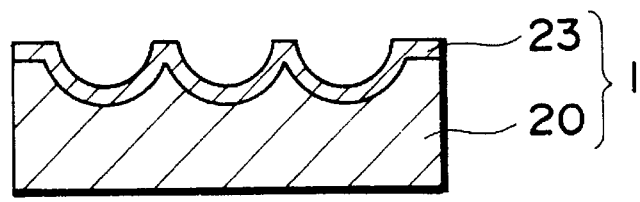
FIG. 34D is an illustration to show a production step of optical element.

FIGS. 34A to 34D are drawings to illustrate the scheme of an embodiment of optical element and steps for producing it. As shown in FIG. 34D, an optical element 1 is composed of a substrate 20 made of silicon and having a plurality of concave portions, and multilayer films 23 formed on the substrate 20.

In producing the optical element 1, a mirror-polished silicon substrate 20 with diameter of 3 inches and thickness of 5 mm was first prepared and the polished surface was thermally oxidized to form a $SiO_2$ layer 25 of thickness 0.5 μm as shown in FIG. 34A. Then, a resist (not shown) was deposited on the layer 25, and the deposited resist was subjected to patterning by the ordinary photolithography process. Further, reactive ion etching was carried out with mixture gas of $CHF_3$, $H_2$ and $O_2$ using the mask of thus patterned resist, whereby holes were formed in diameter of 2 μm and at pitch of 10 μm in the SiO₂ layer 25 (FIG. 34B shows a state after the resist was removed). After that, the silicon substrate 20 was etched while dipped in an etching solution which was a mixture solution of hydrogen fluoride (HF), nitric acid (HNO₃) and acetic acid (CH₃COOH). In the etching, the etching solution isotropically etched the silicon substrate 20 through the holes formed in the SiO₂ layer 25. Thus, when the silicon substrate 20 was lifted up from the etching solution after a predetermined time elapsed, semispherical concave portions as shown in FIG. 34C were formed in the silicon substrate 20. After the etching was completed, the SiO₂ layer 25 was dissolved with hydrogen fluoride (HF) to be removed. Then, molybdenum and silicon were alternately deposited by the sputtering method on the silicon substrate 20 to form multilayer films 23, thus obtaining the optical element 1 as shown in FIG. 34D.

Using this method, the concave portions formed in the silicon substrate 20 may be formed in the shape of toroidal surface by forming the holes in the SiO₂ layer 25 in the shape of predetermined ellipse. A preferable shape of ellipse is of 4 μm (major axis diameter)×2 μm (minor axis diameter). The ellipses are preferably arranged at pitch of 12 μm in the direction of major axis and at pitch of about 10 μm in the direction of minor axis.

Embodiment g

Next described are other embodiments for forming concave surfaces on a substrate.

Figure 35:
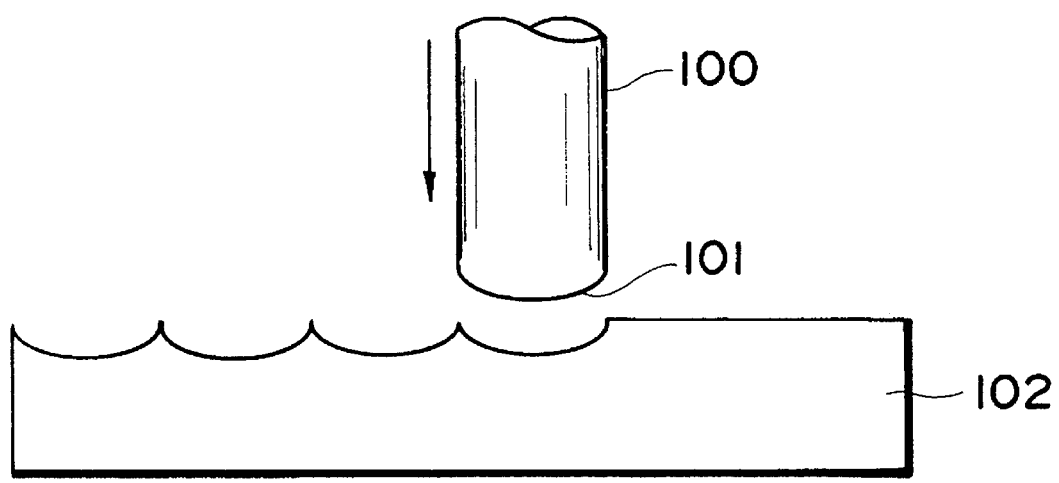
FIG. 35 is an illustration to show another production method of optical element.

If the optical element of the type shown in FIG. 22 is desired to be formed, the concave portions may be made by a die body 100 having a convex portion 101 corresponding to a concave portion of groove to be formed, at the lower distal end thereof, as shown in FIG. 35. The concave portions each corresponding to the convex portion 101 are formed on the surface of substrate 102 by pressing the die body 100 against the surface of substrate 102. Although FIG. 35 shows a die body 100 having a single convex portion 101, the die body 100 may have a plurality of columns of convex portions 101. In this case, a plurality of concave portions 101 can be formed at a time on the surface of substrate 102 by pressing the die body 100 against the substrate 102.

Figure 36:
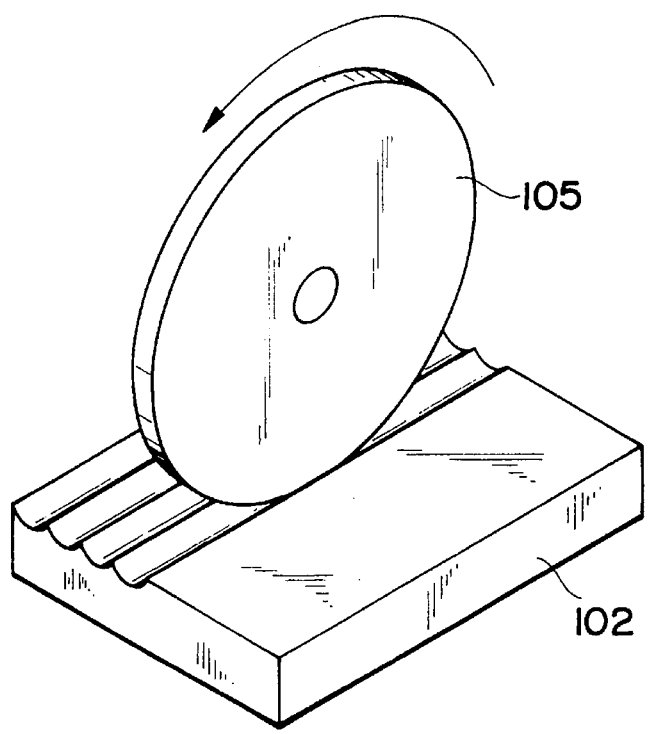
FIG. 36 is an illustration to show another production method of optical element.
Figure 37:
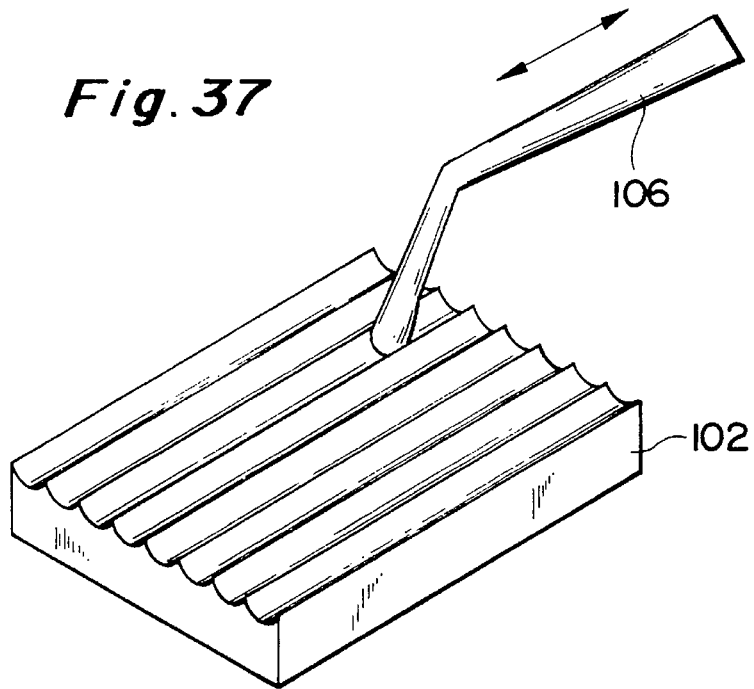
FIG. 37 is an illustration to show another production method of optical element.

In another embodiment, the concave portions may be formed by grinding the surface of substrate 102 by a rotary disk grinder 105 as shown in FIG. 36, or by polishing the surface of substrate 102 utilizing a polishing arm 106 as shown in FIG. 37.

These methods permit spherical surfaces or toroidal surfaces to be formed as well as the concave portions of grooves.

Although the above embodiments showed examples in which the concave portions are formed, convex portions may also be formed on the substrate by a replica of the concave portions with a glass or plastic material.

The optical elements as described in the above embodiments are exposed to relatively strong X-rays, because they are set at a position close to the X-ray source as a light source. Most of X-rays which were not reflected are absorbed by the optical element and the energy of absorbed X-rays increases the temperature of optical element. Therefore, the thermal resistance is an important factor for the optical element for X-ray reflection. Although the optical elements in the present invention can be produced by the various methods as described in Embodiments a to g, the methods for forming the convex portions on the reflecting surface using a photoresist (as in Embodiments a and b) are relatively easy but provide optical elements low in thermal resistance, for example about 100° C., because the thermal resistance of optical element depends upon the thermal resistance of the resist. In contrast, when the polyimide, which is a heat resistant resin, is used (as in Embodiments c and d), the thermal resistance is more than 300° C. Further, the thermal resistance is about 800° C. in the method of printing and baking a glass paste on a ceramic substrate or in the method of making concave portions on a silicon substrate by etching. Yet further, higher thermal resistance of over 1000° C. is possible by the method in which the concave portions are formed by etching a ceramic substrate. The issue of thermal resistance should be considered also for the multilayer films for reflecting the X-rays. The above embodiments employed the multilayer films in combination of Mo/Si, which has the thermal resistance only of about 300° C. Accordingly, in case further higher thermal resistance is necessary, the multilayer films should be made of materials themselves having higher thermal resistance (for example, a combination of Mo/SiC). As described, the optical elements of the present invention can be used for an X-ray source emitting X-rays with very high intensity and produced with necessary thermal resistance matching the intensity of operating X-rays.

Also, the optical elements do not have to be formed too strict as to the accuracy of shape of fine convex portions or concave portions provided on the substrate. However, it is preferable that the roughness of the surface is too low to lower the reflectivity of multilayer films formed on the substrate. For example, it is preferable that the surface is smooth in roughness of below several angstroms in square mean.

Embodiment III

Next described is an exposure apparatus using either one of the optical elements as described above.

Conventional optical apparatus have an optical system for irradiating a certain region with light emitted from a light source, for example as disclosed in U.S. Pat. No. 4,668,077. The optical apparatus, however, has such a drawback that an X-ray-irradiated region cannot be wide enough in case of the X-rays being used as light source.

In contrast, an exposure apparatus according to the present invention utilizes the optical element(s) as described above to enable irradiation of X-rays in a wide region.

Preferred embodiments of exposure apparatus will be described in the following.

Figure 38:
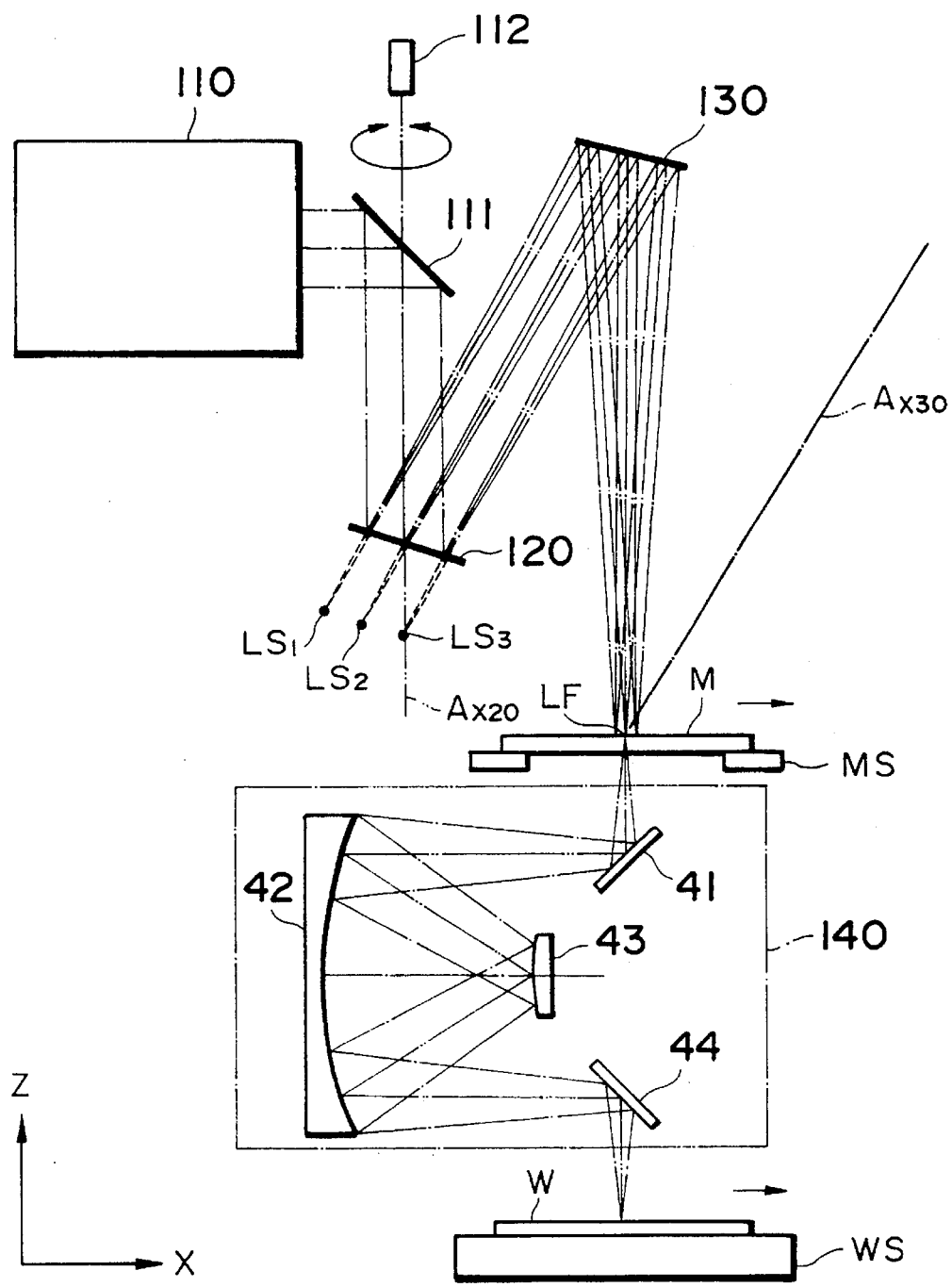
FIG. 38 is a structural drawing to schematically show the structure of overall exposure apparatus.

As shown in FIG. 38, an exposure apparatus is constituted by an illumination optical apparatus for irradiating X-rays onto a mask M and a stepper composed mainly of a mask stage MS and a wafer stage WS. The illumination optical apparatus is composed of a light source portion 110 for radiating X-rays, a plane mirror 111, an integrator mirror 120 and a parabolic surface mirror 130. Also, the stepper is composed of a mask stage MS for successively moving the mask M, a projection optical system 140 provided below the mask stage MS, and a wafer stage WS for successively moving the wafer W.

The structure of each device will be described in detail.

The light source portion 110 has an X-ray source for supplying SOR radiation, a front-end optical system having an oblique incidence mirror and a filter, and a slit. The radiation from the X-ray source passes through the front-end optical system where X-rays only with wavelengths near 130 Å are selected. Then the selected X-rays pass through a slit to be shaped in a desired beam shape and then the shaped X-rays are emitted from the light source portion 110. The light source portion 110 may be so constructed as to have a laser plasma X-ray source and a parabolic surface mirror for converting X-rays from the X-ray source into a beam of parallel rays.

Figure 39:
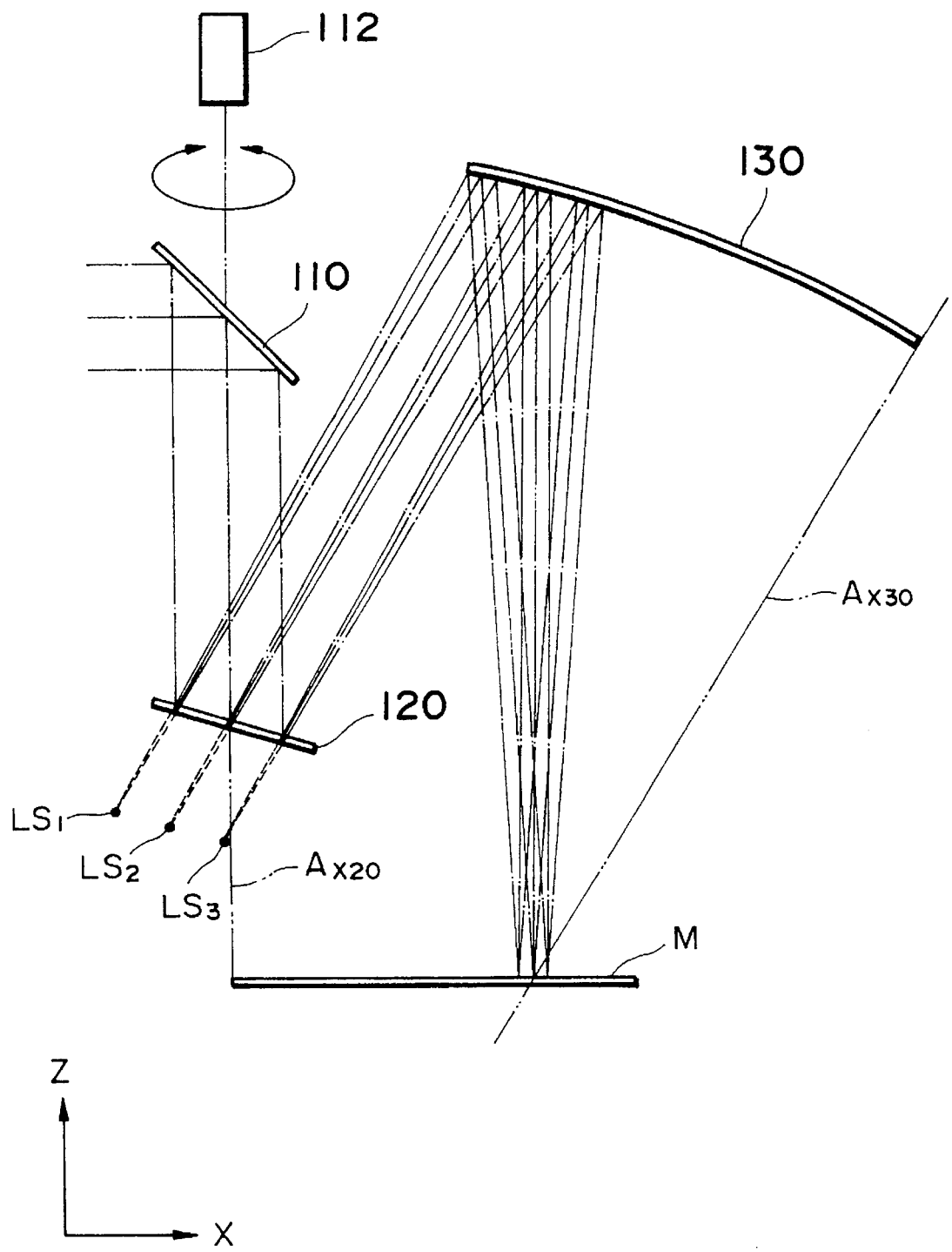
FIG. 39 is a drawing to show an optical system arranged in an illumination optical apparatus.

FIG. 39 shows an optical system set in the illumination optical apparatus.

Subsequently, the thus collimated X-rays from the light source portion 110 reach the plane mirror 111 inclined at 45° relative to the X-ray outgoing direction, whereby the optical paths of the rays are deflected by 90°. Then the rays reach the integrator mirror 120 inclined at a predetermined angle relative to the X-ray proceeding direction. Here, multilayer films in combination of Mo (molybdenum)/Si (silicon) are formed on the surface of each of the above-described oblique incidence mirror, parabolic surface mirror, plane mirror 111 and integrator mirror 120.

The integrator mirror 120 has such a structure that there are a plurality of fine convex portions 7 provided on a substrate 6 and multilayer films 9 for reflecting X-rays formed on the convex surfaces 7, as shown in FIG. 6. Here, a portion of multilayer films 9 on each convex surfaces 7 will be called as a mirror element 7a. An enough condition is that the size of the mirror elements 7a is sufficiently smaller than the size of integrator mirror 120 itself. In the present embodiment, each mirror element 7a is formed in a spherical shape. The mirror elements 7a are preferably arranged such that the convex surfaces 7 are continuously formed as shown in FIG. 5, which is a perspective view of the integrator mirror 120. If there are flat portions between convex portions, X-rays reflected by the flat portions could be condensed by the parabolic surface mirror 130 on the mask M, which is not preferable.

Returning to FIG. 39, the X-rays entering the integrator mirror 120 are reflected by a plurality of mirror elements 7a to form a plurality of secondary X-ray sources $LS_1$ to $LS_3$. It should be noted here that FIG. 39 shows only three secondary X-ray sources $LS_1$ to $LS_3$ out of numerous secondary light sources actually formed. Since each mirror element 7a is constructed with the convex surface thereof being on the X-ray incidence side, the collimated X-rays are reflected with a certain diverging angle according to the curvature of each mirror element 7a. Virtual images of the X-rays with the diverging angle become the secondary X-ray sources $LS_1$ to $LS_3$. Namely, a plurality of secondary X-ray sources $LS_1$ to $LS_3$ are formed on a plane parallel to the surface of integrator mirror 120 below the integrator mirror 120 (on the opposite side to the entrance side). Here, the number of secondary X-ray sources $LS_1$ to $LS_3$ corresponds to the number of mirror elements 7a in the integrator mirror 120.

The X-rays outgoing from the integrator mirror 120 reach the parabolic surface mirror 130 with the certain diverging angle. The parabolic surface mirror 130 is constructed such that multilayer films in combination of Mo (molybdenum)/Si (silicon) are formed on a paraboloid of revolution having the center of axis $Ax_{30}$ inclined with respect to the normal line to the mask M. The parabolic surface mirror 130 is so set that the focus of parabolic surface is located on the mask M and the front focus of the parabolic surface mirror 130 is located on the secondary X-ray sources $LS_1$ to $LS_3$.

The front focus of parabolic surface mirror 130 in the present embodiment means a point where a beam of parallel rays emitted from the focus of parabolic surface is focused via the parabolic surface mirror 130. In other words, the front focus of parabolic surface mirror is a Fourier transform plane for the focus of parabolic surface.

Accordingly, the diverging X-rays from the secondary X-ray source $LS_2$ become parallel rays via the parabolic surface mirror 130 and the parallel rays proceed along the normal line to the mask M. Also, the diverging X-rays from the secondary X-ray sources $LS_1$ and $LS_3$ become parallel rays via the parabolic surface mirror 130 and the parallel rays proceed at respective certain angles relative to the normal line to the mask M. Namely, the X-rays from the plurality of secondary X-ray sources $LS_1$ to $LS_3$ via the parabolic surface mirror 130 illuminate the mask M in a superimposed manner to form a lighting field LF. Since the rays emerging from the secondary X-ray source $LS_2$ are principal rays, telecentric illumination can be achieved on the mask M.

In the illumination optical apparatus in the present embodiment, an unrepresented supporting member supports the integrator mirror 120 and the parabolic surface mirror 130 in a united manner, and the supporting member is arranged as rotatable about a rotation axis $Ax_{20}$ passing through the integrator mirror 120 and being parallel to the principal rays from the parabolic surface mirror 130. The supporting member is driven by a motor 112 to rotate about the rotation axis $Ax_{20}$.

Figure 40:
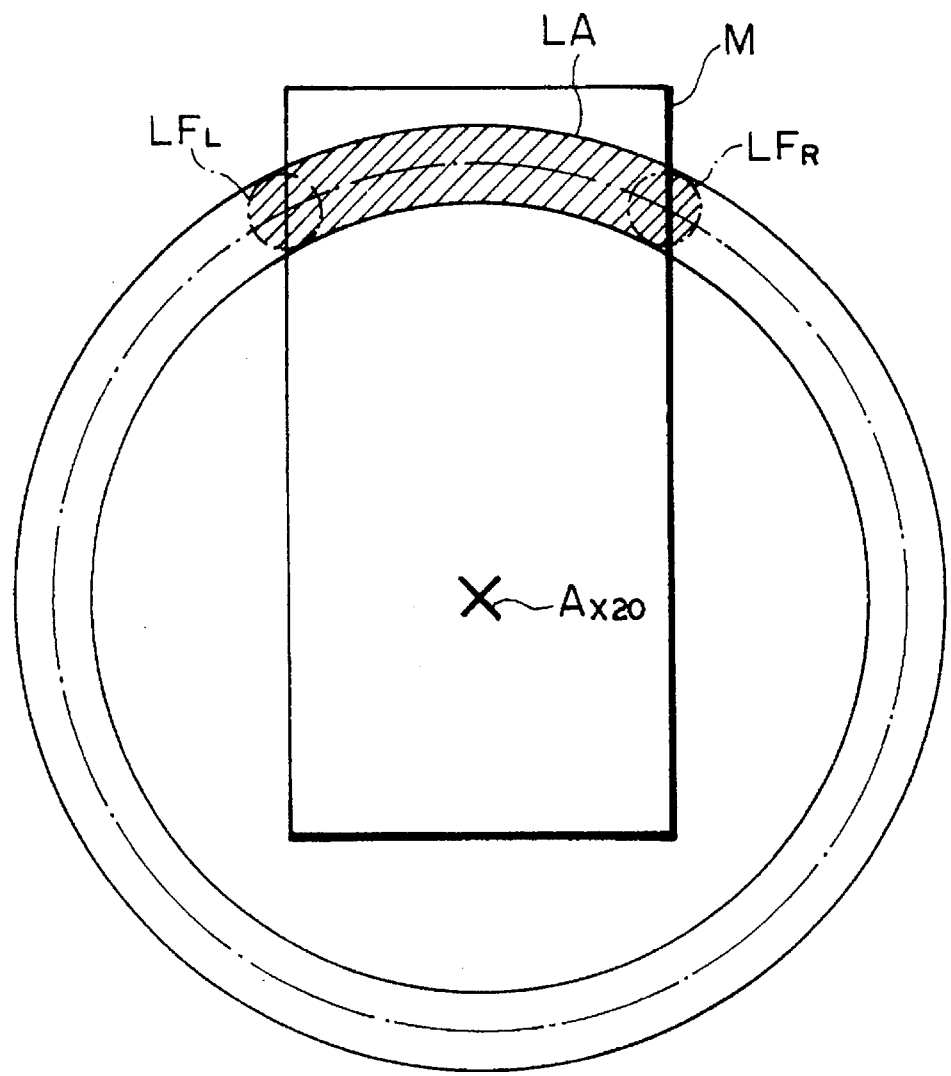
FIG. 40 is a plan view to show a positional relation between a mask and an illumination region.

FIG. 40 shows a positional relation between the illumination area and the mask. In case the focus of parabolic surface in the parabolic surface mirror 130 is at the left edge of mask M, the X-rays from the light source portion 110 via the integrator mirror 120 and the parabolic surface mirror 130 form a nearly circular light field $LF_L$ at the left edge of mask M. Also, in case the focus of parabolic surface in the parabolic surface mirror 130 is at the right edge of mask M, the X-rays from the light source portion 110 via the integrator mirror 120 and the parabolic surface mirror 130 form a nearly circular light field $LF_R$ at the right edge of mask M. An arc-shaped illumination area LA is formed around the rotation axis $Ax_{20}$ on the mask M by irradiating the X-rays onto the mask M while pivoting the integrator mirror 120 and the parabolic surface mirror 130 in a united manner.

An annular illumination area can be formed by fully rotating the integrating mirror 120 and the parabolic surface mirror 130 instead of pivoting the integrator mirror 120 and the parabolic surface mirror 130 in a certain range as described. If the integrator mirror 120 and the parabolic surface mirror 130 are located at respective positions where the X-rays are irradiated onto a portion different from a position on the mask M (i.e., onto a position different from the illumination area LA in FIG. 40), it is preferable that the X-rays from the light source portion 110 are arranged to be interrupted.

It is preferred that the rotation axis $Ax_{20}$ is arranged to pass through the position of barycenter in the effective reflection area in the integrator mirror 120. If the rotation axis $Ax_{20}$ is greatly offset from the barycenter position of effective reflection area in the integrator mirror 120, a loss occurs in reflecting the X-rays from the plane mirror 111, which is not preferable. The effective reflection area in the integrator mirror 120 means an area where the multilayer films 9 are provided.

Figure 41:
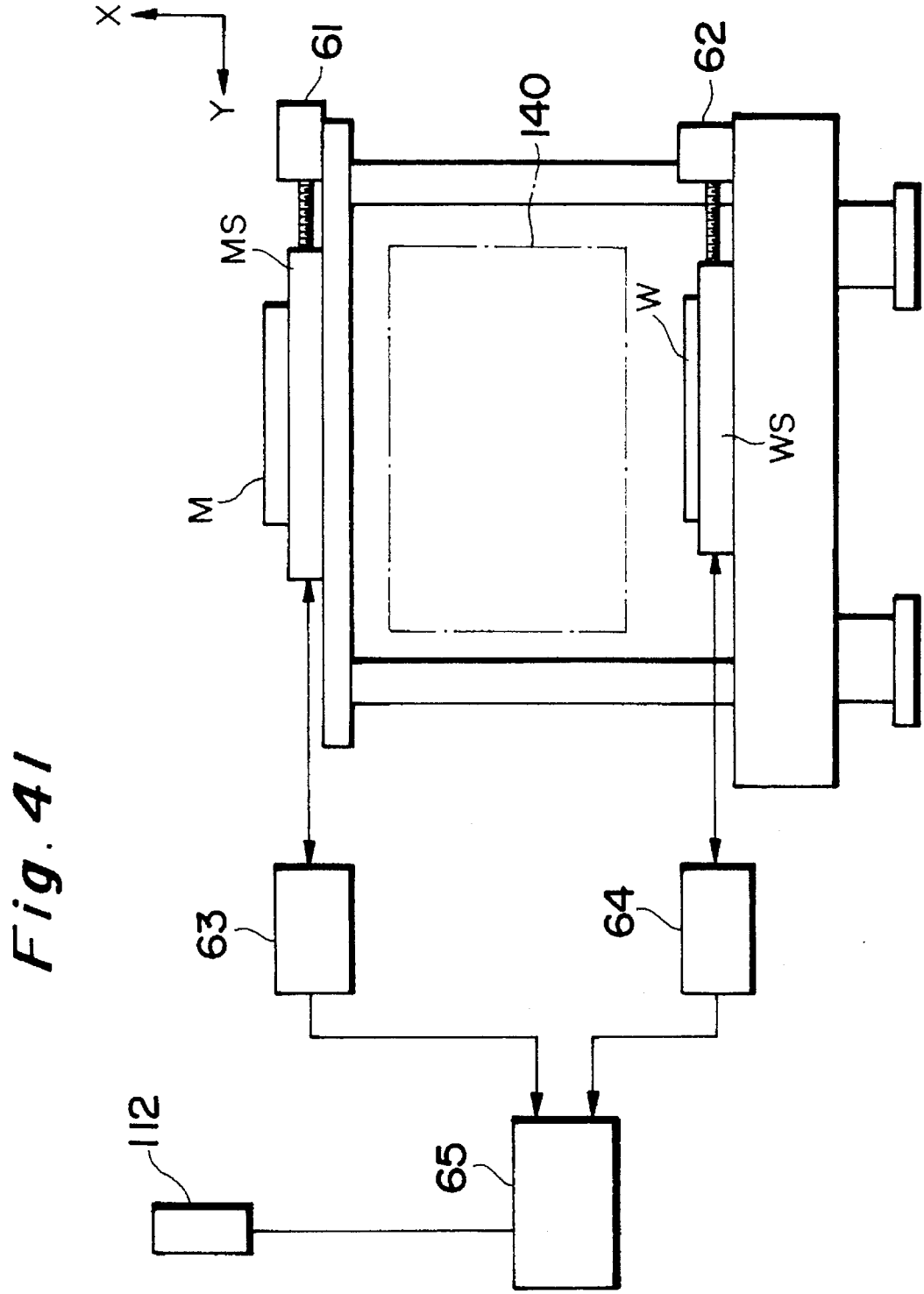
FIG. 41 is a structural drawing to schematically show the structure of a stepper.

Next described with FIG. 41 is the structure of the stepper for successively moving the mask stage MS and the wafer stage WS. The stepper has the general structure for example as disclosed in Japanese Laid-open Patent Application No. 61-251025. The mask stage MS is constructed as movable in the Y direction, in the Z direction (in the direction normal to the plane of FIG. 41) and in a direction oblique to the YZ plane while carrying the mask M thereon. Also, the wafer stage WS set below the mask stage MS is constructed as movable in the Y direction, in the Z direction and in a direction oblique to the YZ plane as described while carrying the wafer W thereon.

Figure 42C:
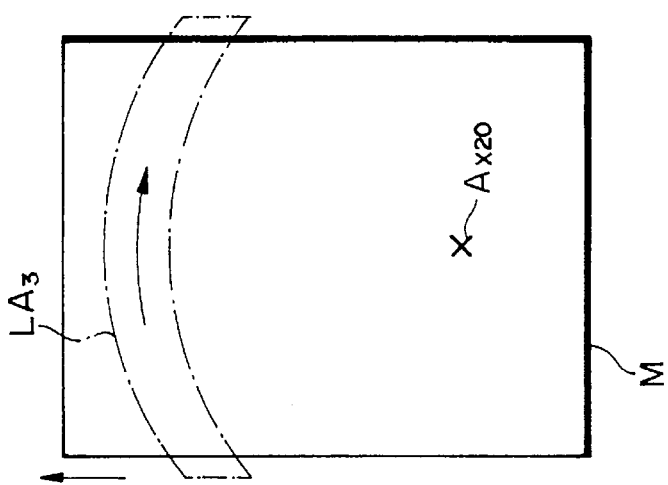
FIG. 42C is a plan view to show a positional relation between a mask and an illumination region.
Figure 42B:
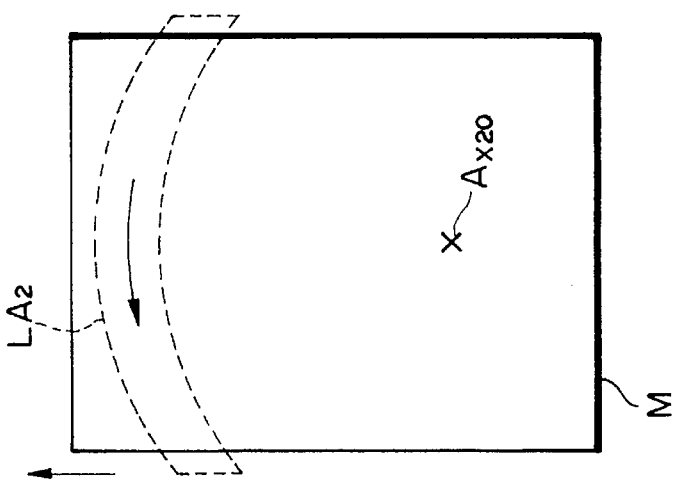
FIG. 42B is a plan view to show a positional relation between a mask and an illumination region.
Figure 42A:
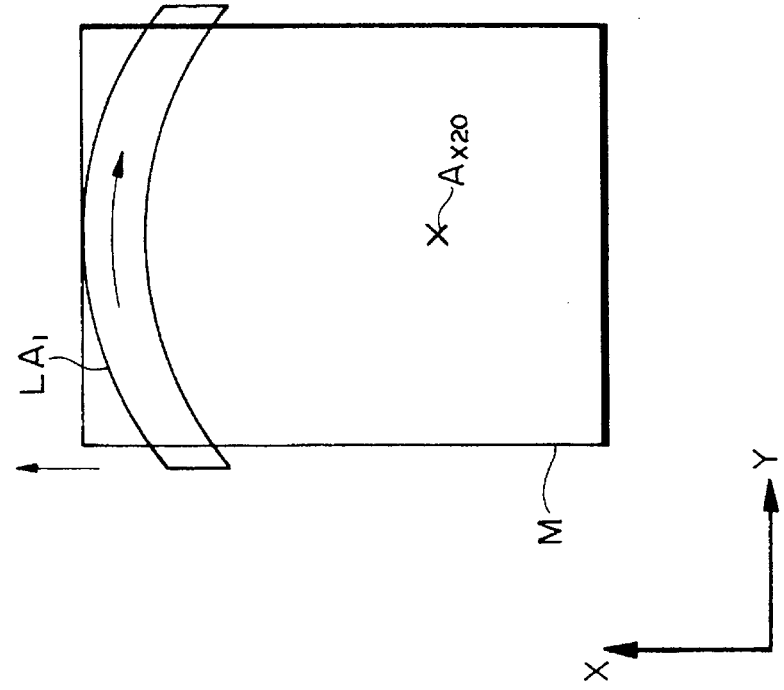
FIG. 42A is a plan view to show a positional relation between a mask and an illumination region.

The mask stage MS and the wafer stage WS are intermittently driven along the Y direction by pulse motors 61 and 62, respectively. The moving positions of the stages MS and WS are detected by laser interferometers 63 and 64, respectively. The detection results are supplied to a drive control unit 65. The drive control unit 65 performs a synchronous control of moving amounts of the mask stage MS and the wafer stage WS, based on the detection results. In more detail, the drive control unit 65 outputs pulse signals as control signals to the pulse motors 61, 62. The drive control unit 65 also controls the rotation of motor 112 for rotation-driving the rotation axis $Ax_{20}$. Accordingly, the X-rays can be irradiated over the entire surface of mask M by conveying the mask M in the X direction while rotating (pivoting) the integrator mirror 120 and the parabolic surface mirror 130 under the control of drive control unit 65. The exposure operation on the mask M is next described with reference to FIGS. 42A to 42C. FIGS. 42A to 42C are plan views to show the relation between the mask M and the illumination area. The following description concerns a case in which the integrator mirror 120 and the parabolic surface mirror 130 are reciprocated as pivoted about the rotation axis $Ax_{20}$.

In FIG. 42A, when the integrator mirror 120 and the parabolic surface mirror 130 are pivoted rightward (in the direction of arrow in the figure) about the rotation axis $Ax_{20}$, an arc-shaped illumination are $LA_1$ is formed on the mask M. On this occasion, the mask M is also moved along the X direction in the figure. It is preferable that the speed of pivotal movement for forming the illumination area $LA_1$ is sufficiently faster than the conveying speed of mask M. If a difference of speed is little between the conveying speed and the pivoting speed of mask M, dispersion of exposure could occur in the direction perpendicular to the conveying direction (in the direction of Y axis) on the mask M.

After the rightward pivoting operation of integrator mirror 120 and parabolic surface mirror 130 is completed (or when the right edge of illumination area $LA_1$ is formed), the integrator mirror 120 and the parabolic surface mirror 130 start pivoting leftward (in the direction of arrow in the figure) about the rotation axis $Ax_{20}$, as shown in FIG. 42B. The leftward pivotal operation forms an illumination area $LA_2$ on the mask M. Taking the reference on the mask M, the illumination area $LA_1$ and the illumination area $LA_2$ are formed as partly overlapping.

After the leftward pivoting operation of integrator mirror 120 and the parabolic surface mirror 130 is completed (when the left edge of illumination area $LA_2$ is formed), the integrator mirror 120 and the parabolic surface mirror 130 then start pivoting again rightward (in the direction of arrow in the figure) about the rotation axis $Ax_{20}$, as shown in FIG. 42C. This operation forms an illumination area $LA_3$ on the mask M. With reference on the mask M, the illumination area $LA_2$ and the illumination area $LA_3$ are formed as partly overlapping with each other.

As described above, the X-rays can be irradiated over the entire surface of mask M by scanning the lighting field LF in an arc shape while conveying the mask M. It is recommended that the pivoting (rotating) operation of integrator mirror 120 and the parabolic surface mirror 130 be started from the point where the mask M is located outside the illumination area LA.

There are shielding patterns formed on the mask M. X-rays through the mask M pass through the projection optical system 140 disposed below the mask M and then form an image of a pattern on mask M, on the wafer W the surface of which is coated with a resist. The projection optical system 140 is at a magnification ratio of 1:1 and bitelecentric. The projection optical system 140 is a so-called Offner optical system having the basic structure including a concave mirror 42 and a convex mirror 43 (see FIG. 38). Reflecting mirrors 41 and 44 are provided in an optical path between the mask M and the concave mirror 42 and in an optical path between the concave mirror 42 and the wafer W, respectively, to deflect the respective optical paths by about 90°. The concave mirror 42 and the convex mirror 43 are arranged such that their centers of curvature approximately coincide with each other. The radius of curvature of the convex mirror 43 is a half of the radius of curvature of the concave mirror 42. Multilayer films in combination of Mo (molybdenum)/Si (silicon) are formed on the surface of each of the concave mirror 42, convex mirror 43 and plane mirrors 41, 44 constituting the projection optical system 140.

In the present embodiment, images of the secondary X-ray sources $LS_1$ to $LS_3$ formed by the integrator mirror 120 are formed on the pupil plane of projection optical system 140. The images of the plural secondary X-ray sources $LS_1$ to $LS_3$ formed on the pupil plane of projection optical system 140 have the size approximately equal to the pupil of projection optical system 140. In other words, the numerical aperture on the mask M side by the integrator mirror 120 and the parabolic surface mirror 130 is almost equal to the numerical aperture of projection optical system 140 on the mask M side. This can permit an image of mask M to be formed on the wafer W under the resolving power of the diffraction limit of projection optical system 140. The numerical aperture of illumination apparatus can be made variable of course by changing the area of the effective reflection region in the integrator mirror 120.

The present embodiment employs the Offner optical system for forming a real size image of mask M, as the projection optical system 140, but a reduction projection optical system for forming a demagnified image of mask M can be employed instead thereof. For example, a Schwarzschild optical system may be applied as such a reduction projection optical system.

The wafer W is mounted on the wafer stage WS movable along the X axis in FIG. 38. Since the present embodiment employs the 1:1 projection optical system, the wafer stage WS is arranged to move at the same speed as that of mask stage MS. In case the projection optical system is a reduction projection optical system, a moving amount of wafer stage WS may be set a demagnification ratio smaller than that of mask stage MS.

When the mask M and the wafer W are moved while pivoting (rotating) the integrator mirror 120 and the parabolic surface mirror 130, an image of mask M is successively formed on the wafer W with the movement of mask M and wafer W. This can enlarge the illumination region in the direction perpendicular to the conveying direction (in the direction of Y axis) by rotation (pivotal movement) of the integrator mirror 120 and the parabolic surface mirror 130 even if the size of parabolic surface mirror 130 is small (even if the lighting field LF is small). Namely, the present embodiment permits a large illumination area (exposure area) to be obtained without increasing the size of parabolic surface mirror 130.

In the present embodiment, the integrator mirror 120 is inclined at the predetermined angle relative to the direction of incidence of X-rays. This can spatially separate the X-ray beams (incident beams) entering the integrator mirror 120 from the X-ray beams (outgoing beams) outgoing from the integrator mirror 120.

The incident angle of X-rays into the integrator mirror 120 (an angle which the X-rays entering the integrator mirror 120 make with the normal line to the integrator mirror 120) is preferably as small as possible. The incident angle must be determined as an angle by which the incident beams and the outgoing beams can at least be spatially separated from each other.

Especially, if the SOR radiation is used as the light source portion 110, the radiation is nearly linearly polarized. Then, with an increase in incident angle into the integrator mirror 120, the polarization state of X-rays incident into the integrator mirror 120 changes upon rotation of integrator mirror 120, which could unpreferably change the intensity of reflected X-rays.

Figure 43:
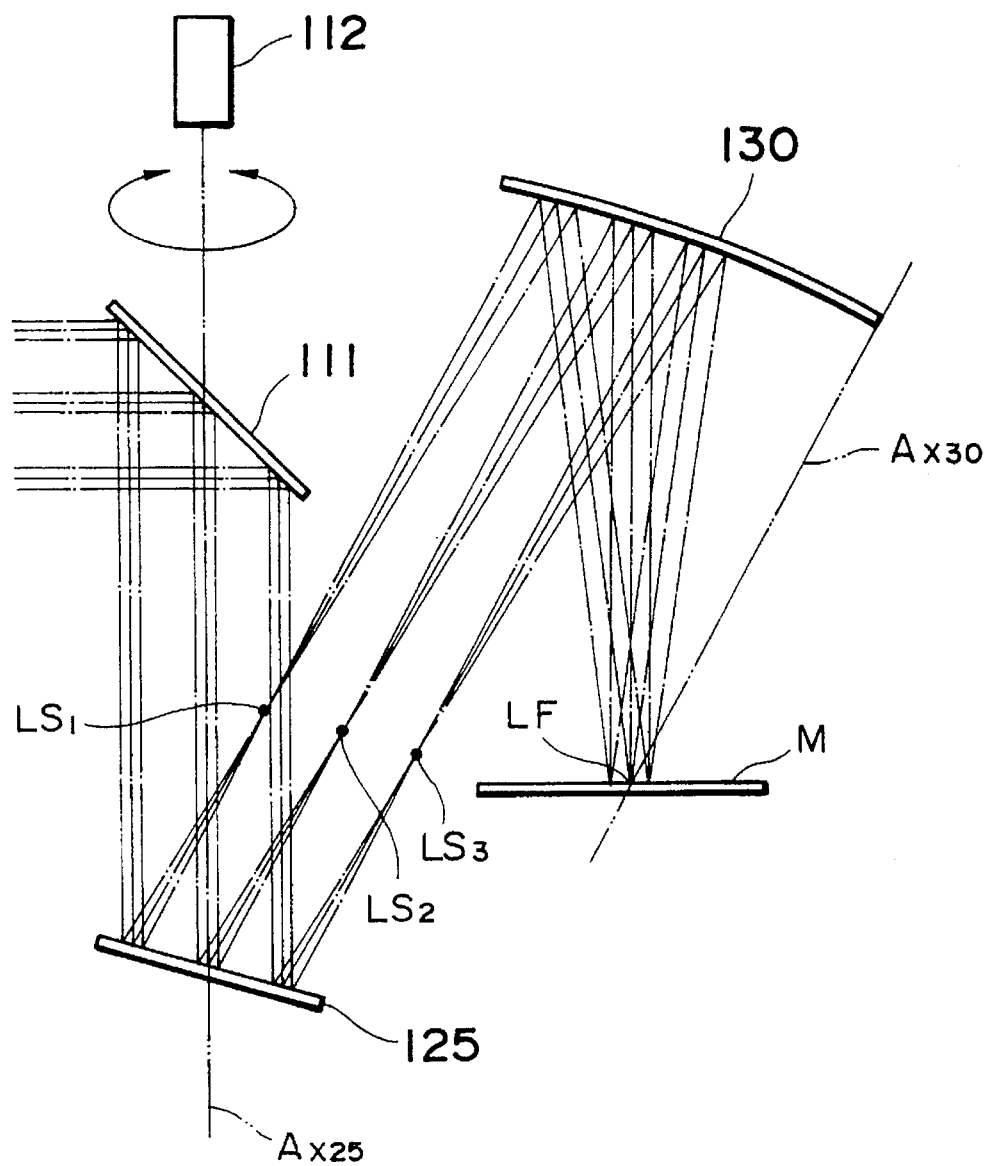
FIG. 43 is a drawing to show another embodiment of optical system arranged in an illumination optical apparatus.

Another embodiment is next described referring to FIG. 43. FIG. 43 is a drawing to show the main part of illumination apparatus. FIG. 43 employs the same coordinate system as in FIG. 39 and the same reference numerals for elements or members having the same functions as those in the embodiment shown in FIG. 39 for brevity of illustration.

The embodiment in FIG. 43 is different from the embodiment in FIG. 39 in that an integrator mirror 125 having concave portions on the surface thereof replaces the integrator mirror 120 having the convex portions on the surface thereof. The integrator mirror 125 is constructed such that a plurality of fine concave portions 8 are formed on a substrate 6 and multilayer films 9 for reflecting X-rays are formed over the concave portions 8, as shown in the cross section of FIG. 7. A portion of multilayer films 9 on each concave portion 8 will be called as a mirror element 8a. A sufficient condition is that the size of the mirror elements 8a is sufficiently smaller than the size of integrator mirror 125 itself. In the present embodiment, each mirror element 8a is formed in a spherical shape. It is preferable for the mirror elements 8a that the concave portions 8 are continuously formed similarly as in the previous embodiment.

Now returning to FIG. 43, X-rays of predetermined wavelength (for example 130 Å) from an unrepresented light source portion reach the plane mirror 111, which deflects the optical path thereof by about 90°, similarly as in the previous embodiment. The deflected X-rays then reach the integrator mirror 125 inclined relative to the deflected optical path. The X-rays entering the integrator mirror 125 are parallel. Accordingly, the parallel rays (X-rays) are condensed by a plurality of mirror elements 8a in the integrator mirror 125 to form a plurality of secondary X-ray sources $LS_1$ to $LS_3$ at a distant position on the other side of integrator mirror 125. It should be noted that FIG. 43 shows only three secondary X-ray sources $LS_1$ to $LS_3$ out of numerous secondary X-ray sources actually formed. Here, the plurality of secondary X-ray sources $LS_1$ to $LS_3$ are formed nearly in parallel with the surface of integrator mirror 125.

X-rays from the plurality of secondary X-ray sources $LS_1$ to $LS_3$ proceed toward the parabolic surface mirror 130 with a certain diverging angle according to the curvature of each mirror element 8a in the integrator mirror 125. The parabolic surface mirror 30 is constituted by a paraboloid of revolution about the axis $Ax_{30}$ inclined with respect to the normal line to the mask M. The focus of parabolic surface is arranged to be located on the mask M and the front focus of parabolic surface mirror 130 is located on the plurality of secondary X-ray sources $LS_1$ to $LS_3$. Thus, the diverging X-rays from the secondary X-ray source $LS_2$ pass via the parabolic surface mirror 130 to become a beam of parallel rays. Then the parallel beam proceeds along the normal line to the mask M. Namely, since the X-rays from the secondary X-ray source $LS_2$ are principal rays, telecentric illumination is achieved on the mask M. Also, the diverging X-rays from the secondary X-ray sources $LS_1$ and $LS_3$ become parallel via the parabolic surface mirror 130, and the parallel rays proceed at respective angles to the normal line to the mask M. In other words, the X-rays from the plurality of secondary X-ray sources $LS_1$ to $LS_3$ via the parabolic surface mirror 130 illuminate the mask M in a superimposed manner to form a lighting field LF.

In the present embodiment, the integrator mirror 125 and the parabolic surface mirror 130 are also arranged as rotatable about the rotation axis $Ax_{25}$. The rotation axis $Ax_{25}$ passes through the integrator mirror 125 and is parallel to the principal rays of X-rays from the parabolic surface mirror 130. From the same reason as in the previous embodiment, the rotation axis $Ax_{25}$ is preferably set to pass through the position of barycenter of the effective reflection region in the integrator mirror 125.

When the lighting field LF is formed on the mask M by the X-rays from the unrepresented light source portion while rotating the integrator mirror 125 and the parabolic surface mirror 130 about the rotation axis $Ax_{25}$, an arc-shaped illumination area is formed about the rotation axis $Ax_{25}$ on the mask M. Then, the X-rays can be irradiated over the entire surface of mask M by conveying the mask M along the X axis.

As described above, the present embodiment also permits enlargement of illumination area in the direction perpendicular to the conveying direction of mask M (in the direction of Y axis) by rotating (pivoting) the integrator mirror 125 and the parabolic surface mirror 130. This permits a wide illumination area to be obtained without increasing the size of parabolic surface mirror 130. An exposure apparatus which can achieve a resolving power of the diffraction limit over a wide exposure area can be provided by combining the illumination optical apparatus in the present embodiment with the projection optical system in FIG. 41.

From the above embodiments, it is seen that the integrator mirror for forming a plurality of secondary X-ray sources may have the surface constructed of either convex surfaces or concave surfaces.

Also, the above embodiments employed the transmitting mask with an illuminated surface transmitting X-rays, but a reflecting mask with an illuminated surface reflecting X-rays may also be employed. In case of the reflecting mask being employed, the mask is arranged as inclined such that a certain angle is made between the normal line to the reflecting mask and the principal rays of X-rays from the parabolic surface mirror. This arrangement can spatially separate the X-rays irradiated from the illumination apparatus onto the mask, from the X-rays reflected by the mask and then proceeding toward the projection optical system, and can avoid mechanical interference between the illumination apparatus and the projection optical system. The conveying direction of mask is a direction along and in the mask surface, which is perpendicular to a chord to the arc-shaped illumination area formed on the mask.

Figure 44:
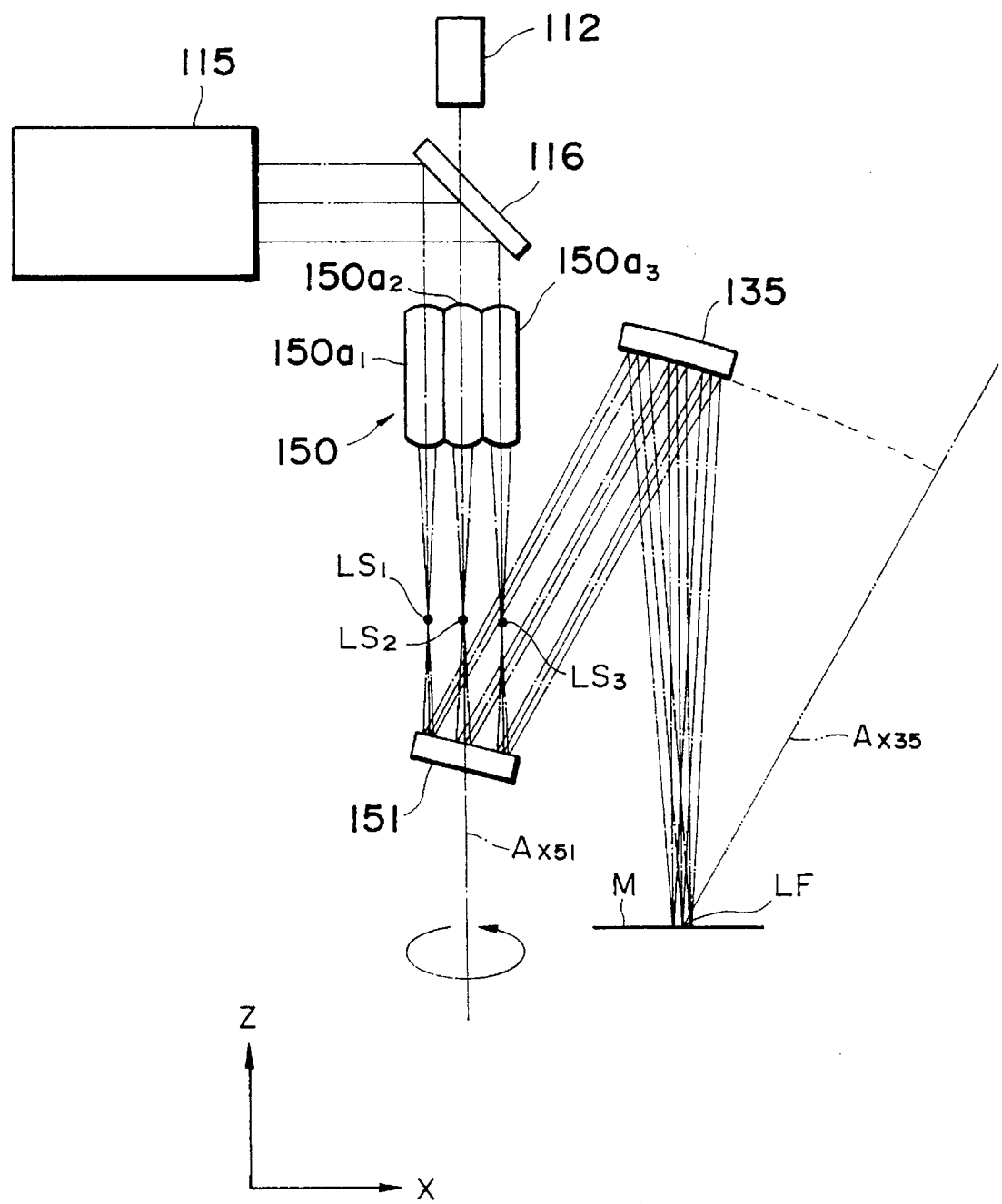
FIG. 44 is a structural drawing to schematically show another embodiment of illumination optical apparatus.

Although the previous embodiments used X-rays of predetermined wavelength as electromagnetic waves, the present invention is not limited to them. Next described is an embodiment using ultraviolet light as electromagnetic waves, referring to FIG. 44. FIG. 44 employs the same coordinate system as in FIGS. 38, 39 and 43 and the same reference numerals for elements or members having the same functions as those in FIG. 38 and FIG. 39 for brevity of illustration.

In FIG. 44, a light source portion 115 is composed of a laser beam source for supplying an excimer laser beam for example of ArF (193 nm), KrF (249 nm), etc. and a beam expander for expanding the beam size of excimer laser beam. Alternatively, the light source portion may be constructed of a light source such as a mercury lamp, an elliptic mirror with first focus located at the position of light source, and a collimator lens for collecting light from the light source via the elliptic mirror and converting it into a beam of parallel rays.

The illumination light from the light source portion 115 reaches a plane mirror 116 inclined at 45° relative to the optical path of illumination light. The optical path is deflected about 90° by the plane mirror 116 and the thus deflected light enters a fly's eye lens 150. The fly's eye lens 150 has a plurality of lens elements $150a_1$ to $150a_3$ and forms a plurality of secondary light source images $LS_1$ to $LS_3$ on the exit side of fly's eye lens 150, based on the parallel rays from the light source portion 115 via the plane mirror 116. FIG. 44 shows only three lens elements $150a_1$ to $150a_3$ out of numerous lens elements actually provided and only three secondary light source images $LS_1$ to $LS_3$ out of numerous secondary light source images actually formed. The number of secondary light source images $LS_1$ to $LS_3$ corresponds to the number of plural lens elements $150a_1$ to $150a_3$. A satisfactory condition is that the size of each element is sufficiently smaller than the size of fly's eye lens 150. The plurality of secondary light source images are formed at a distant position from the exit plane of fly's eye lens 150 in the present embodiment, but the plurality of secondary light source images may be formed on the exit plane of fly's eye lens 150 if the light source portion 115 supplies illumination light with low intensity.

Then, the illumination light from the plurality of secondary light source images $LS_1$ to $LS_3$ proceeds to a deflecting mirror 151 in the form of rays with predetermined diverging angle according to the focal length of each lens element $150a_1$ to $150a_3$. The deflecting mirror 151 is inclined at a certain angle relative to the optical path of the illumination light. The deflecting mirror 151 reflects the rays of illumination light toward a parabolic surface mirror 135. The deflecting mirror 151 is inclined at such an angle that the incident rays into the deflecting mirror 151 can be spatially separated from the outgoing rays from the deflecting mirror 151.

The parabolic surface mirror 135 is constructed by a paraboloid of revolution about the axis $Ax_{35}$ inclined with respect to the normal line to the mask M. The parabolic surface mirror 135 is so arranged that the focus of parabolic surface is located on the mask M and that the front focus of parabolic surface mirror 135 is located on the plurality of secondary light source images $LS_1$ to $LS_3$. This arrangement causes a diverging beam from the secondary light source image $LS_2$ to become a beam of parallel rays via the parabolic surface mirror 135 and to proceed along the normal line to the mask M. Namely, since the rays from the secondary light source image $LS_2$ are principal rays, telecentric illumination is achieved on the mask M. Also, diverging beams from the secondary light source images $LS_1$ and $LS_3$ become parallel beams via the parabolic surface mirror 135 and the parallel beams proceed at respective angles to the normal line to the mask M. In other words, the illumination light from the plurality of secondary light source images $LS_1$ to $LS_3$ via the parabolic surface mirror 135 illuminates the mask M in a superimposed manner to form a lighting field LF.

In the present embodiment, a reflection enhancing film is formed on the surface of each of the plane mirror 116, deflecting mirror 151 and parabolic surface mirror 135.

Also in the present embodiment, the deflecting mirror 151 and the parabolic surface mirror 135 are arranged as rotatable about the rotation axis $Ax_{51}$. The rotation axis $Ax_{51}$ passes through the reflecting mirror 151 and is parallel to the principal rays of illumination light from the parabolic surface mirror 135. It is also preferable in the present embodiment that the rotation axis $Ax_{51}$ passes through the position of barycenter of the effective reflection region in the deflecting mirror 151.

When the lighting field LF is formed on the mask M by the illumination light from the light source portion 115 while rotating the deflecting mirror 151 and the parabolic surface mirror 135 about the rotation axis $Ax_{51}$, an arc-shaped illumination area is formed about the rotation axis $Ax_{51}$ on the mask M. The illumination light can be irradiated over the entire surface of mask M by conveying the mask M along the X axis. In the present embodiment, it is conceivable that the fly's eye lens 150, the deflecting mirror 151 and the parabolic surface mirror 135 are arranged to be rotated (pivoted) in a united manner.

As described above, the present embodiment also permits enlargement of illumination area in the direction perpendicular to the conveying direction of mask M (in the direction of Y axis) by rotating (pivoting) the deflecting mirror 151 and the parabolic surface mirror 135. This permits a wide illumination area to be obtained without increasing the size of parabolic surface mirror 135.

Although the present embodiment was described as the illumination apparatus for illuminating the mask M, an exposure apparatus which can achieve the resolving power of diffraction limit over a wide exposure area can be provided by adding a mask stage for carrying the mask M, a projection optical system for forming an image of mask M on a wafer, and a wafer stage for moving the wafer in synchronism with the mask.

Figure 45:
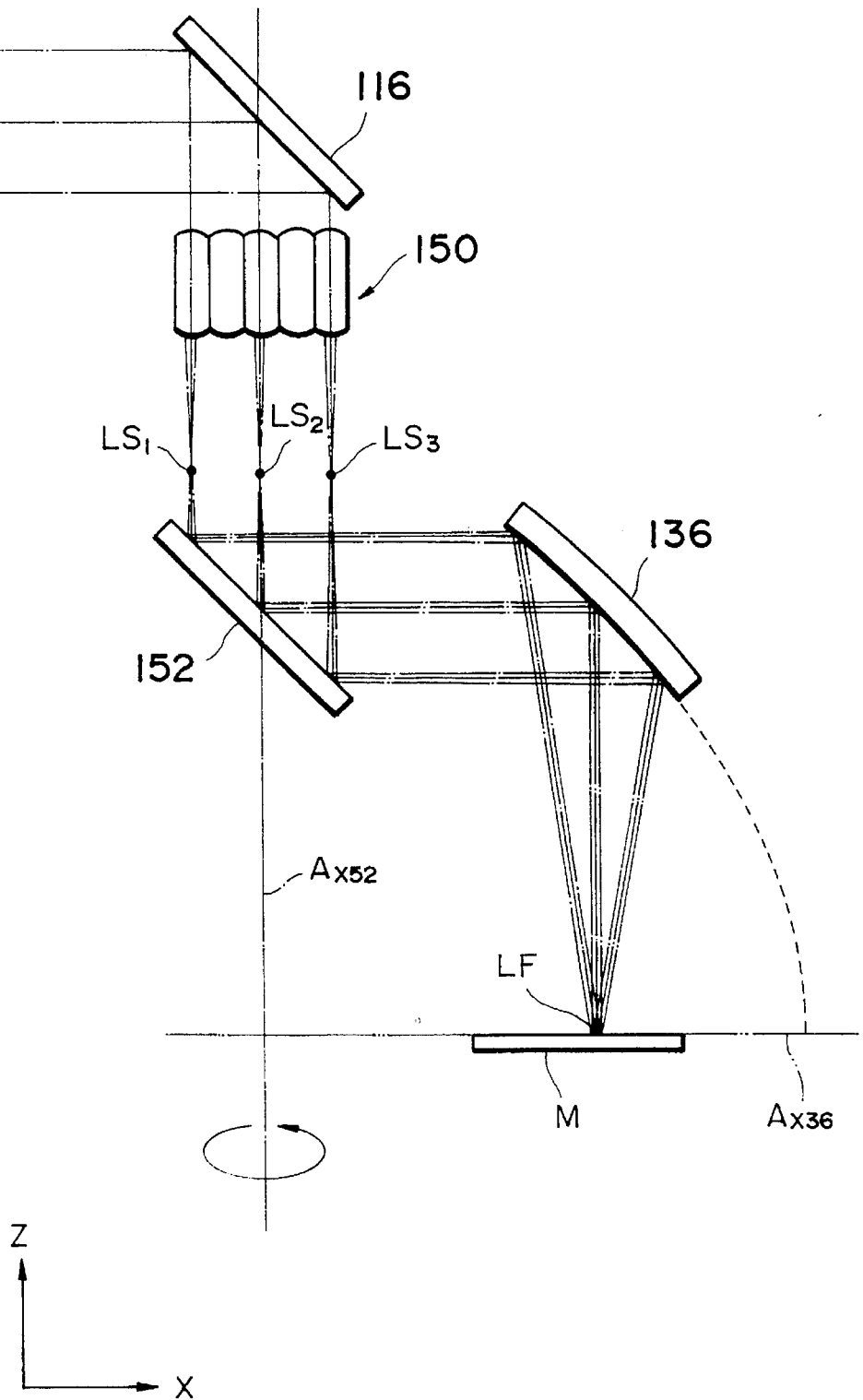
FIG. 45 is a drawing to show another embodiment of illumination optical system set in the illumination optical apparatus of FIG. 44.

Another embodiment is next described referring to FIG. 45. FIG. 45 is a drawing to show the structure of the another embodiment and employs the same coordinate system as in FIG. 44. Members or elements having the same functions as those in the previous embodiment shown in FIG. 44 are denoted by the same reference numerals for brevity of illustration.

In FIG. 45, illumination light from an unrepresented light source portion is reflected by a plane mirror 116 inclined at 45° with respect to the optical path of illumination light, so that the optical path of illumination light may be deflected about 90° to enter a fly's eye lens 150. The fly's eye lens 150 forms a plurality of secondary light source images $LS_1$ to $LS_3$ at a position distant from the exit plane thereof. The illumination light from the plurality of secondary light source images $LS_1$ to $LS_3$ becomes diverging beams with a predetermined diverging angle and the optical paths thereof are deflected about 90° by a deflecting mirror 152 inclined at 45° relative to the optical path of illumination light. The deflected beams then reach a parabolic surface mirror 136. If the illumination light supplied from the unrepresented light source portion has no polarization, the illumination light entering the deflecting mirror 152 can be set to a large incident angle of about 45° as in the present embodiment.

The parabolic surface mirror 136 is constructed by a paraboloid of revolution about the axis $Ax_{36}$ in the plane of mask M. The parabolic surface mirror 136 is so arranged that the focus of parabolic surface is located on the mask M and that the front focus of parabolic surface mirror 136 is located on the plurality of secondary light source images $LS_1$ to $LS_3$. This causes a diverging beam from the secondary light source image $LS_2$ to become a beam of parallel rays via the parabolic surface mirror 136 and then to proceed along the normal line to the mask M. Namely, since the rays from the secondary light source image $LS_2$ are principal rays, telecentric illumination is achieved on the mask M. Also, diverging beams from the secondary light source images $LS_1$ and $LS_3$ become parallel beams via the parabolic surface mirror 136 and the parallel beams proceed at respective certain angles to the normal line to the mask M. In other words, the illumination light from the plurality of secondary light source images $LS_1$ to $LS_3$ via the parabolic surface mirror 136 illuminates the mask M in a superimposed manner to form a lighting field LF.

Also in the present embodiment, a reflection enhancing film is formed on the surface of each of the plane mirror 116, deflecting mirror 151 and parabolic surface mirror 136 similarly as in the previous embodiment in FIG. 44.

In the present embodiment, the deflecting mirror 152 and the parabolic surface mirror 136 are supported in a united manner by an unrepresented supporting member, which is arranged as rotatable (pivotable) about the rotation axis $Ax_{52}$. Here, the rotation axis $Ax_{52}$ passes through the deflecting mirror 152 and is parallel to the principal rays of illumination light from the parabolic surface mirror 136. It is preferable that the rotation axis $Ax_{52}$ is arranged to pass through the position of barycenter of the effective reflection region in the deflecting mirror 152.

When the lighting field LF is formed on the mask M by the illumination light from the unrepresented light source portion while rotating (pivoting) the deflecting mirror 152 and the parabolic surface mirror 136 about the rotation axis $Ax_{52}$, an arc-shaped illumination area is formed about the rotation axis $Ax_{52}$ on the mask M. The illumination light can be irradiated over the entire surface of mask M by conveying the mask M along the X-axis. The present embodiment may be modified such that the fly's eye lens 150 is also supported by the supporting member supporting the deflecting mirror 152 and the parabolic surface mirror 136 and that the fly's eye lens 150, the deflecting mirror 152 and the parabolic surface mirror 136 are rotated (or pivoted) in a united manner upon illumination.

As described above, the present embodiment also permits enlargement of illumination area in the direction perpendicular to the conveying direction of mask M (in the direction of Y axis) by rotating (pivoting) the deflecting mirror 152 and the parabolic surface mirror 136. This can permit a wide illumination area to be obtained without increasing the size of parabolic surface mirror 136.

In the above-described embodiments, a blind may be placed as a field stop near the mask to define the illumination area. Also, a relay system may be provided on the mask side of parabolic surface mirror. In this case, a field stop may be set on a plane conjugate with the mask.

Also, each of the embodiments as described above is so arranged that after the electromagnetic waves (X-rays or illumination light) from the light source portion is deflected by 90°, the waves are guided to enter the integrator mirror or the fly's eye lens, but such an alternative arrangement may be employed that the electromagnetic waves from the light source portion are guided along the rotation axis directly into the integrator mirror or the fly's eye lens.

As described, the present invention is not limited to the embodiments as described above and may include various arrangements within the essence of the invention.

As described above, the present invention can provide illumination apparatus and exposure apparatus which can achieve a wide exposure area without increasing the size of condenser optical system.

Embodiment IV

Figure 46:
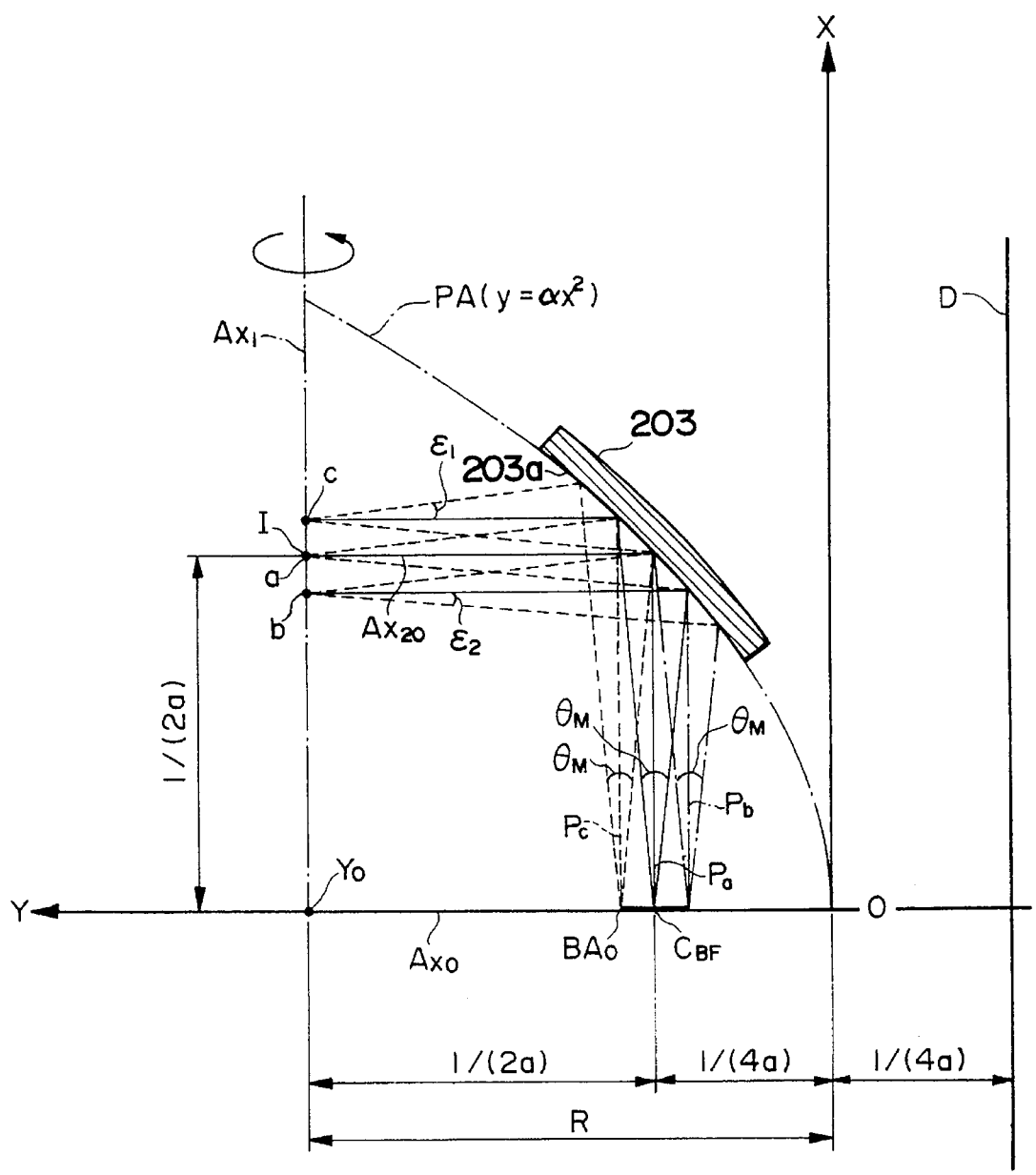
FIG. 46 is a cross section in the meridional direction, of an optical reflector.
Figure 47:
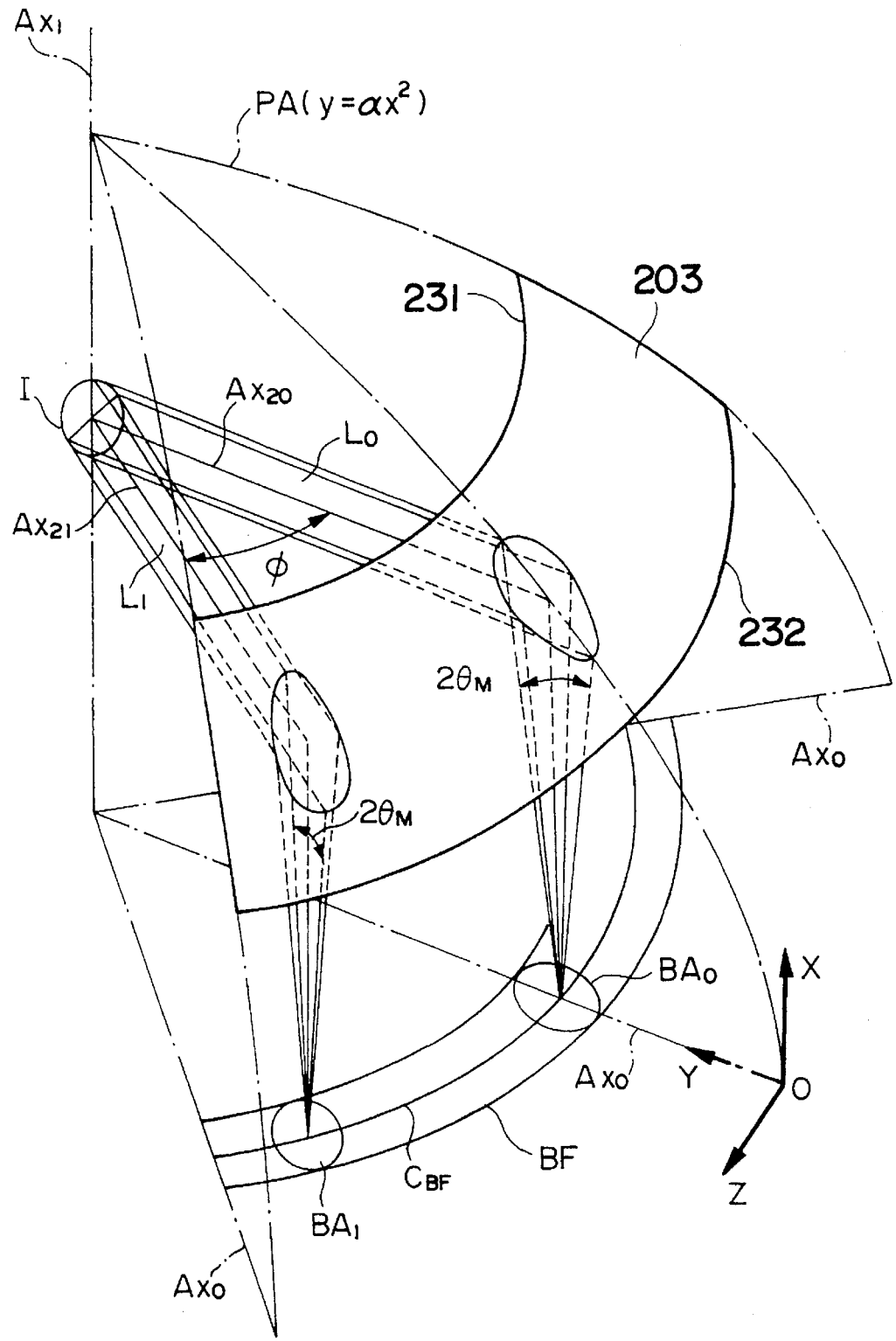
FIG. 47 is a perspective view of the optical reflector.

An embodiment of an optical apparatus is next described. FIG. 46 and FIG. 47 show an optical reflector 203 constituting a part of the illumination optical apparatus. FIG. 46 is a cross sectional view of the optical reflector 203 in the meridional direction, and FIG. 47 is a perspective view of the optical reflector 203.

In FIG. 46, the origin is at the vertex O of an arbitrary parabola PA, the Y axis on the symmetry axis $Ax_0$ of the parabola PA passing the vertex O, and the X axis on the axis passing the vertex O and being perpendicular to the symmetry axis $Ax_0$ (as will be denoted by Y).

As shown in FIG. 46, the cross section of the optical reflector 203 in the meridional direction constitutes a part of the parabola PA. Letting D be the directrix of the parabola PA, a reflective surface 203a of the optical reflector 203 is formed in the shape of a curved surface forming a part of parabolic toric surface obtained by rotating the parabola PA about a reference axis $Ax_1$ being parallel to the directrix D and passing a point $Y_0$ on the symmetry axis Y on the opposite side to the directrix D of the parabola PA with respect to the focus position of the parabola PA. Namely, the optical reflector 203 has the shape of belt-like arc between two latitudes 231 and 232 on the parabolic toric surface, as shown in FIG. 47.

Returning to FIG. 46, the function of optical reflector 203 is now described as to beams in the meridional direction. Meridional beams mean beams in a plane including the reference axis $Ax_1$ of the optical reflector 203 while sagittal beams mean beams in a plane perpendicular to the meridional plane.

When a light source image I of predetermined size (or light source with predetermined size) is formed at a certain position on the reference axis $Ax_1$ by an unrepresented optical system, emergent beams from an arbitrary point on the light source image I (or light source) are reflected by the optical reflector 203 and the reflected beams are converted into parallel beams by the converging function thereof.

For example, beams from the center "a" of the light source image I (or light source) are converted into parallel beams by the optical reflector 203 to illuminate an area $BA_0$ on the illuminated surface normally thereto, and beams from the lower edge b of the light source image I (or light source) are converted into parallel beams by the optical reflector 203 to illuminate the area $BA_0$ on the illuminated surface obliquely from right upper. Also, beams from the upper edge c of the light source image I (or light source) are converted into parallel beams by the optical reflector 203 to illuminate the area $BA_0$ on the illuminated surface obliquely from left upper.

As described, beams from each position of light source image I (or light source) are converted into parallel beams by the optical reflector 203 to uniformly illuminate the area $BA_0$ on the illuminated surface in a superposed manner.

Observing the numerical aperture in the meridional direction by the optical reflector 203 in this arrangement, parallel beams (beams shown by solid lines) from light source image I (or light source) parallel to the optical axis $Ax_{20}$ are converged at the center of the area $BA_0$ on the illuminated surface under a numerical aperture $NA_M$ ($=\sin\theta_M$) by the optical reflector 203. Also, parallel beams (beams shown by dotted lines) outgoing from the light source image I (or light source) at an angle of divergence $\epsilon_1$ to the optical axis $Ax_{20}$ are converged at the left edge of the area $BA_0$ on the illuminated surface under the numerical aperture $NA_M$ by the optical reflector 203. Further, parallel beams (beams shown by dotted lines) outgoing from the light source image I (or light source) at an angle of divergence $\epsilon_2$ ($=\epsilon_1$) equal in amplitude to the angle of divergence $\epsilon_1$ but different in divergent direction from the angle of divergence $\epsilon_1$ are converged at the right edge of the area $BA_0$ on the illuminated surface under the numerical aperture $NA_M$ by the optical reflector 203. The optical axis $Ax_{20}$ is bent at 90 degrees by the optical reflector 203.

Accordingly, parallel beams having an arbitrary angle of divergence in the range of from $\epsilon_1$ to $\epsilon_2$ from the light source image I (or light source) are converged under the constant numerical aperture $NA_M$ at any position in the meridional direction on the area $BA_0$ of the illuminated surface. In addition, it is seen that principal beams ($P_a$, $P_b$, $P_c$) of the parallel beams from the light source image I (or light source) are always parallel to the optical axis $Ax_{20}$, maintaining the telecentricity.

Next described referring to FIG. 47 is the function of the optical reflector 203 in the sagittal direction. Parallel beams $L_0$ from the light source image I (or light source) formed on the reference axis $Ax_1$ are converged on the area $BA_0$ of the illuminated surface by the optical reflector 203, and parallel beams $L_1$ from the light source image I (or light source) outgoing at an angle of divergence inclined at angle $\psi$ to the parallel beams $L_0$ are converged on an area $BA_1$ of the illuminated surface by the optical reflector 203.

Here, let us look at beams in the meridional direction among the beams from the light source image I forming the area $BA_1$ on the illuminated surface. Then, similarly as in FIG. 46, parallel beams having an arbitrary angle of divergence from the light source image I (or light source) are converged under a constant numerical aperture $\theta_M$ at any position in the meridional direction on the area $BA_1$ of the illuminated surface, and in addition the principal beams in the parallel beams from the light source image I (or light source) are always parallel to the optical axis $Ax_{20}$, maintaining the telecentricity.

Accordingly, when parallel beams from the light source image I (or light source) formed on the reference axis $Ax_1$ are radially outgoing as spread in the arc direction of optical reflector 203 (in the direction along the latitudes 231, 232 of the parabolic toric surface), an arcuate illumination region BF is formed while maintaining the telecentricity.

The arcuate illumination region BF corresponds to the illuminated surface, and the light source image or light source is present at infinity to the illuminated surface. The stepper as shown in FIG. 41 is set below the illuminated surface. The stepper is provided with a projection optical system that is telecentric on the entrance side. The light source image is formed at the position of entrance pupil of the projection optical system or at infinity. It is therefore understood that the illuminated surface can be illuminated under so-called Köhler illumination.

Next studied referring to FIGS. 48A to 48F are the analysis of the above description using equations, a suitable shape of the optical reflector, a suitable position of the light source image I (or light source), and a suitable position of the illumination region BF.

Figure 48A:
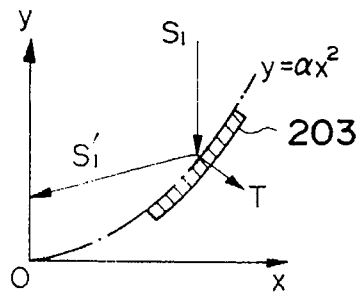
FIGS. 48A–48F are drawings to illustrate an optimum shape of the optical reflector.

As shown in FIG. 48A, let us assume that the reflective surface of the optical reflector 203 has a surface which can be expressed in the meridional direction by a quadratic function with the origin of XY coordinate system at the vertex O of a parabola PA, that is, by $y=\alpha x^2$ (where $\alpha$ is a constant). First studied are rays parallel to the Y axis in the meridional direction.

I) Rays parallel to the Y axis in the meridional direction

A normal vector T can be expressed by Equation (21) at an arbitrary point on a parabola PA ($y=\alpha x^2$).

$$T = \left( \frac{2\alpha x}{(4\alpha^2 x^2 + 1)^{0.5}}, \frac{-1}{(4\alpha^2 x^2 + 1)^{0.5}} \right) \quad (21)$$

Let a unit vector $S_1$ parallel to the Y axis in the plane of FIG. 48A be $S_1=(0, 1)$, an intersection between the unit vector $S_1$ and the parabola PA ($y=\alpha x^2$) be $(u, \alpha u^2)$, and a unit vector $S_1'$ of a beam reflected by the parabola PA be $S_1'=(S_{X1}, S_{Y1})$. Then following Equation (22) holds.

$$S_1' = S_1 - 2T(T \cdot S_1) \quad (22)$$

Thus, the unit vector $S_1'$ after reflection is obtained as in Equation (23) from Equations (21) and (22).

$$S_1' = (S_{X1}, S_{Y1}) = \left( \frac{-4\alpha u}{(4\alpha^2 u^2 + 1)}, \frac{2}{(4\alpha^2 u^2 + 1)} - 1 \right) \quad (23)$$

A straight line being parallel to the unit vector $S_1'$ after reflection and passing through the point $(u, \alpha u^2)$ on the parabola PA is expressed by following Equations (24) and (25).

$$x = S_{X1} t + u \quad (24)$$

$$y = S_{Y1} t + \alpha u^2 \quad (25)$$

In the equations t is a variable.

As shown in FIG. 48A, a ray reflected at the point $(u, \alpha u^2)$ on the parabola PA intersects with the y axis at $x=0$. The intersecting position is obtained as follows.

From Equation (24), $x = S_{X1} t + u = 0$. Then $t = -u/S_{X1}$. Substituting this value into t in above Equation (25) and using the relation of Equation (23), following Equation (26) is obtained after arranged.

$$y = S_{Y1} \left[ -\frac{u}{S_{X1}} \right] + \alpha u^2 = \frac{1}{4\alpha} \quad (26)$$

Therefore, it is seen from Equation (26) that any ray in the meridional plane parallel to the unit vector $S_1$, that is, parallel to the Y axis is converged irrespective of the value of u at the point $(0, (4\alpha)^{-1})$ on the Y axis, which is the focus position of the parabola, and that the position of convergence is the illuminated surface.

As shown in FIG. 46, the ray traveling on the optical axis $Ax_{20}$ is reflected at the point $((2\alpha)^{-1}, (4\alpha)^{-1})$ on the parabola PA and turns by 90 degrees. The distance $(2\alpha)^{-1}$ from the reflection point to the illuminated surface is the focal length of the optical reflector 203.

II) Rays parallel to the X axis in the meridional direction

Figure 48B:
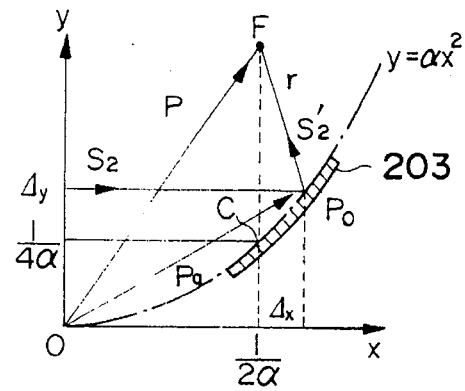

Next described referring to FIG. 48B are rays parallel to the X axis in the meridional direction.

When a ray emergent from the point $(0, (4\alpha)^{-1})$ on the Y axis is reflected at the point c $((2\alpha)^{-1}, (4\alpha)^{-1})$ on the parabola PA, the emergent ray becomes parallel to the Y axis, as described above. Then, let us obtain a position F where a ray reflected at a position $p_0$ $((2\alpha)^{-1}+\Delta x, (4\alpha)^{-1}+$ $\Delta y$) apart by $\Delta x$ and $\Delta y$ on the parabola PA from the point c intersects with a straight line $x=(2\alpha)^{-1}$ becoming the optical axis $Ax_{20}$ shown in FIG. 46.

Let a unit vector $S_2$ parallel to the X axis in the plane of FIG. 48B be $S_2=(1, 0)$ and a unit vector $S_2'$ after reflected by the parabola PA be $S_2'=(S_{X2}, S_{Y2})$. Then following Equation (27) holds.

$$S_2' = S_2 - 2T(T \cdot S_2) \qquad (27)$$

Thus, the unit vector $S_2'$ after reflection is given by Equation (28) from Equations (21) and (27).

$$S_2' = (S_{X2}, S_{Y2}) = \left(1 - \frac{8\alpha^2 u^2}{(4\alpha^2 u^2 + 1)}, \frac{4\alpha u}{(4\alpha^2 u^2 + 1)}\right) \qquad (28)$$

Further, let a position vector $P_0$ be a vector between the origin O (0, 0) and the point $p_0$ $((2\alpha)^{-1}+\Delta x, (4\alpha)^{-1}+\Delta y)$, P be a vector between the origin O (0, 0) and the position F, and r be a distance between the point $p_0$ and the position F. Then the following relation of Equation (29) stands.

$$P = P_0 + r S_2' \qquad (29)$$

Defining the vector P as $P=(P_X, P_Y)$ where $P_X=(2\alpha)^{-1}$, Equation (30) is obtained.

$$P_X = \frac{1}{2\alpha} + \Delta x + r\left[1 - \frac{8\alpha^2(1/2\alpha + \Delta x)^2}{4\alpha^2(1/2\alpha + \Delta x)^2 + 1}\right] = \frac{1}{2\alpha} \qquad (30)$$

Reforming Equation (30), following Equation (31) is obtained.

$$r = \Delta x \frac{2\alpha^2 \Delta x^2 + 2\alpha \Delta x + 1}{2\alpha^2 \Delta x^2 + 2\alpha \Delta x} = \frac{2\alpha^2 \Delta x^2 + 2\alpha \Delta x + 1}{2\alpha^2 \Delta x + 2\alpha} \qquad (31)$$

If $\Delta x$ unlimitedly approaches zero, the limit of Equation (31) is expressed by following Equation (32).

$$\lim_{\Delta x \to 0} r = \frac{1}{2\alpha} \qquad (32)$$

As apparent from Equation (32), rays parallel to the unit vector $S_2$, that is, rays parallel to the X axis are converged at a focal position of the position F $((2\alpha)^{-1}, (4\alpha)^{-1}+(2\alpha)^{-1})$ by the parabola PA. It is seen that this relation holds in the paraxial region. It is thus understood that if a light source or light source image is formed at the position F then beams diverging from this position F can be converted into parallel beams by the reflective surface of the optical reflector 203 to illuminate the point $(0, (4\alpha)^{-1})$ on the illuminated surface and a region on the Y axis near the point. In addition, the rays diverging from the center $(0, (4\alpha)^{-1})$ of the light source or light source image are always parallel to the X axis after reflected by the optical reflector 203. In other words, the exit pupil of the optical reflector 203 appears at infinity when the optical reflector 203 is seen from the illuminated surface side. Therefore, it is understood that the telecentricity is maintained.

Figure 48C:
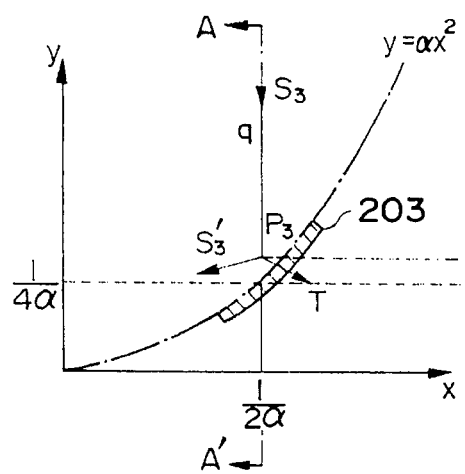
Figure 48D:
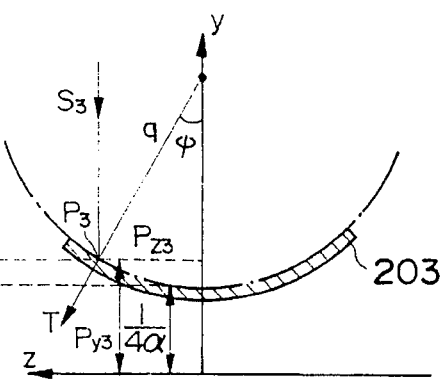

III) Beams parallel to the Y axis and passing $x=(2\alpha)^{-1}$ in the sagittal direction Rays in the sagittal direction are next studied referring to FIG. 48C and FIG. 48D.

FIG. 48C shows a state in the XY plane (meridional plane), and FIG. 48D is a drawing to show a section along AA' in FIG. 48C as seen in the direction of arrows A, A', which shows a state in a plane parallel to the YZ plane at a height of $x=(2\alpha)^{-1}$.

Consider a ray passing $x=(2\alpha)^{-1}$ in parallel with the Y axis, as shown in FIG. 48C and in FIG. 48D. Let $p_3=((2\alpha)^{-1}, P_{y3}, P_{z3})$ be a point $p_3$ where the ray is reflected at the reflective surface 203a on the optical reflector 203, q be a distance between the reference axis $Ax_1$ and the reflection point $p_3$, and $\psi$ be an angle expanded by a straight line connecting the reference axis $Ax_1$ with the reflection point $p_3$ with respect to the YZ plane including the origin O. Then $P_{y3}$ and $P_{z3}$ may be expressed by Equations (33) and (34), respectively.

$$P_{y3} = q + \frac{1}{4\alpha} - q\cos\psi \qquad (33)$$

$$P_{z3} = q\sin\psi \qquad (34)$$

A normal vector T at the reflection point $p_3$ may be expressed by following Equation (35).

$$T = \left(\frac{1}{2^{0.5}}, -\frac{1}{2^{0.5}} \cdot \cos\psi, \frac{1}{2^{0.5}} \cdot \sin\psi\right) \qquad (35)$$

Now let a unit vector $S_3$ of a ray parallel to the Y axis and passing $x=(2\alpha)^{-1}$ be $S_3=(0, -1, 0)$ and a unit vector $S_3'$ of a ray reflected at the point $p_3$ on the reflective surface 203a be $S_3'=(S_{X3}, S_{Y3}, S_{Z3})$. Then the following relation of Equation (36) holds.

$$S_3' = S_3 - 2T(T \cdot S_3) \qquad (36)$$

Thus, the unit vector $S_3'$ after reflection is given by Equation (37) from Equations (35) and (36).

$$\begin{aligned} S_3' &= (S_{X3}, S_{Y3}, S_{Z3}) \\ &= (-\cos\psi, -1 + \cos^2\psi, -\sin\psi\cos\psi) \end{aligned} \qquad (37)$$

Let us consider a straight line passing through the reflection point $p_3$ and being parallel to the unit vector $S_3'$ after reflection. The line may be expressed by Equations (38), (39) and (40).

$$x = S_{X3}t + \frac{1}{2\alpha} \qquad (38)$$

$$y = S_{Y3}t + q + \frac{1}{4\alpha} - q\cos\psi \qquad (39)$$

$$z = S_{Z3}t + q\sin\psi \qquad (40)$$

In the equations t is a variable.

Now let us calculate a position where the line parallel to the unit vector $S_3'$ after reflection and passing through the reflection point $p_3$ intersects with the YZ plane including the origin O, as shown in FIG. 48D. Since $x=0$ in this case, putting $x=0$ into Equation (38) yields $t=-1/(2\alpha S_{X3})$. Substituting this value of t into Equation (39) and using the relation of Equation (37), Equation (41) is obtained after arranged.

$$y = (\cos\psi - 1) \cdot \left[\frac{\cos\psi - 1}{2\alpha\cos\psi} - q\right] + \frac{1}{4\alpha} \qquad (41)$$

As seen from Equation (41), $\cos\psi \approx 1$. Namely, $y=(4\alpha)^{-1}$ in the paraxial region on the YZ plane at $P_{z3} \approx 0$ as shown in FIG. 48D.

Also, substituting $t=-1/(2\alpha S_{X3})$ into Equation (40), Equation (42) is obtained after arranged.

$$z = \left[q - \frac{1}{2\alpha}\right]\sin\psi \qquad (42)$$

From this Equation (42), $z=0$ irrespective of the value of $P_{z3}$, when the radius of the arcuate reflective surface 203a with the center at the reference axis $Ax_1$ is $q=(2\alpha)^{-1}$, that is, when a rotation radius of the reference axis $Ax_1$ with respect to the origin O is $3(4\alpha)^{-1}(=(2\alpha)^{-1}+(4\alpha)^{-1})$.

It is thus understood that if the rotation radius of the reference axis $Ax_1$ to the origin O is $3(4\alpha)^{-1}$ then the rays parallel to the Y axis in the sagittal direction in the plane parallel to the YZ plane at height of $x=(2\alpha)^{-1}$ as shown in FIG. 48D are converged at the position $(0, (4\alpha)^{-1}, 0)$ in the paraxial region where the rays in the meridional direction are converged as described above.

IV) Beams parallel to the X axis in the sagittal direction

Figure 48E:
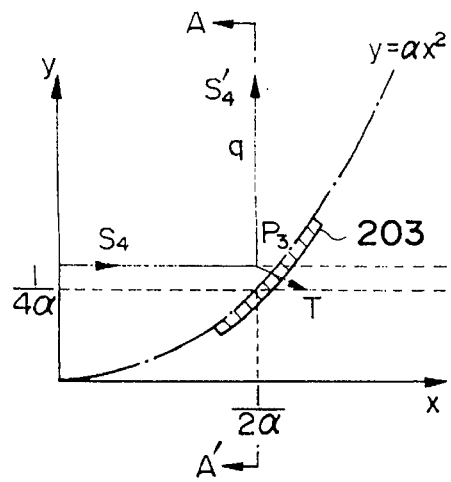
Figure 48F:
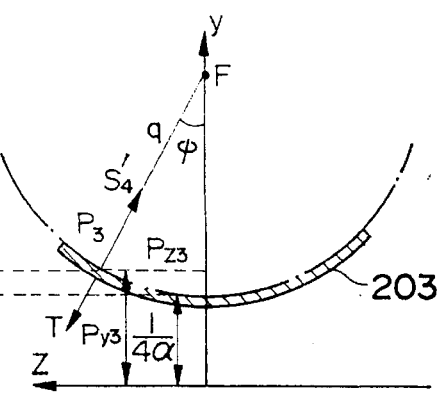

Finally studied referring to FIG. 48E and FIG. 48F are beams parallel to the X axis in the sagittal direction which are reflected at the reflection point $p_3$ shown in FIG. 48C and FIG. 48D.

FIG. 48E shows the state in the XY plane (meridional plane), and FIG. 48F is a cross section along AA' as seen in the direction of arrows A, A' in FIG. 48E, which shows the state in the plane parallel to the YZ plane at a height of $x=(2\alpha)^{-1}$.

Let $P_4=(1, 0, 0)$ be a unit vector $P_4$ of a beam going to the reflection point $p_3$ in parallel with the X axis, and $S_4'=(S_{X4}, S_{Y4}, S_{Z4})$ be a unit vector $S_4'$ of a beam reflected at the point $p_3$ on the reflective surface $203a$, as shown in FIGS. 48E and 48F. Then the following relation of Equation (43) holds.

$$S_4' = S_4 - 2T(T \cdot S_4) \tag{43}$$

Thus, the unit vector $S_4'$ after reflection is expressed by Equation (44), from Equations (35) and (43).

$$S_4' = (S_{X4}, S_{Y4}, S_{Z4}) = (0, \cos\psi, -\sin\psi) \tag{44}$$

Here, consider a straight line passing through the reflection point $p_3$ and being parallel to the unit vector $S_4'$ after reflection. Then the line is expressed by Equations (45), (46) and (47).

$$x = \frac{1}{2\alpha} \tag{45}$$

$$y = S_{Y4}t + q + \frac{1}{4\alpha} - q\cos\psi \tag{46}$$

$$z = S_{Z4}t + q\sin\psi \tag{47}$$

Now let us obtain a point where the beam reflected at the reflection point $p_3$ intersects with the XY plane (the plane of FIG. 48E) including the origin O, as shown in FIG. 48E and FIG. 48F.

Then, since $z=0$, $t=-q\sin\psi/S_{Z4}$ by putting $z=0$ into Equation (47). Substituting this value of t into above Equation (46) and using the relations of Equations (44) and (42), Equation (48) is obtained after arranged.

$$y = q + \frac{1}{4\alpha} = \frac{1}{2\alpha} + \frac{1}{4\alpha} = \frac{3}{4\alpha} \tag{48}$$

Accordingly, the beam passing through the reflection point $p_3$ in parallel with the X axis in the sagittal direction is converged at the point F $((2\alpha)^{-1}, 3(4\alpha)^{-1}, 0)$, which coincides with the converging point of the beams parallel to the X axis in the meridional direction as described in section II. It is thus understood that this relation holds outside the paraxial region without aberrations.

Thus, diverging beams from the point F $((2\alpha)^{-1}, 3(4\alpha)^{-1}, 0)$ at the center of light source image or light source are always parallel to the XZ plane so that the parallel beams illuminate the illuminated plane in the shape of arc. It is thus understood that the telecentricity is maintained over the illuminated surface of arc.

The result of the above analysis finds the fact that the optical reflector 203 is preferably formed by a part of a parabolic toric body of rotation satisfying following Equations (49) and (50) when the origin is at the vertex O of parabola ($y=\alpha x^2$), the Y axis is defined along the direction parallel to the symmetry axis of the parabola while passing through the origin O, the reference axis $Ax_0$ is normal to the symmetry axis Y at the position apart by a certain distance along the symmetry axis from the vertex O of the parabola, the X axis extends along the direction in parallel with the reference axis $Ax_0$ while passing through the vertex O, the Z axis is normal to the reference axis $Ax_0$ and to the symmetry axis Y while passing through the vertex O, and R is a distance from the vertex O to the intersection between the reference axis $Ax_0$ and the symmetry axis Y.

$$\left[y - \frac{3}{4\alpha}\right]^2 + z^2 = \left[\frac{3}{4\alpha} - \alpha x^2\right]^2, \tag{49}$$

$$0 \leq x \leq \frac{3^{0.5}}{2\alpha}$$

$$R = \frac{3}{4\alpha} \tag{50}$$

If the entrance to the optical reflector 203 is located at the position of the light source side focus $((2\alpha)^{-1})$ of the optical reflector 203 on the reference axis $Ax_1$, as shown in FIG. 46, while satisfying the relations of Equations (49) and (50) and if a generally circular light source image or light source is formed thereat, beams from the light source or light source image are converted by the optical reflector 203 into parallel beams having an arcuate cross section of beam to form an arc illumination area, in which the telecentricity and Köhler illumination state is maintained.

The center of light source image I (or light source) is at coordinates $((2\alpha)^{-1}, 3(4\alpha)^{-1}, 0)$ and the center $C_{BF}$ of the illuminated surface BF shown in FIG. 47 is a part of a circle in the YZ plane satisfying following Equation (51).

$$\left[y - \frac{3}{4\alpha}\right]^2 + z^2 = \left[\frac{1}{2\alpha}\right]^2 \tag{51}$$

As described above, the conditions for Köhler illumination are satisfied at each point in the arc illumination area.

Figure 49:
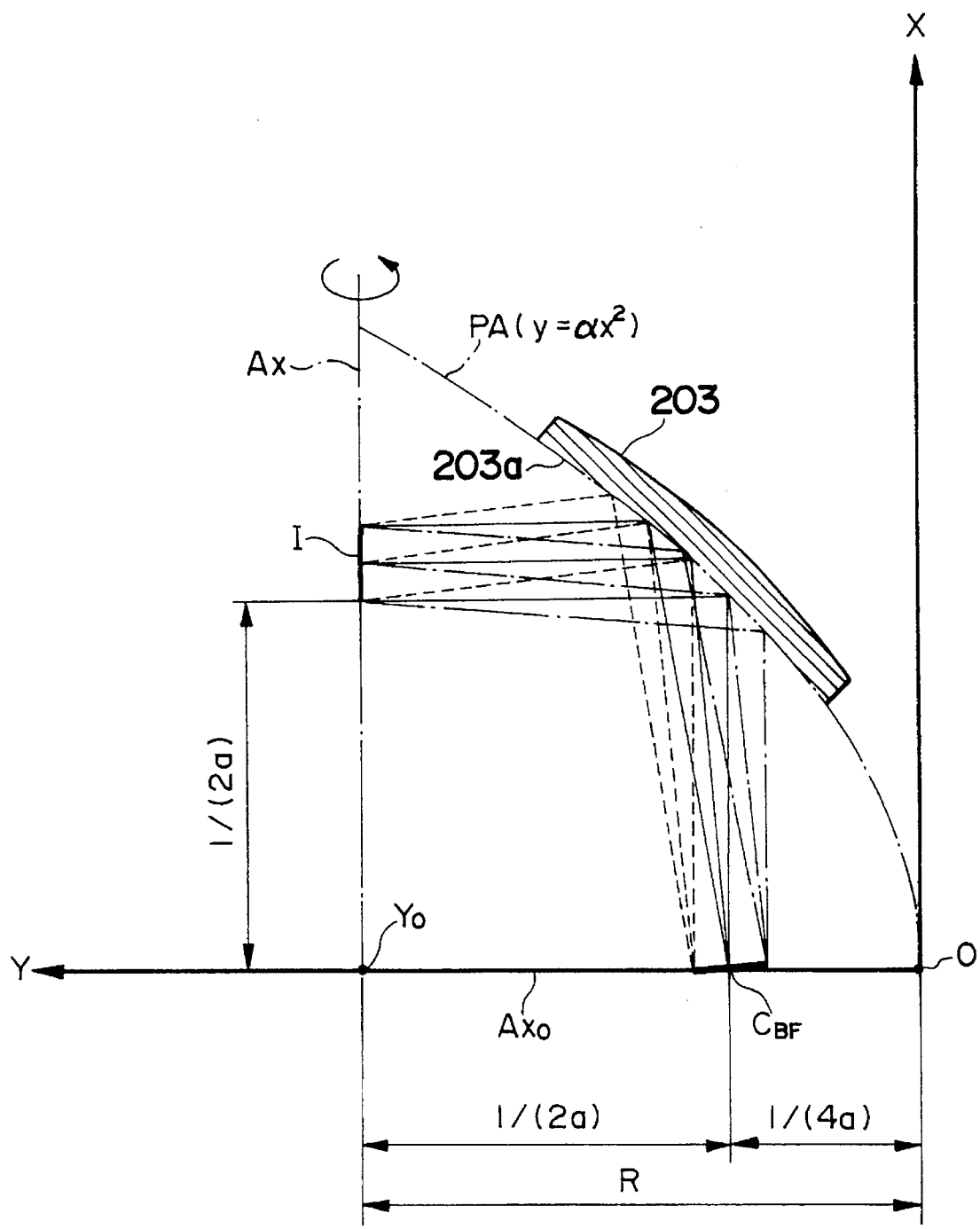
FIG. 49 is a drawing to show a state where a position of light source images is shifted along the reference axis.

Incidentally, the above description concerns an example in which the center of light source image I (or light source) is formed at the coordinates $((2\alpha)^{-1}, 3(4\alpha)^{-1}, 0)$ on the reference axis $Ax_1$ of the optical reflector 203. However, as far as a generally circle light source image (or light source) is formed on the reference axis $Ax_1$ of the optical reflector 203, as shown in FIG. 49 and FIG. 47, the beams therefrom are converted by the optical reflector 203 into parallel beams having an arcuate cross section of beam to form an arc illumination area under Köhler illumination. In this case, the center of illumination area is formed on the symmetry axis $Ax_0$ and the coordinates thereof is $((2\alpha)^{-1}, 3(4\alpha)^{-1}, 0)$. Accordingly, the center $C_{BF}$ of the illuminated surface in the YZ plane is a part of a circle satisfying above Equation (51).

Figure 50:
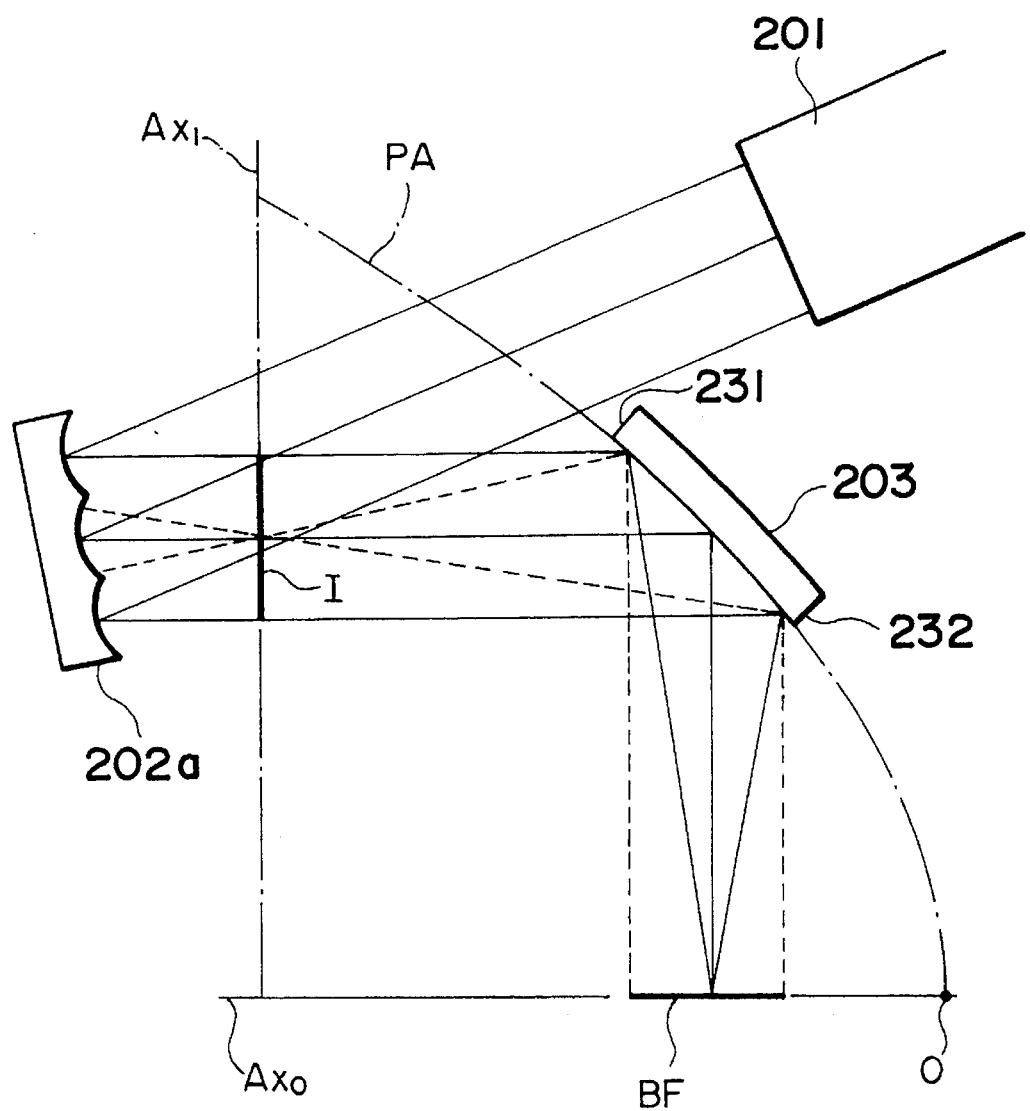
FIG. 50 is a drawing to show structure of an illumination optical apparatus.

Next described is an embodiment of the illumination optical apparatus using the optical reflector 203 as described above. As shown in FIG. 50, the illumination optical apparatus is constructed of an excimer laser 201 as a light source, a reflection-type concave fly's eye 202a as a reflective element, and the optical reflector 203 as described above.

First, the excimer laser 201 supplies collimated beams or nearly collimated beams. The beams are let to enter the reflection-type concave fly's eye 202a at a predetermined angle.

Figure 51A:
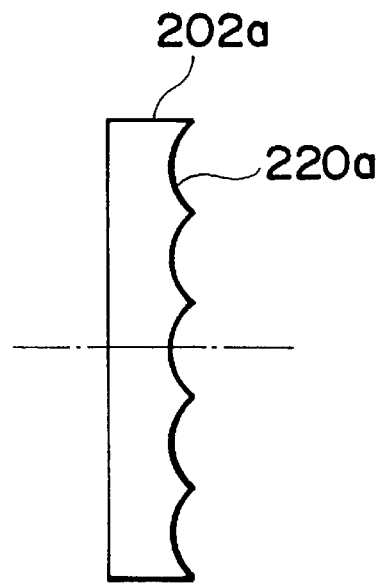
FIGS. 51A and 51B are cross sections of reflection-type fly's eyes in the meridional direction, and FIGS. 51C and 51D front views of the respective reflection-type fly's eyes shown in FIG. 51A and FIG. 51B, respectively.
Figure 51B:
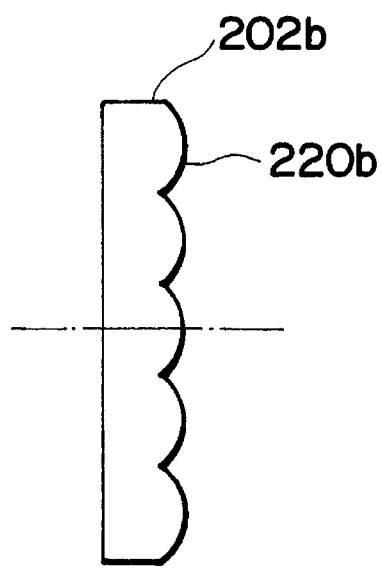
Figure 51C:
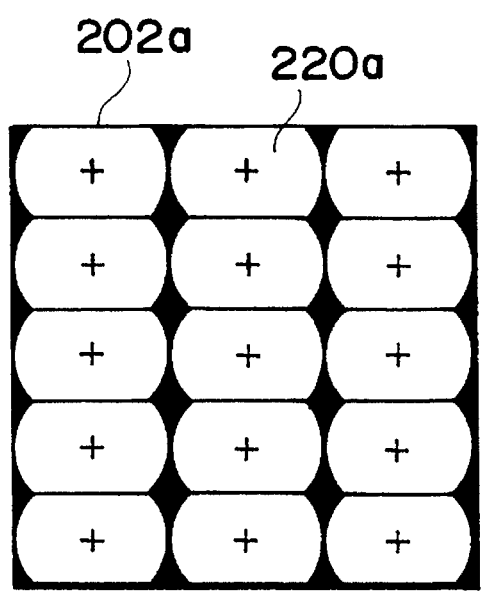

The reflection-type concave fly's eye 202a is composed of a plurality of mirror elements 220a each having a concave reflective surface, which are arranged in a matrix for example as shown in FIGS. 51A and 51C. The fly's eye 202a has a function to reflect the collimated beams entering the respective mirror elements 220a and to converge them. Here, FIG. 51A shows a cross section in the meridional direction, of the reflection-type concave fly's eye 202a in the present embodiment, and FIG. 51C a front view of the reflection-type concave fly's eye 202a in the present embodiment. In FIG. 51C, the vertical direction in the plane is the meridional direction and the horizontal direction in the plane is the sagittal direction.

The reflective surface of each mirror element 220a shown in FIG. 51A and FIG. 51C is so arranged that the focal length in the meridional direction is equal to that in the sagittal direction.

Further, as shown in FIG. 51C, each mirror element 220a is formed in a rectangular shape longer in the sagittal direction than in the meridional direction. The reason why each mirror element 220a is rectangular will be described hereinafter.

Returning to FIG. 50, real images I of the light source, which are an assembly of point light sources in a number corresponding to a number of mirror elements, are formed at the focus position where the beams are converged after reflected by the reflection-type concave fly's eye 202a. The real images I are substantially a surface illuminant (secondary light source). Beams from the secondary light source formed by the reflection-type concave fly's eye 202a are reflected and converged by the optical reflector 203.

FIG. 50 shows a state in the meridional direction, of the optical reflector 203, wherein with the origin at the vertex O of parabola PA, letting Y be the symmetry axis $Ax_0$ passing the origin O and X be a direction passing the origin O and being perpendicular to the symmetry axis $Ax_0$ (Y axis), the optical reflector 203 is constructed of a part of the parabola PA ($y=\alpha x^2$) in the meridional direction. Three-dimensionally, the optical reflector 203 is constructed, as shown in FIG. 47, of a part of a parabolic toric body of revolution obtained by rotating the parabola about the reference axis $Ax_1$ being perpendicular to the symmetry axis $Ax_0$ (Y axis) and passing the position $Y_0$ apart by a predetermined distance $(3(4\alpha)^{-1})$ from the vertex O on the symmetry axis $Ax_0$ (Y axis). More specifically, it has an arcuate belt shape of the parabolic toric body of revolution between two latitudes (231, 232). In this case, the reference axis (axis of revolution) $Ax_1$ is arranged to pass the position of the plurality of light source images I (secondary light source) formed by the reflection-type concave fly's eye 202a, and these light source images I are formed at the light-source-side focus position of the optical reflector 203 (where the light-source-side focal length f is given by $f=(2\alpha)^{-1}$).

Accordingly, the beams from the reflection-type concave fly's eye 202a are converted into parallel beams by the optical reflector 203 as shown by the dotted lines in the drawing, and an arcuate illumination area BF under the Köhler illumination is formed with telecentricity at the illuminated-surface-side focus position of the optical reflector 203 (where the illuminated-surface-side focal length f is given by $f=(2\alpha)^{-1}$).

Now, the reason why each mirror element 220a as a constituent in the reflection-type concave fly's eye 202a is rectangular as shown in FIG. 51C is described. As shown in FIG. 47, because an angle of divergence Φ in the sagittal direction, of the beams traveling from the light source images I to the optical reflector 203 becomes larger than that in the meridional direction, a problem that the light is not supplied to the edges of the optical reflector 203 in the sagittal direction will arise if the angle of divergence in the meridional direction, of the beams from the reflection-type concave fly's eye 202a is equal to that in the sagittal direction. Thus, each of the mirror elements 220a constituting the reflection-type concave fly's eye 202a is formed in a rectangular shape longer in the sagittal direction than in the meridional direction, whereby the angle of divergence in the sagittal direction, of the beams reflected from the each mirror element 220a becomes larger than that in the meridional direction.

If the angle of divergence Φ in the sagittal direction is nearly equal to that in the meridional direction, the length in the meridional direction, of each mirror element 220a may be set as equal to the length in the sagittal direction.

In the present embodiment, as shown in FIG. 51C, the number of mirror elements 220a arranged along the meridional direction is larger than the number of mirror elements 220a arranged along the sagittal direction in order to form the reflection-type concave fly's eye 202a in a square shape with the length in the meridional direction nearly equal to the length in the sagittal direction.

The light source unit for supplying the parallel beams or nearly parallel beams is not limited to the lasers, but may be one composed, for example, of an ellipsoidal mirror, a mercury arc lamp set at the first focus position of the ellipsoidal mirror, and an optical element for converting beams of light from the mercury arc lamp as collected by the ellipsoidal mirror into parallel beams. Further, the light source unit may be constructed, for example, of an X-ray source for supplying synchrotron radiation (SOR), an oblique incident mirror, and a slit or of a laser plasma X-ray source and a paraboloidal mirror for converting X-rays from the X-ray source into parallel beams. As described, the light source unit according to the present invention is by no means limited to those for supplying parallel beams in the ultraviolet wavelength region, but may be those for supplying light in the visible region or in the infrared region, or X-rays.

Also, in FIG. 50, a beam expander (for expanding the beam size or for changing a cross section of beam) for shaping the beams from the excimer laser 201 may be provided in the optical path between the excimer laser 201 as the light source unit and the reflection-type concave fly's eye 202a.

In the present embodiment, the images I of the light source are arranged to be formed on the reference axis $Ax_1$ of the optical reflector 203. However, as seen from the derivation of Equation (32), some errors are permissible without a need to locate the position of the images I of the light source precisely on the reference axis $Ax_1$ of the optical reflector 203 as long as the position of the images I of the light source and the reference axis $Ax_1$ of the optical reflector 203 approximately coincide with each other.

In order to form the real images I of the light source precisely on the reference axis $Ax_1$ of the optical reflector 203, a possible arrangement is such that a beam splitter is set on the exit side of the light source 201 and the reflection-type concave fly's eye 202a is set on the opposite side of the beam splitter so that the light from the light source 201 through the beam splitter is incident normally to the reflection-type concave fly's eye 202a. In this case, a half mirror may replace the beam splitter.

As shown in FIG. 50, where the rays from the light source 201 are incident at a predetermined angle to the reflection-type concave fly's eye 202a, curvatures of the reflective surfaces of the respective mirror elements 220a constituting the reflection-type concave fly's eye 202a should be determined as different from each other so that a focus of each mirror element 220a is located on the reference axis $Ax_1$ of the optical reflector 203.

Figure 52:
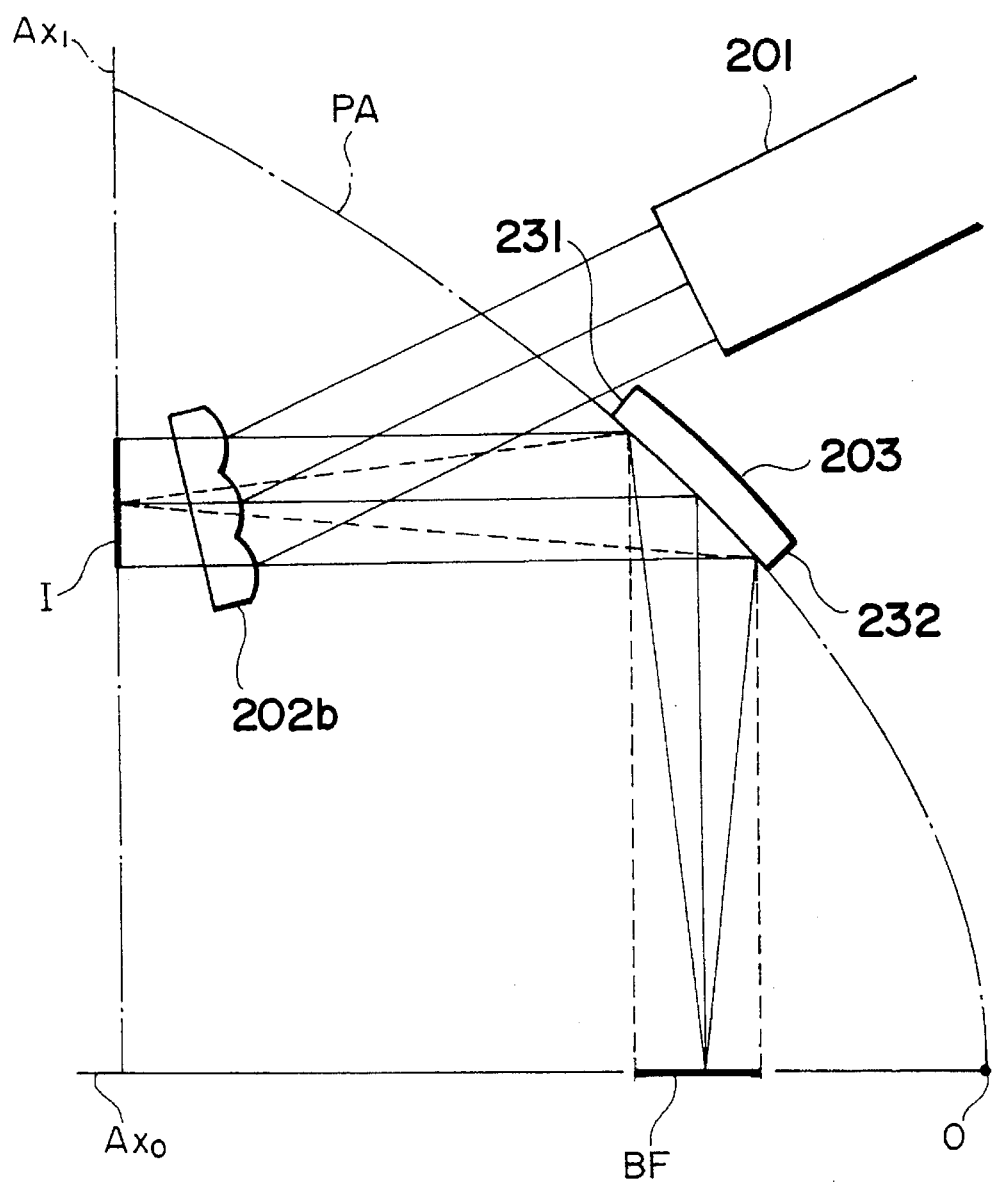
FIG. 52 is a drawing to show another embodiment of the illumination optical apparatus.

Next described referring to the drawings is another embodiment where a reflection-type convex fly's eye 202b composed of a plurality of convex mirrors is used as an optical integrator element. As shown in FIG. 52, the illumination optical apparatus is composed of the excimer laser 201 as a light source unit, a reflection-type convex fly's eye 202b, and the optical reflector 203.

First, the excimer laser 201 supplies collimated beams or nearly collimated beams. The beams are let to enter the reflection-type convex fly's eye 202b at a predetermined angle.

Figure 51D:
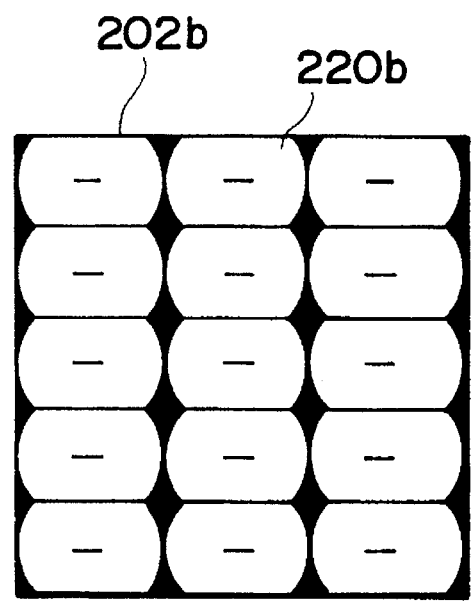

The reflection-type convex fly's eye 202b is composed of a plurality of mirror elements 220b each having a convex reflective surface, which are arranged in a matrix for example as shown in FIGS. 51B and 51D. The fly's eye 202b has a function to reflect the collimated beams entering the respective mirror elements 220b and to diverge them. Here, FIG. 51B shows a cross section in the meridional direction, of the reflection-type convex fly's eye 202b, and FIG. 51D a front view of the reflection-type convex fly's eye 202b. In FIG. 51D, the vertical direction in the plane is the meridional direction and the horizontal direction in the plane is the sagittal direction.

The reflective surface of each mirror element 220b shown in FIG. 51B and FIG. 51D is so arranged that the focal length in the meridional direction is equal to that in the sagittal direction.

Further, as shown in FIG. 51D, each mirror element 220b is formed in a rectangular shape longer in the sagittal direction than in the meridional direction. The reason why each mirror element 220b is rectangular is the same as that why each mirror element 220a is rectangular as shown in FIG. 51C in the previous embodiment, and thus is omitted to explain herein.

Returning to FIG. 52, virtual images I of the light source, which are an assembly of point light sources in a number corresponding to a number of mirror elements, are formed at the focus position where the beams are diverged after reflected by the reflection-type convex fly's eye 202b. The virtual images I are substantially a surface illuminant (secondary light source). Beams from the secondary light source formed by the reflection-type convex fly's eye 202b are reflected and converged by the optical reflector 203.

FIG. 52 shows a state in the meridional direction, of the optical reflector 203, wherein with the origin at the vertex O of parabola PA, letting Y be the symmetry axis $Ax_0$ passing the origin O and X be a direction passing the origin O and being perpendicular to the symmetry axis $Ax_0$ (Y axis), the optical reflector 203 is constructed of a part of the parabola PA ($y=\alpha x^2$) in the meridional direction. Three-dimensionally, the optical reflector 203 is constructed, as shown in FIG. 47, of a part of a parabolic toric body of revolution obtained by rotating the parabola about the reference axis $Ax_1$ being perpendicular to the symmetry axis $Ax_0$ (Y axis) and passing the position $Y_0$ apart by a predetermined distance $(3(4\alpha)^{-1})$ from the vertex O on the symmetry axis $Ax_0$ (Y axis). More specifically, it has an arcuate belt shape of the parabolic toric body of revolution between two latitudes (231, 232). In this case, the reference axis (axis of revolution) $Ax_1$ is arranged to pass the position of the plurality of light source images I (secondary light source) formed by the reflection-type convex fly's eye 202b, and these light source images I are formed at the light-source-side focus position of the optical reflector 203 (where the light-source-side focal length f is given by $f=(2\alpha)^{-1}$).

Accordingly, the beams from the reflection-type convex fly's eye 202b are converted into parallel beams by the optical reflector 203 as shown by the dotted lines in the drawing, and an arcuate illumination area BF under the Köhler illumination is formed with telecentricity at the illuminated-surface-side focus position of the optical reflector 203 (where the illuminated-surface-side focal length f is given by $f=(2\alpha)^{-1}$).

If the angle of divergence Φ in the sagittal direction is nearly equal to that in the meridional direction, the length in the meridional direction, of each mirror element 220b may be set as equal to the length in the sagittal direction.

In the present embodiment, as shown in FIG. 51D, the number of mirror elements 220b arranged along the meridional direction is larger than the number of mirror elements 220b arranged along the sagittal direction in order to form the reflection-type convex fly's eye 202b in a square shape with the length in the meridional direction nearly equal to the length in the sagittal direction.

The light source unit for supplying the parallel beams or nearly parallel beams is not limited to the lasers, but may be one composed, for example, of an ellipsoidal mirror, a mercury arc lamp set at the first focus position of the ellipsoidal mirror, and an optical element for converting beams of light from the mercury arc lamp as collected by the ellipsoidal mirror into parallel beams. Further, the light source unit may be constructed, for example, of an X-ray source for supplying synchrotron radiation (SOR), an oblique incident mirror, and a slit or of a laser plasma X-ray source and a paraboloidal mirror for converting X-rays from the X-ray source into parallel beams. As described, the light source unit according to the present invention is by no means limited to those for supplying parallel beams in the ultraviolet wavelength region, but may be those for supplying light in the visible region or in the infrared region, or X-rays.

Also, in FIG. 52, a beam expander (for expanding the beam size or for changing a cross section of beam) for shaping the beams from the excimer laser 201 may be provided in the optical path between the excimer laser 201 as the light source unit and the reflection-type convex fly's eye 202b.

In the present embodiment, the images I of the light source are arranged to be formed on the reference axis $Ax_1$ of the optical reflector 203. However, as seen from the derivation of Equation (32), some errors are permissible without a need to locate the position of the images I of the light source precisely on the reference axis $Ax_1$ of the optical reflector 203 as long as the position of the images I of the light source and the reference axis $Ax_1$ of the optical reflector 203 approximately coincide with each other.

In order to form the virtual images I of the light source precisely on the reference axis $Ax_1$ of the optical reflector 203, a possible arrangement is such that a beam splitter is set on the exit side of the light source 201 and the reflection-type convex fly's eye 202b is set on the opposite side of the beam splitter so that the light from the light source 201 through the beam splitter is incident normally to the reflection-type convex fly's eye 202b. In this case, a half mirror may replace the beam splitter.

As shown in FIG. 52, where the rays from the light source 201 are incident at a predetermined angle to the reflection-type convex fly's eye 202b, curvatures of the reflective surfaces of the respective mirror elements 220b constituting the reflection-type convex fly's eye 202b should be determined as different from each other so that a focus of each mirror element 220b is located on the reference axis $Ax_1$ of the optical reflector 203.

Figure 53A:
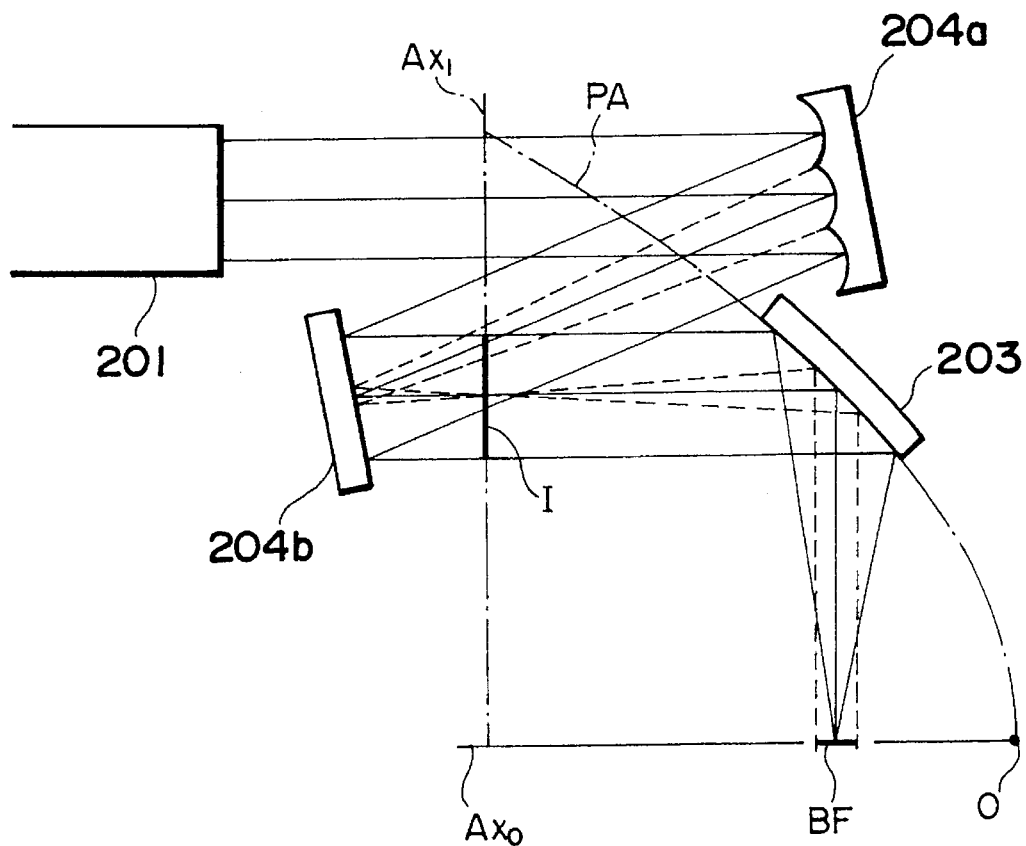
FIGS. 53A and 53B are drawings to show other structural examples of the illumination optical apparatus.

FIG. 53A shows another embodiment using two reflection-type optical integrators 204a and 204b. As shown in the drawing, the illumination optical apparatus is composed of the laser light source 201, first and second reflection-type optical integrators 204a, 204b, and the optical reflector 203.

Figure 54A:
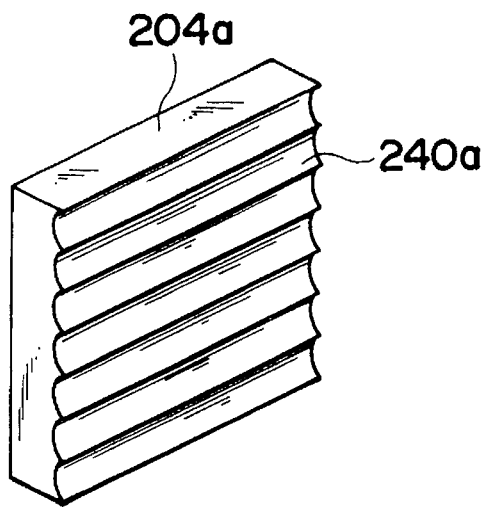
FIGS. 54A and 54B are perspective views of the reflection-type integrators used in the illumination optical apparatus in FIG. 53A and FIG. 53B.

The first reflection-type optical integrator 204a is composed of a plurality of concave cylindrical mirrors 240a having a same curvature, as shown in FIG. 54A. The second reflection-type optical integrator 204b is composed of concave cylindrical mirrors 240b having a different curvature from that of the first reflection-type optical integrator 204a. These cylindrical mirrors 240a and 240b are provided in a same number and generators of the respective mirrors are arranged in parallel with each other.

Returning to FIG. 53A, the first and second reflection-type optical integrators 204a, 204b are arranged so that the generators thereof are perpendicular to each other. Here, "the generators are perpendicular to each other" stated herein means that the generators of the concave cylindrical mirrors 240a in the first reflection-type optical integrator 204a are substantially perpendicular to the generators of the concave cylindrical mirrors 240b in the second reflection-type optical integrators 204b even via an optical element such as a reflective member in an optical path between the first and second reflection-type optical integrators 204a, 204b.

In the present embodiment, a direction of the generators of the plurality of concave cylindrical mirrors 240a constituting the first reflection-type optical integrator 204a (hereinafter referred to as an axis of the first reflection-type optical integrator 204a) is set normal to the plane of the drawing, while a direction of the generators of the plurality of concave cylindrical mirrors 240b constituting the second reflection-type optical integrator 204b (hereinafter referred to as an axis of the second reflection-type optical integrator 204b) within the plane of the drawing.

Rays emitted from the laser light source I travel in respective optical paths bent by the first reflection-type optical integrator 204a to be focused at the focus position (the position of light source images) I in the in-plane direction by the respective concave cylindrical mirrors 240a. The rays in the in-plane direction are the rays in the meridional plane in the optical reflector 203.

The second reflection-type optical integrator 204b is placed between the first reflection-type optical integrator 204a and the focus position I, so that the rays from the first reflection-type optical integrator 204a take respective optical paths bent by the second reflection-type optical integrator 204b. Beams from the respective cylindrical mirrors 240b in the second reflection-type optical integrator 204b are focused only in the direction perpendicular to the plane of the drawing. The focus position of the second reflection-type optical integrator 204b coincides with the focus position of the first reflection-type optical integrator 204a. Here, the rays in the direction perpendicular to the plane of the drawing are the rays on the sagittal plane in the optical reflector 203.

Thus, the first reflection-type optical integrator 204a becomes a secondary light source in the meridional plane of the optical reflector 203, while the second reflection-type optical integrator 204b a secondary light source in the sagittal plane of the optical reflector 203. The rays having passed via the first and second reflection-type optical integrators 204a, 204b then pass the focus position I to be incident to the optical reflector 203.

In this arrangement, the angles of divergence in the meridional direction and in the sagittal direction can be changed by changing the curvatures of the cylindrical mirrors in the respective reflection-type optical integrators. As a result, illumination areas can be changed independently of each other. The plane of the secondary light sources as represented by I is formed by selecting a distance between the first and second reflection-type optical integrators 204a, 204b so that image points thereof coincide with each other.

Providing the integrators with a same number of cylindrical mirrors, the number of images in the secondary light source in the meridional direction can be the same as that in the sagittal direction.

The present embodiment is so arranged that the images I of the light source are formed on the reference axis $Ax_1$ of the optical reflector 203. However, as seen from the derivation of Equation (32), some errors are permissible without a need to locate the position of the images I of the light source precisely on the reference axis $Ax_1$ of the optical reflector 203 as long as the position of the images I of the light source and the reference axis $Ax_1$ of the optical reflector 203 approximately coincide with each other.

FIG. 53A shows a state in the meridional direction, of the optical reflector 203, wherein with the origin at the vertex O of parabola PA, letting Y be the symmetry axis $Ax_0$ passing the origin O and X be a direction passing the origin O and being perpendicular to the symmetry axis $Ax_0$ (Y axis), the optical reflector 203 is constructed of a part of the parabola PA ($y=\alpha x^2$) in the meridional direction. Three-dimensionally, the optical reflector 203 is constructed, as shown in FIG. 47, of a part of a parabolic toric body of revolution obtained by rotating the parabola about the reference axis $Ax_1$ perpendicular to the symmetry axis $Ax_0$ (Y axis) passing the position $Y_0$ apart by a predetermined distance $(3(4\alpha)^{-1})$ from the vertex O on the symmetry axis $Ax_0$ (Y axis). More specifically, it has an arcuate belt shape of the parabolic toric body of revolution between two latitudes (231, 232). In this case, the reference axis $Ax_1$ is arranged to pass the position of the plurality of light source images I (secondary light source) formed by the reflection-type optical integrators 204a and 204b, and these light source images I are formed at the light-source side focus position of the optical reflector 203.

Accordingly, the beams from the reflection-type optical integrators 204a and 204b are converted into parallel beams by the optical reflector 203 as shown by the dotted lines in the drawing, and an arcuate illumination area BF under the Köhler illumination is formed with telecentricity at the illuminated-surface-side focus position of the optical reflector 203 (where the illuminated-surface-side focal length f is given by $f=(2\alpha)^{-1}$).

Figure 53B:
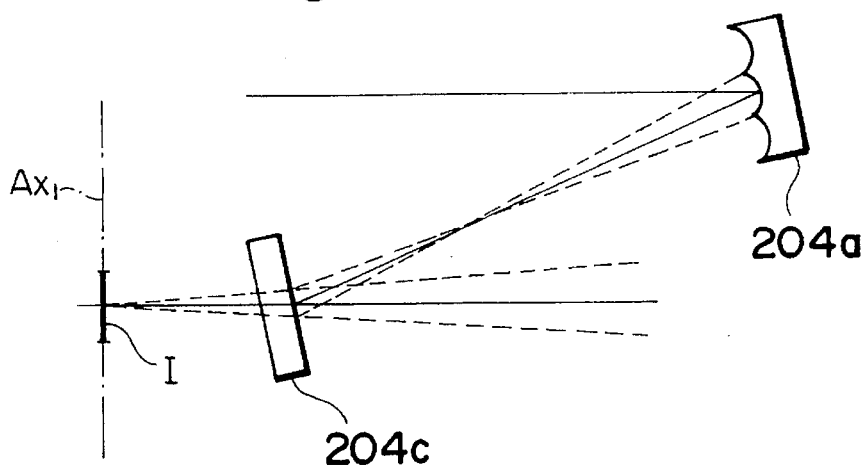
Figure 54B:
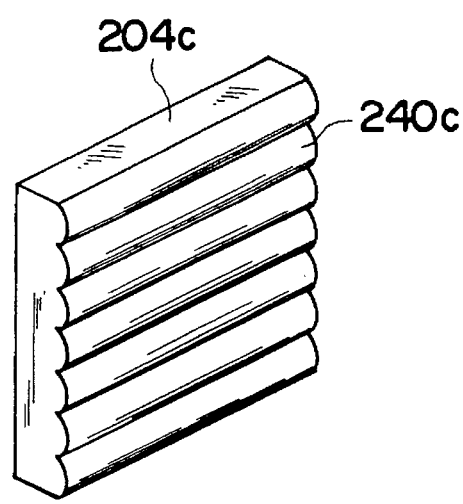

FIG. 53B shows an optical system where each cylindrical mirror in the second reflection-type optical integrator is convex as shown in FIG. 54B. The optical system shown in FIG. 53A presents the real images as a secondary light source, whereas the optical system shown in FIG. 53B virtual images as a secondary light source from rays in the direction perpendicular to the plane of the drawing. Where the second reflection-type optical integrator is composed of convex cylindrical mirrors 240c, the second reflection-type optical integrator 204c is located at a position after the rays in the in-plane direction are once focused. As described, the number of images in the secondary light source in the meridional direction can also be made the same as that in the sagittal direction where each cylindrical mirror in the second reflection-type optical integrator is convex.

Figure 55:
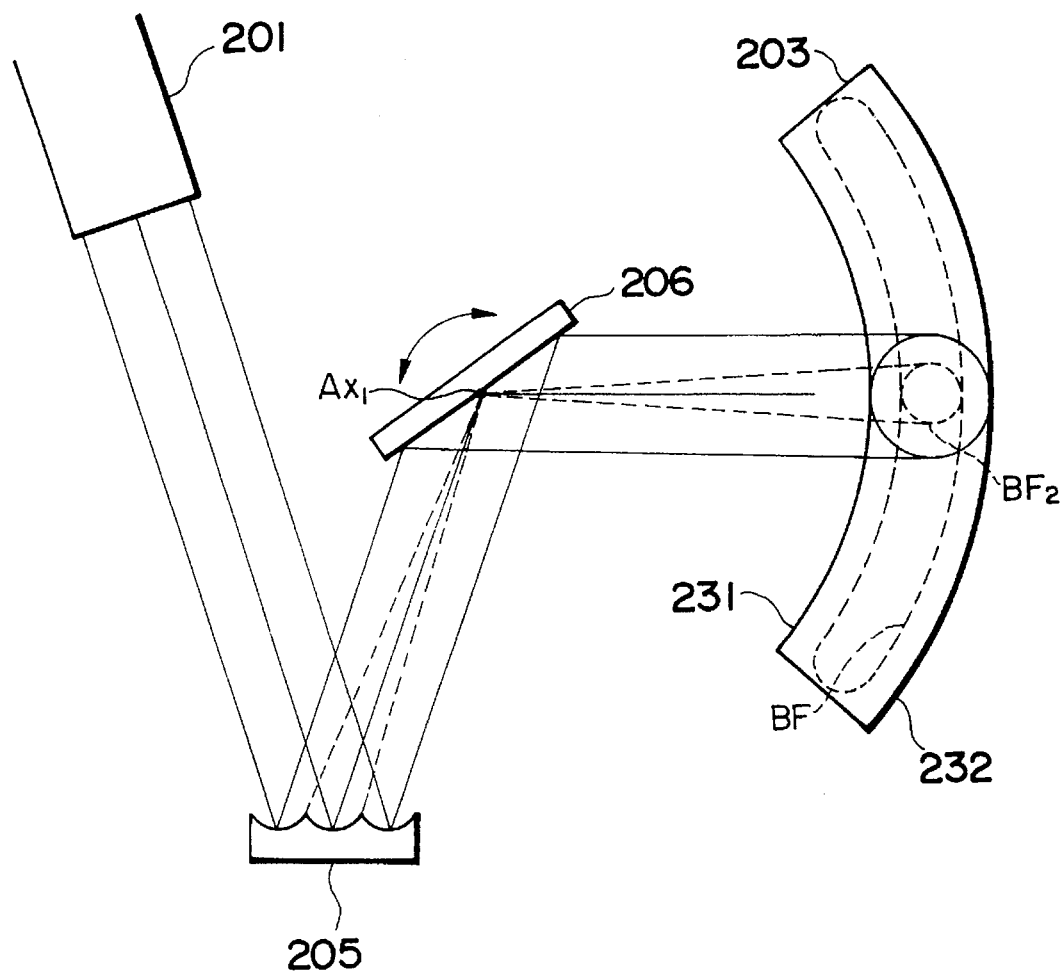
FIG. 55 is a drawing to show another embodiment of the illumination optical apparatus.

FIG. 55 shows an embodiment where the illumination optical apparatus is constructed using a reflection-type concave fly's eye 205 and a plane rotating mirror 206. FIG. 55 shows a state in the sagittal plane. The illumination optical apparatus is composed of the laser light source 201, the reflection-type concave fly's eye 205 as a reflection-type optical integrator, the plane rotating mirror 206 arranged as rotatable about the reference axis $Ax_1$, and the optical reflector 203.

Figure 56:
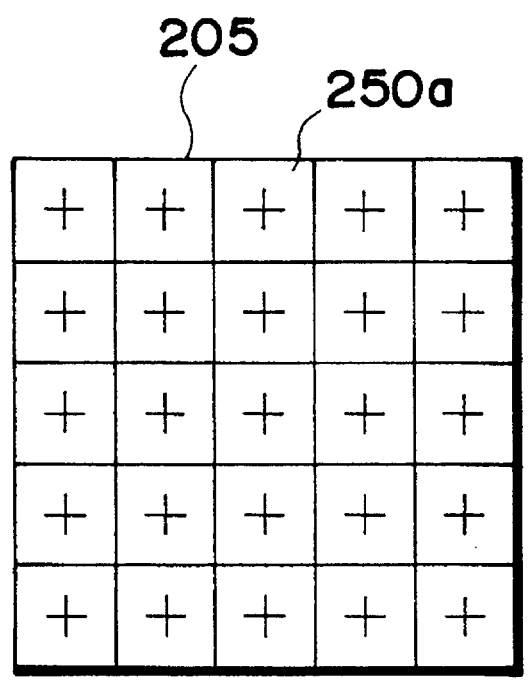
FIG. 56 is a drawing of a reflection-type integrator used in the illumination optical apparatus of FIG. 55.

The light emitted from the light source is incident at a predetermined angle into the reflection-type concave fly's eye 205. As shown in FIG. 56, the reflection-type concave fly's eye 205 is an assembly of a plurality of concave mirror elements 250a, wherein a number of mirror elements 250a in the meridional direction is equal to that in the sagittal direction. Each mirror element 250a has same lengths and same focal lengths in the meridional direction and in the sagittal direction. The plane rotating mirror 206 is set at a rear focus position of each mirror element 250a, so that beams from the reflection-type concave fly's eye 205 form images as a secondary light source in a same number in the meridional direction and in the sagittal direction on the plane rotating mirror 206, as shown by the dotted lines in the drawing.

The light from the secondary light source is reflected and converged by the optical reflector 203 to form a nearly circular illumination area $BF_2$ under Köhler illumination with the telecentricity maintained, at the illuminated-surface-side focus position of the optical reflector 203 (where the illuminated-surface-side focal length f is given by $f=(2\alpha)^{-1}$). Rotating the plane rotating mirror 206 about the rotation axis $Ax_1$ of plane rotating mirror, the illumination area $BF_2$ scan along the rotational direction about the reference axis $Ax_1$, thereby forming an annular illumination area BF on the optical reflector 203.

In this case, because a sufficient numerical aperture of each mirror element 250a in the reflection-type concave fly's eye 205 is one to fill the meridional width of the optical reflector 203, the number of images in the secondary light source in the meridional direction can be set as same as that in the sagittal direction without a need to make the shape of aperture elongated as in the previous embodiment.

The present embodiment is so arranged that the images I of the light source are formed on the reference axis $Ax_1$ of the optical reflector 203. However, as seen from the derivation of Equation (32), some errors are permissible without a need to locate the position of the images I of the light source precisely on the reference axis $Ax_1$ of the optical reflector 203 as long as the position of the images I of the light source and the reference axis $Ax_1$ of the optical reflector 203 approximately coincide with each other.

Using the optical apparatus as described above, the illuminated surface can be uniformly illuminated in an arcuate shape with a much higher illumination efficiency than with the conventional apparatus, while maintaining the telecentricity and Köhler illumination state.

Further, because the members in the optical system except for the light-emitting unit are the reflective members, absorption of the light passing the optical system can be considerably low.

The optical apparatus as illustrated in EMBODIMENT IV can also be applied to exposure apparatus in combination with the stepper as illustrated in FIG. 41 in EMBODIMENT III. In this case, the optical system illuminates an arcuate area in the mask M on the mask stage MS and the stepper successively moves the mask stage MS and the wafer stage WS on which the wafer W is mounted. By this, the pattern on the reticle can be faithfully transferred onto the wafer with a high throughput. Reference should be made to EMBODIMENT III as to the details of the stepper.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application Nos. 5-21577 (21577/1993) filed on Feb. 10, 1993; 5-229173 (229173/1993) filed on Sep. 14, 1993; 5-237654 (237654/1993) filed on Sep. 24, 1993; and 6-38799 (38799/1994) filed on Mar. 9, 1994 are hereby incorporated by reference.

What is claimed is:

1. An optical element comprising:

a substrate having a plurality of concave surfaces or convex surfaces with a substantially same curvature; and multilayer films for reflecting X-rays, formed on the concave surfaces or convex surfaces of said substrate and composed of thin films;

wherein when X-rays are incident into the multilayer films on said concave surfaces or convex surfaces, the X-rays are reflected with a predetermined diverging angle on the multilayer films and as a result a plurality of secondary X-ray sources having the diverging angle are formed on a same plane located a predetermined distance apart from said concave surfaces or convex surfaces.

2. An optical element according to claim 1, wherein said concave surfaces or convex surfaces are two-dimensionally arranged on said substrate.

3. An optical element according to claim 2, wherein said concave surfaces or convex surfaces each have a shape forming a part of spherical surface.

4. An optical element according to claim 2, wherein said concave surfaces or convex surfaces each have such a shape that a radius of curvature in a curve defined by crossing a first plane and said concave surfaces or convex surfaces is different from a radius of curvature in a curve defined by crossing a second plane and said concave surfaces or convex surfaces, said first plane being a plane of incidence with respect to X-rays and passing through a vertex of said concave surfaces or convex surfaces, and said second plane being a plane passing through said vertex and being perpendicular to said first plane.

5. An optical element according to claim 4, wherein said concave surfaces or convex surfaces each have a shape of toroidal surface.

6. An optical element according to claim 5, wherein said multilayer films reflect X-rays of wavelength in the range of 5 nm to 20 nm.

7. An optical element according to claim 1, wherein said concave surfaces or convex surfaces each have a shape forming a part of a side surface of cylinder and one-dimensionally arranged on said substrate.

8. An optical system for illuminating an illuminated surface in an arc shape, comprising:

an optical reflector having an X-ray reflecting surface forming a part of a parabola of revolution obtained by revolving an arbitrary parabola about a base axis passing through a vertex and a focus of the parabola and inclined at a predetermined angle relative to a normal line to said illuminated surface, said optical reflector reflecting X-rays by said X-ray reflecting surface to irradiate said illuminated surface; and an optical element for reflecting X-rays incident thereinto substantially in parallel with said base axis to irradiate said X-rays onto the X-ray reflecting surface of said optical reflector;

wherein said optical reflector and said optical element are rotated in a united manner about a rotation axis passing through said optical element and being parallel to the normal line to said illuminated surface;

wherein said optical element comprises:

a substrate having a plurality of concave surfaces or convex surfaces with a substantially same curvature; and multilayer films for reflecting X-rays, formed on the concave surfaces or convex surfaces of said substrate and composed of thin films;

wherein when X-rays are incident into the multilayer films on said concave surfaces or convex surfaces, the X-rays are reflected with a predetermined diverging angle on the multilayer films and as a result a plurality of secondary X-ray sources having the diverging angle are formed on a same plane located a predetermined distance apart from said concave surfaces or convex surfaces.

9. An optical system accoding to claim 8, wherein said concave surfaces or convex surfaces each have such a shape that a radius of curvature in a curve defined by crossing a first plane and said concave surfaces or convex surfaces is different from a radius of curvature in a curve defined by crossing a second plane and said concave surfaces or convex surfaces, said first plane being a plane of incidence with respect to X-rays and passing through a vertex of said concave surfaces or convex surfaces, and said second plane being a plane passing through said vertex and being perpendicular to said first plane.

10. An optical system according to claim 9, wherein said concave surfaces or convex surfaces in said optical element each have a shape of toroidal surface.

11. An optical system according to claim 8, wherein said multilayer films in said optical system reflect X-rays of wavelength in the range of 5 nm to 20 nm.

12. An optical system according to claim 8, wherein the focus of said parabola is located on said illuminated surface.

13. An optical system according to claim 12, wherein a distance between the secondary X-ray sources formed by said optical element and the X-ray reflecting surface of said optical reflector is substantially equal to a distance between the X-ray reflecting surface of said optical reflector and said illuminated surface.

14. An optical apparatus for illuminating a predetermined area, comprising:

an optical reflector having an X-ray reflecting surface forming a part of a parabola of revolution obtained by revolving an arbitrary parabola about a base axis passing through a vertex and a focus of the parabola and inclined at a predetermined angle relative to a normal line to said illuminated surface, said optical reflector reflecting X-rays by said X-ray reflecting surface to irradiate said illuminated surface;

an optical element for reflecting X-rays incident thereinto substantially in parallel with said base axis to irradiate said X-rays onto the X-ray reflecting surface of said optical reflector;

an X-ray source for emitting X-rays toward said optical element; and rotation driving means for rotating said optical reflector and said optical element in a united manner about a rotation axis passing through said optical element and being parallel to the normal line to said illuminated surface;

wherein said optical reflector and said optical element are rotated in a united manner by said rotation driving means to irradiate the X-rays emitted from said X-ray source onto said illuminated surface in an arc shape;

wherein said optical element comprises:

a substrate having a plurality of concave surfaces or convex surfaces with a substantially same curvature; and multilayer films for reflecting X-rays, formed on the concave surfaces or convex surfaces of said substrate and composed of thin films;

wherein when X-rays are incident into the multilayer films on said concave surfaces or convex surfaces, the X-rays are reflected with a predetermined diverging angle on the multilayer films and as a result a plurality of secondary X-ray sources having the diverging angle are formed on a same plane located a predetermined distance apart from said concave surfaces or convex surfaces.

15. An optical apparatus accoding to claim 14, wherein said concave surfaces or convex surfaces in said optical element each have such a shape that a radius of curvature in a curve defined by crossing a first plane and said concave surfaces or convex surfaces is different from a radius of curvature in a curve defined by crossing a second plane and said concave surfaces or convex surfaces, said first plane being a plane of incidence with respect to X-rays and passing through a vertex of said concave surfaces or convex surfaces, and said second plane being a plane passing through said vertex and being perpendicular to said first plane.

16. An optical apparatus according to claim 15, wherein said concave surfaces or convex surfaces in said optical element each have a shape of toroidal surface.

17. An optical apparatus according to claim 14, wherein said multilayer films in said optical system reflect X-rays of wavelength in the range of 5 nm to 20 nm.

18. An optical apparatus according to claim 14, wherein said illumination optical apparatus further comprises light deflecting means for deflecting the X-rays emitted from said X-ray source so as to make said X-rays incident into said optical element in a direction along said rotation axis.

19. An optical apparatus according to claim 18, wherein said light deflecting means is set on said rotation axis and wherein said X-ray source and said light deflecting means are stationary when said rotation axis is rotated by said rotation driving means.

20. An optical apparatus according to claim 14, wherein said focus of the parabola is located on said illuminated surface.

21. An optical apparatus according to claim 20, wherein a distance between the secondary X-ray sources formed by said optical element and the X-ray reflecting surface of said optical reflector is substantially equal to a distance between the X-ray reflecting surface of said optical reflector and said illuminated surface.

22. An optical apparatus according to claim 14, wherein said optical reflector and said optical element are pivoted in a predetermined range by said rotation driving means.

23. An optical apparatus according to claim 14, further comprising:

mask holding means for holding a photomask set on said illuminated surface;

wafer holding means for holding a wafer onto which an image of pattern on said photomask is to be transferred;

a projection optical system for receiving said image of pattern on said photomask and projecting the image of pattern onto said wafer;

conveying means for successively conveying said mask holding means and wafer holding means; and controlling means for performing a control of conveyance of said conveying means and a control of rotation of said rotation driving means;

wherein under control of said controlling means, while said optical reflector and said optical element are rotated in a united manner by said rotation driving means, said mask holding means and wafer holding means are successively conveyed by said conveying means to consecutively transfer the image of pattern on said photomask onto said wafer.

24. An optical apparatus accoding to claim 23, wherein said concave surfaces or convex surfaces in said optical element each have such a shape that a radius of curvature in a curve defined by crossing a first plane and said concave surfaces or convex surfaces is different from a radius of curvature in a curve defined by crossing a second plane and said concave surfaces or convex surfaces, said first plane being a plane of incidence with respect to X-rays and passing through a vertex of said concave surfaces or convex surfaces, and said second plane being a plane passing through said vertex and being perpendicular to said first plane.

25. An optical apparatus according to claim 24, wherein said concave surfaces or convex surfaces in said optical element each have a shape of toroidal surface.

26. An optical apparatus according to claim 23, wherein said multilayer films in said optical system reflect X-rays of wavelength in the range of 5 nm to 20 nm.

27. An optical apparatus according to claim 23, wherein said illumination optical apparatus further comprises light deflecting means for deflecting the X-rays emitted from said X-ray source so as to make said X-rays incident into said optical element in a direction along said rotation axis.

28. An optical apparatus according to claim 27, wherein said light deflecting means is set on said rotation axis and wherein said X-ray source and said light deflecting means are stationary when said rotation axis is rotated by said rotation driving means.

29. An optical apparatus according to claim 23, wherein said focus of the parabola is located on said illuminated surface.

30. An optical apparatus according to claim 29, wherein a distance between the secondary X-ray sources formed by said optical element and the X-ray reflecting surface of said optical reflector is substantially equal to a distance between the X-ray reflecting surface of said optical reflector and said illuminated surface.

31. An optical apparatus according to claim 23, wherein said optical reflector and said optical element are pivoted in a predetermined range by said rotation driving means.

* * * * *